(12) United States Patent
Taka et al.

(10) Patent No.: US 8,053,024 B2
(45) Date of Patent: Nov. 8, 2011

(54) METHOD FOR MANUFACTURING ORGANIC ELECTROLUMINESCENT DEVICE

(75) Inventors: Hideo Taka, Tokyo (JP); Hiroshi Kita, Tokyo (JP); Hiroaki Ando, Tokyo (JP)

(73) Assignee: Konica Minolta Holdings, Inc. (JP)

( * ) Notice: Subject to any disclaimer, the term of this patent is extended or adjusted under 35 U.S.C. 154(b) by 1040 days.

(21) Appl. No.: 11/912,352

(22) PCT Filed: Feb. 15, 2006

(86) PCT No.: PCT/JP2006/302636
§ 371 (c)(1),
(2), (4) Date: Oct. 23, 2007

(87) PCT Pub. No.: WO2006/117914
PCT Pub. Date: Nov. 9, 2006

(65) Prior Publication Data
US 2009/0081357 A1 Mar. 26, 2009

(30) Foreign Application Priority Data

Apr. 27, 2005 (JP) .................................. 2005-129542

(51) Int. Cl.
*B05D 5/06* (2006.01)
*B05D 3/02* (2006.01)

(52) U.S. Cl. .......................................... 427/66; 427/384
(58) Field of Classification Search .................... 427/66, 427/384
See application file for complete search history.

(56) References Cited

U.S. PATENT DOCUMENTS

| | | | | |
|---|---|---|---|---|
| 2002/0197393 | A1* | 12/2002 | Kuwabara | 427/66 |
| 2003/0044645 | A1* | 3/2003 | Kambe et al. | 428/690 |
| 2003/0054197 | A1* | 3/2003 | Kwong | 428/690 |
| 2004/0109051 | A1* | 6/2004 | Bright et al. | 347/95 |
| 2004/0222737 | A1* | 11/2004 | Raychaudhuri et al. | 313/504 |
| 2005/0276910 | A1* | 12/2005 | Gupta | 427/66 |

* cited by examiner

*Primary Examiner* — James Lin
(74) *Attorney, Agent, or Firm* — Cantor Colburn LLP

(57) ABSTRACT

Disclosed is an organic EL device having high external quantum efficiency, long emission life and low driving voltage. Also disclosed are an illuminating device and a display. Specifically disclosed is an organic electroluminescent device comprising, on a supporting substrate, at least an anode, a cathode and an organic compound layer which is arranged between the anode and the cathode and includes at least one light-emitting layer. This electroluminescent device is characterized in that the anode, cathode and organic compound layer are respectively formed by coating.

8 Claims, 3 Drawing Sheets

LIGHT

METHOD FOR MANUFACTURING ORGANIC ELECTROLUMINESCENT DEVICE

CROSS REFERENCE TO RELATED APPLICATIONS

This is a U.S. national stage of application No. PCT/JP2006/302636, filed on 15 Feb. 2006. Priority under 35 U.S.C. §119(a) and 35 U.S.C. §365(b) is claimed from Japanese Application No. 2005-129542, filed 27 Apr. 2005, the disclosure of which is also incorporated herein by reference.

FIELD OF THE INVENTION

This invention relates to a method for manufacturing an organic electroluminescent device.

BACKGROUND OF THE ART

Hitherto, electroluminescent display, hereinafter referred to as ELD, is known as a light emission type electronic displaying device. As the constitution element of the ELD, inorganic electroluminescent devices and organic electroluminescent devices, hereinafter also referred to as organic EL device, can be cited. The inorganic electroluminescent device which is applied as flat type light sources requires a high alternating-current voltage for driving as the light emitting device.

Meanwhile, the organic EL device is composed of a cathode, an anode and a light emission layer containing a light emission substance placed between the cathode and the anode, and is a light emission device in which electrons and positive holes are injected into the light emission layer to form excitons by recombination thereof and light emitted by inactivation of the excitons (fluorescence or phosphorescence) is utilized. Therefore, light can be emitted by applying a voltage of from several volts to several tens volts. The device displays wide view angle and high visibility since which is a self light-emitting device and is noted from the viewpoint of space saving and portability because the device is a thin layer type complete solid state element.

Development in the future of application of the organic EL device, an organic EL device capable of emitting high luminance light with higher light emitting efficiency at lower electric power consumption is demanded. As such development, a method for raising luminance of emitted light and prolonging lifetime of the device by doping a stilbene derivative, a distyrylarylene derivative or a trisstyrylarylene derivative with slight amount of a fluorescent substance, cf. Patent Publication 1 for example, a device having an organic light emission layer doped with slight amount of a fluorescent substance, cf. Patent Publication 2 for example, and a device having an organic light emission layer composed of a 8-hydroxyquinoline aluminum complex as a host compound doped with a quinacridone type dye, cf. Patent Publication 3 for example, are known.

In the technologies described in the above documents, it is said that the limit of external quantum efficiency (ηcxt) is 5% because the formation probability of the light emission exciton is 25% since the formation ratio of singlet exciton to triplet exciton is 1:3. And when the light from the singlet state exciton is used, its external output efficiency of the light is about 20%.

However, investigation on materials capable of emitting phosphorescence at room temperature is accelerated; cf. Non-patent Publication 2 and Patent Publication 4 for example, since an organic El device utilizing phosphorescence emitted from the triplet state of the exciton is reported by Princeton University, cf. Non-patent Publication 1 for example. The upper limit of the internal quantum efficiency can be raised by 100% when the triplet sate is utilized. Therefore, the light emission efficiency becomes up theoretically by four times compared with the emission by utilizing of the singlet state so that the performance becomes approximately the same as that of a cold cathode ray tube. Accordingly, such device is received attention because it can be applied as an illumination light source. For example, many compounds, principally heavy metal compounds such as iridium type complexes, are synthesized and investigated, cf. Non-patent Publication 3 for example.

At the present time, improvement in the light emission efficiency and prolongation in the lifetime of the organic El device utilizing the phosphorescent light emission are actively investigated. As one of those, a device having a plural layer constitution can be cited. On early days, the organic EL device has a single layer constitution in which the light emission layer is placed between the anode and the cathode. In such case, all processes of carrier injection, transfer of the carrier and light emission should be carried out only in the light emission layer. Therefore, the light emission efficiency is very low. Thereafter, a device having plural layers (multi-layered structure) which separately have functions such as the carrier injection, carrier transfer, blocking and light emission is developed so that large progress in the raising efficiency, prolongation of life and lowering in the driving voltage is obtained.

On the other hand, the vapor deposition process which is usually applied in the production of the organic EL device using a low molecular weight compound causes problems of production equipment and energy efficiency when the organic EL element having enlarged area is manufactured, and it is thought that a printing method including a ink-jet printing method and a screen printing method or a coating method such as a spin coating method and a cast coating method are desirable.

For example, plural light emission substances different in the maximum wavelength of emission light from each other should be contained in the light emission layer when the device is a white light emission device. Particularly, in the case of the phosphorescent light emission device, it is difficult to deposit plural phosphorescent dopants in the same ratio in every times of manufacturing so as to be surmised to cause a problem of production yield in the manufacturing process. However, if manufacturing of the organic EL device by the printing method or the coating method can be carried out by using a material superior in the solubility in a solvent, it is possible to contain phosphorescent dopants in the same ratio into every Organic EL devices to be manufactured by preparing a solution containing the phosphorescent dopants in the same ratio and the white color light emission devices each emitting the same color light can be stably manufactured.

As above-mentioned, the coating manufacturing method is generally inferior to the vapor deposition method though the coating method is considered as superior one of manufacturing methods. Therefore, the coating method is demanded to be further improved. For example, there is a problem on the coating method that adhesion between the layers is lowered, and a method is described, cf. Patent Publication 5 for example, in which the plural layers are subjected to pressing, heating and drying at once after coating for improving the adhesion so as to form irregularities at the interface between the organic layers.

Moreover, it is very difficult to form uniformly piled organic layers by the coating method when the plural organic layers each different in the function thereof such as a positive hole transfer layer, a light emission layer and an electron transfer layer are piled for raising the light emission efficiency and prolonging the lifetime, because the surface of the lower layer tends to be dissolved by the solvent of the upper layer coating liquid so that the lower layer is confused.

Contrary to that, a method is disclosed, cf. Patent Publication 6 for example, in which materials of the upper layer is dissolved in a solvent having a solubility parameter without the range of that of the principal material constituting the lower layer so as to pile the layers without confusion at the surface of the lower layer, cf. Patent Publication 6 for example. Moreover a method is disclosed, cf. Patent Publication 7 for example, in which the materials of the upper layer is dissolved in a mixture a solvent (poor solvent) being without the dissolvable range of the solubility parameter of the principal material constituting the lower layer and a solvent (good solvent) being within the dissolvable range of the solubility parameter of the material of the upper layer for lowering the solubility, cf. Patent Publication 7 for example.

Patent Publication 1: Japanese Patent No. 3093796

Patent Publication 2: JP-A 63-264692

Patent Publication 3: JP-A 3-255190

Patent Publication 4: U.S. Pat. No. 6,097,147

Patent Publication 5: JP-A 2005-26000

Patent Publication 6: JP-A 2002-299061

Patent Publication 7: JP-A 2005-259523

Non-patent Publication 1: M. A. Baldo et al., Nature, 395, p.p. 151-154 (1998)

Non-patent Publication 2: M. A. Baldo et al., Nature, 403, 17, p.p. 750-753 (2000)

Non-patent Publication 3: S. Lamansky et al. J. Am. Chem. Sci., 123, p. 4304 (2001)

DISCLOSURE OF THE INVENTION

Problems to be Solved by the Invention

As described above, the multilayer coating by a continuous wet coating method is difficult itself and causes lowering adhesion between the organic layers and confusion between the organic layers so as to pose problems such as lowering in the efficiency and lifetime and rising in the driving voltage.

Moreover, the known methods is difficultly applied for optional organic EL device because it is very rare case that the dissolving properties such as the solubility parameter and solubility are significantly different depending on the kind of the material generally to be used for the organic EL device.

Though coating method is a method having various advantages, the method is insufficient in the various demanded properties such as rising in the light emission efficiency, prolonging in the lifetime and lowering in the driving voltage. Therefore, any method and material for dissolving such subjects are strongly required.

An object of the invention is established on the above-described background and it is to provide a method of manufacturing an organic electroluminescent device by which a device having high light emission efficiency, long lifetime and suitability for low voltage driving can be manufactured with low cost.

Means to Solve the Problems

An object of the invention can be attained by the following constitution.

1. A method for manufacturing an organic electroluminescent device comprising plural organic compound layers placed between a cathode and an anode, wherein at least two of the plural organic compound layers are formed by a coating method, at least one of the layers other than the layer adjacent to the anode is formed by coating a dispersion and then subjected to a smoothing treatment.

2. The method for manufacturing an organic electroluminescent device described in 1, wherein the organic compounds contained in the plural organic compound layers each has a dissolvable range of solubility parameter of from 8.3 to 10.6 and a solvent in the dispersion has a solubility parameter of from 7.0 to 8.2 or 10.7 to 23.0.

3. The method for manufacturing an organic electroluminescent device described in 1 or 2, wherein the plural organic compound layers are composed of at least three layers.

4. The method for manufacturing an organic electroluminescent device described in 3, wherein at least three organic compound layers on top of each other are formed by the coating method.

5. The method for manufacturing an organic electroluminescent device described in 4, wherein the glass transition temperatures of main organic compounds in the three layers on top of each other are stepwise lowered in the order from the anode side.

6. The method for manufacturing an organic electroluminescent device described in anyone of 3 to 5, wherein the at least three organic compound layers are each formed by the coating method using dispersion and subjected to the smoothing treatment.

7. The method for manufacturing an organic electroluminescent device described in any one of 1 to 6, wherein all of the plural organic compound layers are formed by the coating method.

8. The method for manufacturing an organic electroluminescent device described in any one of 1 to 7, wherein the coating method uses a coating liquid containing a non-aqueous solvent.

9. The method for manufacturing an organic electroluminescent device described in any one of 1 to 8, wherein at least one of the plural organic compound layers contains a phosphorescent material.

Effects of the Invention

It was achieved by the invention to provide a method of manufacturing an organic electroluminescent device by which a device having high light emission efficiency, long lifetime and suitability for low voltage driving with low.

DESCRIPTION OF SYMBOLS

Figure 1:
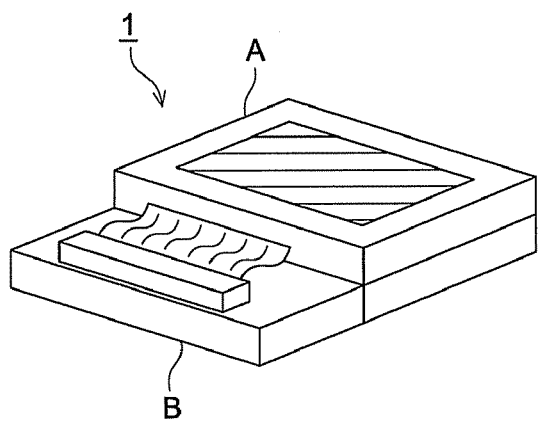
FIG. 1 is a schematic drawing showing an example of displaying apparatus composed of organic EL devices.

1: Display
3: Pixel
5: Scanning line
6: Data line
7: Power source line
10: Organic EL device
11: Switching transistor
12: Driving transistor
13: Capacitor
A: Displaying part
B: Controlling part
107: Glass substrate with transparent electrode
106: Organic EL layer
105: Cathode
102: Glass cover
108: Nitrogen gas
109: Moisture capturing agent

THE BEST EMBODIMENT TO CARRY OUT THE INVENTION

In the method of the invention for manufacturing an organic electroluminescent device comprising the plural organic compound layers placed between the cathode and the anode, at least two of the organic compound layers are formed by the coating method and at least one of the plural organic compound layers other than the layer adjacent to the anode is formed by coating a dispersion liquid and then subjected to the smoothing treatment. By these processes, the layers are formed by the smoothing treatment after the dispersed substance is partially dissolved. Consequently, the smoothness of the interface between the layer formed by the dispersion and the lower organic compound layer is further improved to result in increasing the adhesiveness. Thus it was found that the organic EL device having high external efficiency and long life and is capable of being driven by low driving voltage can be manufactured with lowered cost.

For example, when an aqueous dispersion of poly(3,4-ethylenedioxytiophnen)/polyethylenesulfonate, (hereinafter also referred to as PEDOT/PSS), prepared by making use of the difference of solubility, is used to form a positive hole transfer layer, a dispersion liquid is coated as an upper layer on the positive hole transfer layer, and then subjected to the smoothing treatment to form a thin layer. Thus the thin layer suitable for the organic EL device having high smoothness and high adhesiveness at the interface can be made so that the organic EL device having high light emission efficiency, long lifetime and suitability for low voltage driving can be manufactured with low cost.

In the invention, it is preferable that the dissolvable range of the solubility parameter of the organic compounds constituting the plural organic compound layers is from 8.3 to 10.6 and the solubility parameter of the solvent of the dispersion is from 7.0 to 8.2 or from 10.7 to 23.0. Within such condition, the dissolution of the lower layer by the solvent of the dispersion liquid on the occasion of forming a layer on the lower layer can be inhibited. As a result, mixing between the organic compound layers, namely the diffusion of the material from the layer formed by the dispersion into the lower layer or the diffusion from the lower layer to the layer formed by the dispersion, can be inhibited. Therefore, the external output efficiency and the lifetime of the organic electroluminescent device can be further improved and the driving voltage can be further lowered.

The solubility parameter is defined by the mole-evaporation heat ($\Delta H$) and mole-volume (V) and an amount expressed by the following expression:

Solubility parameter $SP=(\Delta H/V)^{1/2}$ in the above, the unit of the value is $(cal/cm^3)^{1/2}$.

The solubility parameter is generally applied as an indicator of the affinity with the solvent. In this specification, the solubility parameter is used as a numerical value describing the dissolving ability of the organic thin layer constituting the organic layer of the organic EL device. The values of the solubility parameter of the solvents listed in the following Table 1 were cited referring the values described in "Koubunnshi Zairyou no Talkyusei (Durability of High Molecular Weight Materials)" published by Kogyo Chosakai Publishing Co., Ltd.

The dissolvable range of solubility parameter is a range between the smallest value and the largest value in which the lower thin layer is received damage and the range is determined by the following procedure.

<Method for Determining the Dissolvable Range of Solubility Parameter of the Principal Materials Each Constituting the Organic Compound Layers>

A glass substrate plate having a size of 100 mm×100 mm×1.1 mm was washed by ultrasonic washing machine using isopropyl alcohol and dried by dried nitrogen gas and then further washed by ozone for 5 minutes. A material principally constituting the organic compound layer was coated on the transparent substrate by a spin coating method so as to make the thickness of the layer to be 30 nm and dried at 60° C. for 1 hour under reduced pressure. The material was dissolved by a suitable solvent such as tetrahydrofuran, toluene and dichlorobenzene so as to make a concentration of from 1.0 to 5.0% by weight thought the conditions are different depending on the kind of the material. The spin coating is carried out at an optional spinning rate of from 500 to 3,000 rpm so as to make the dry thickness of the layer to 30 nm.

On thus prepared test piece, a solvent having the solubility parameter in $(cal/cm^3)^{1/2}$ was coated by the spin coater at a rotation rate of 1,000 rpm for 30 minutes, and damage formed on the thin layer coated on the substrate is visually evaluated. As a result of the evaluation, the smallest value and the largest value of the solubility parameter at which no damage is observed on the coated layer is defined as the dissolvable range of solubility parameter.

TABLE 1

| Solvent | Solubility parameter $(cal/cm^2)^{1/2}$ |
|---|---|
| N-pentane | 7.0 |
| N-hexane | 7.2 |
| Diethyl ether | 7.7 |
| N-octane | 7.8 |
| Cyclohexane | 8.3 |
| Carbon tetrachloride | 8.6 |
| P-xylene | 8.8 |
| Toluene | 8.9 |
| Ethyl acetate | 9.0 |
| Tetrahydrofuran | 9.2 |
| Methyl ethyl ketone | 9.3 |
| Chloroform | 9.4 |
| Methylene chloride | 9.7 |
| Acetone | 9.8 |
| 1,4-dioxane | 10.1 |
| Pyridine | 10.8 |
| N-butanol | 11.1 |
| Isopropyl alcohol | 11.1 |
| Acetonitrile | 11.9 |

TABLE 1-continued

| Solvent | Solubility parameter $(cal/cm^2)^{1/2}$ |
|---|---|
| Dimethylformamide | 12.0 |
| Ethanol | 12.8 |
| Methanol | 14.8 |
| Water | 23.0 |

The dispersion is prepared by dispersing a substance difficultly dissolvable in the solvent, and the dissolvation of the lower layer of the layer formed by the dispersion by the solvent of the dispersion can be inhibited by making the dissolvable range of the organic compound constituting the organic compound layer to a value of from 8.3 to 8.2 and the solubility parameter of the solvent of the dispersion to a value of from 7.0 to 8.2 or 10.7 to 23.0, namely a condition is made in which the solubility is low not only to the dispersed compound in the dispersion but also to the organic compound constituting the other organic compound layer. The dissolvable range of solubility parameters of the organic compounds constituting the organic compound layer of the organic electroluminescent device are generally within 8.3 to 10.6. Therefore, the high quality organic electroluminescent device can be manufactured without narrowing the selection width of the materials.

It is preferable in the invention that at least three layers on top of each other are formed by the coating method. The organic EL device can be manufactured at further lowered cost by such method.

It is also preferable in the invention that the glass transition temperatures of each of the organic compounds constituting the at least three organic compound layers are stepwise reduced in the order of from the anode side. By such constitution, the upper layer can be formed without confusion of the lower layer on the occasion of drying with smoothing treatment. As a result, the organic electroluminescent device having further improved in the properties can be manufactured.

Moreover, it is preferable in the invention that at least three layers on top of each other are formed by the coating method using dispersion liquids. By such method, the smoothness and adhesiveness can be improved at many interfaces so that the external output efficiency, the lifetime and the suitability for low voltage driving of the organic electroluminescent device can be further improved.

It is preferable that the organic compound layers are entirely formed by the coating method, by that the organic electroluminescent device can be manufactured at further lowered cost.

The foregoing coating method is preferably carried out by using a non-aqueous solvent. By such method, an ionic substance such as a salt and slight amount of moisture probably contained in the thin layer can be excluded so as that the organic electroluminescent device having further improved properties can be manufactured.

It is preferable that at least one of the organic compound layers contains a phosphorescent material. The organic electroluminescent device having further high light emission efficiency can be manufactured by such method.

The method for manufacturing the organic EL device of the invention is further described below.
(Manufacturing Method of Organic EL Device)

A manufacturing method of the organic EL device composed of Anode/Anode buffer layer/Positive hole transfer layer/Light emission layer/Positive hole blocking layer/Electron transfer layer/Cathode buffer layer/Cathode is described as an example of manufacturing method of the organic EL device of the invention.

Firstly, a layer of a desired electrode substance such as an anode substance having a thickness of not more than 1 µm, and preferably from 10 nm to 200 nm, is formed on a suitable substrate by the coating method of the invention, vapor deposition or spattering to form an anode. The coating method may be the coating using a uniform coating liquid or dispersion coating liquid, the detail of the coating method is described later. Next, the organic compound layers such as a positive hole transfer layer, a light emission layer, a positive hole blocking layer and an electron transfer layer as the constituting layers of the organic El device and inorganic layers such as an node buffer layer and a cathode buffer layer are formed on the anode. For forming the cathode, the methods of coating, vapor deposition or spattering can be applied in the same manner as in the formation of the anode.

A desired organic EL device can be obtained by providing a cathode composed of a cathode material on the above-formed layers by, for example, a method of vapor deposition or spattering so as to make the thickness of the layer of not more than 1 µm, and preferably from 50 to 200 nm. The preparation of the organic EL device is preferably continuously carried out from the formation of the positive hole injection layer to the cathode at once vacuumizing but it is allowed that the substrate is taken out in the course of the preparation for subjecting another layer forming method. In such case, it is necessary to consider performing the operation under dried nitrogen gas atmosphere.

For manufacturing the multi-color display using the organic EL device of the invention, a shadow mask is applied only for formation of the light emission layer and any patterning such as the shadow mask is not necessary for the other layers which may be uniformly formed by a method such as a vapor deposition, casting, spin coating, ink-jetting, spraying and printing since these layers are commonly used for all area of the device.

When patterning is applied only to the light emission layer, the vapor deposition method, ink-jet method and printing method are preferably applied though the method for patterning is not specifically limited. The patterning using the shadow mask is preferable when the vapor deposition method is applied.

The formation of the layers may be carried out in reversed order such as the order of the cathode, cathode buffer layer, electron transfer layer, positive hole transfer layer, light emission layer, positive hole transfer layer, anode buffer layer and anode. When DC current is applied to the above obtained multi-color display, light emission can be observed by applying a voltage of from 2 to 40 V to the anode as positive pole and the cathode as negative pole. AC voltage also may be applied. The waveform of the AC current may be optional.

Though the vapor deposition method and the coating method can be applied for forming the anode, cathode and the organic and inorganic layers provided between the electrodes relating to the invention, the coating method, including solution coating and dispersion coating, is preferably applied in the invention.

As the coating method, a wet process such as the spin coat method, casting method, ink-jet method and printing method can be applied, and the spin coat method, ink-jet method and the printing method are particularly preferred since a uniform layer can be easily obtained and pin holes are difficultly formed. The layer forming method may be different for each of the layers. Details of the coating method are described later in the item of coating.

The thickness of each of the organic and inorganic layers is from 0.1 nm to 5 μm and it is preferable to be suitably selected within the range of from 5 nm to 200 nm.

When the vapor deposition method is applied with together for forming the constituting layers of the organic EL device such as the anode, cathode, organic compound layers and inorganic layers, it is preferable to control the condition so as to make a boat heating temperature of from 50° C. to 450° C. and a vacuum degree of from $10^{-6}$ Pa to $10^2$ Pa, a deposition rate of from 0.01 nm/sec to 50 nm/sec and a substrate temperature of from −50° C. to 300° C. though the conditions may be varied depending on the kind of the compound.

Detail of the constitution and the constituting materials of the organic EL device of the invention are described later.

<<Coating Method>>

The coating method relating to the method for manufacturing organic EL device of the invention is described below.

Though the coating liquid to be used in the coating method relating to the manufacturing method of the organic EL device of the invention may be either a solution in which the constituting materials are uniformly dissolved in a solvent or a dispersion in which the constituting materials of the organic compound layer are dispersed in a solid state, at least two of the organic compound layers are formed by the coating method and the dispersion is used in at least one of the layers other than the layer adjacent to the anode.

The coating liquid relating to the invention includes a solution in which suitably selected material for forming the cathode, anode or organic compound layer is dissolved in the solvent and a dispersion liquid in which particles of suitably selected material for forming the cathode, anode or organic compound layer are dispersed in the solvent. The particles may be primary particles or in a state of secondary particles.

(Non-Aqueous Solvent)

Non-aqueous solvent relating to the invention is described below.

It is one of preferable embodiments of the invention that a non-aqueous solvent is used for preparing the coating liquid which may be the solution or the dispersion.

The non-aqueous solvent is a solvent substantially containing no water, which is defined as a solvent containing water in an amount of not more than 0.1% by weight. The moisture content of the solvent can be measured by usual Karl Fischer aquameter or an automatic aquameter.

(Dispersion Using Non-Aqueous Solvent)

The dispersion using the non-aqueous solvent relating to the invention is described below.

The dispersion using non-aqueous solvent relating to the invention is a dispersion prepared by using the foregoing non-aqueous solvent. The solvent means that the principal component occupying 50% or more in volume of the dispersing media when plural kinds of the dispersing medium are used. In the above dispersion, the non-aqueous solvent other than water such as an alcohol type, a nitrile type and a hydrocarbon type solvent, concretely the following aromatic solvents, are preferably used.

It is preferable that the combination of the material for constituting the cathode, anode or organic compound layer is optimally selected according the kind of the organic compound layer.

In the preparation of the coating liquid relating to the invention, the solute concentration is preferably controlled within the range of from 0.01% to 10% by weight, in the case of the dispersion, the range of ratio of the solid component to the whole of the dispersion by weight of from 0.01% to 50% by weight. In the preparation of the dispersion, the size of the dispersed particle is preferably controlled so as to be not more than 1 μm.

(Solvent to be Used for Coating Liquid Preparation)

The solvent to be used for the coating liquid can be suitably selected without any limitation. Examples of the solvent include a halogen type solvent such as chloroform, 1,3-dichloroethane, dichlorobenzene and dichlorohexanone; a ketone type solvent such as acetone, methyl ethyl ketone, diethyl ketone, methyl isobutyl ketone, n-propyl methyl ketone and cyclohexanone; an aromatic solvent such as benzene, toluene and xylene; an ester type solvent such as ethyl acetate, n-propyl acetate, n-butyl acetate, methyl propionate, γ-butylolactone and diethyl carbonate; an ether type solvent such as tetrahydrofuran and dioxane; an amide type solvent such as dimethylformamide and dimethylacetoamide; an alcohol type solvent such as methanol, ethanol, 1-butanol and ethylene glycol; a nitrile type solvent such as acetonitrile and propionitrile; dimethyl sulfoxide; water; and a mixture thereof. A hydrophilic coating liquid can be obtained by the use of water, alcohol type solvent such as methanol, 1-butanol and ethylene glycol, the ether type solvent such as tetrahydrofuran and dioxane, amide type solvent such as dimethylformamide and dimethylacetoamide, and a mixture thereof.

Among the above, the alcohol type solvent and nitrile type solvent are preferable and methanol, ethanol, acetonitrile and propionitrile are more preferable for preparing the dispersion although any one can be used as long as which does not dissolve the dispersing element.

The boiling point of the solvent is preferably from 60° C. to 200° C. and more preferably from 80° C. to 180° C.

(Viscosity of Coating Liquid)

The viscosity of the coating liquid is preferably controlled within the range from 0.5 mPa·s to 500 mPa·s and more preferably from 1 mPa·s to 100 mPa·s for reducing the unevenness caused on the occasion of drying and easily controlling the dry layer thickness.

The viscosity of the coating liquid can be controlled within the suitable range by controlling the temperature and pressure on the occasion of the coating. The viscosity can be measured by a usual rotation viscometer and a B-type viscometer.

The kind of the coating liquid can be suitably selected according to the constituting material of the organic EL device, and may be a hydrophilic coating liquid or a lipophilic coating liquid.

(Coating Method of Coating Liquid and Coating Means)

The coating of the coating liquid can be suitably carried out by a wet coating method such as a dipping method, spin coating method, casting method, die coating method, roller coating method, bar coating method and gravure coating method. Among them, a method using a coater is preferable and an extrusion type coater is particularly preferred.

When the coating is carried out by using the extrusion type coater, an embodiment is preferable in which the extrusion type coater has a precision diaphragm pump and the coating liquid is extruded by driving the precision diaphragm pump.

In such case, the extrusion amount of the coating liquid can be easily controlled and the coating liquid can be coated on a large area in a state of thin layer with high precision. Therefore, such method is very advantageous for obtaining the organic light emission device superior in the light emission efficiency at low cost and high efficiency.

(Drying after Coating)

For drying the coated layer, it is preferable to apply temperature and pressure being within the range in which the coated layer is not received any damage.

When the dispersion is used as the coating liquid, the coated layer is subjected to the smoothing treatment. The smoothing treatment is a treatment for filming the dispersed material in the coated dispersion. As an example of the smoothing treatment, a treatment for filming the dispersed material by heating can be cited. In such case, it is preferable that the constitution layer of the organic EL device is formed after or while drying the solvent. When the layer forming by heating is carried out, the film formation is preferably carried out at a temperature lower than the glass transition temperature Tg of the principal component constituting the layer of the organic EL device; the principal component of the layer is also the principal component of the solid components dissolved in the coating liquid. Moreover, it is preferable that the glass transition temperatures of the principal components each constituting at least three layers on top of each other are stepwise lowered from the anode side.

The glass transition temperature can be measured by know method such as Differential Scanning Calorimetry (DSC).

<<Fine Particle Dispersion>>

For the coating relating to the invention, a dispersion can be used, in which the component constituting the organic EL device such as the anode, cathode or the organic compound layers is dispersed in a solid state, and it is preferable that the component is coated in a state of a fine particle dispersion in which the solid component is dispersed in a form of finely dispersed particle.

(Method for Preparing Fine Particle Dispersion)

Known methods for producing fine particle dispersion can be applied for preparing the fine particle dispersion. For example, dispersion or emulsification by physical force such as a homogenizer using high pressure or ultrasonic wave, a beads mill, a jet mill and an Altimizer. Additionally to the above, in the case of polymer material, a method can be applied in which fine particles are synthesized by a gas phase polymerization, emulsified polymerization or suspension polymerization and the resultant dispersion is used as the dispersion for coating liquid, re-dispersing treatment is necessary in some cases, such method can be applied for the coating relating to the invention.

The above methods may be applied singly or in combination thereof for preparing the fine particle dispersion. For preparing nanoparticle, usual known re-precipitation method such as that described in "Kagaku to Kogyo (Chemistry and industry)", p. 137, 2002, can be applied.

(Average Particle Diameter of Particles in Fine Particle Dispersion and Measuring Method of the Average Particle Diameter)

The fine particle dispersion containing nanoparticles having a diameter of nanometer size can be prepared by using the above methods. Such fine particle dispersion is effective for piling the layers constituting the organic EL device by coating and the properties such as the luminance and lifetime of thus obtained device are satisfactory.

The average diameter of the particles dispersed in the fine particle dispersion to be used in the invention is preferably from 1 nm to 200 nm, more preferably from 5 nm to 100 nm, and particularly preferably from 10 nm to 60 nm.

The nanoparticle dispersion suitable for forming the constitution layer of the organic EL device can be prepared by applying a combination of the above methods suitably selected according to the material to be used. The particle size of the fine particles dispersed in the dispersion is measured by Zetasizer 1000HS manufactured by Malvern Instruments Co., Ltd. The concentration of the dispersion may be diluted by the same solvent as that used in the dispersion according to the using conditions.

(Concentration of Dispersion)

The concentration of the dispersion or the fine particle dispersion is decided by the solid component concentration measured by the following method.

The concentration of the solid component is measured as follows. Five grams of the dispersion is sampled and dried 3 hours at 100° C. under reduced pressure and then the weight of the residue is measured. The concentration (solid component concentration) of the dispersion is determined by the following expression.

Solid component concentration (%)=Weight of residue (g)/5(g)×100

<<Application of Fine Particle Dispersion for Forming Layer Constituting Organic EL Element>>

Though the method for forming the layer constituting the organic EL device of the invention such as the anode, cathode and organic compound layers by coating method using the dispersion may be applied for any layers without any specific limitation, it is preferable for obtaining the effects of the invention such as raising in the external quantum efficiency, prolongation of lifetime and lowering in the driving voltage to include a phosphorescent light emission material relating to the invention, the phosphorescent light emission material is described later, in the light emission layer as a dopant compound by forming the light emission layer of the organic EL element of the invention by using the fine particle dispersion liquid or fine particle dispersion of the phosphorescent.

(Fine Particle Dispersion of Phosphorescent Organic Metal Complex)

A phosphorescent organic metal complex is preferably used as the phosphorescent light emission material. The merit of the use of the phosphorescent light emission organic complex, which is later described in detail, in a state of fine particle dispersion on the occasion of the formation of light emission layer so as to be included into the layer as the dopant is considered by the inventors as follows.

Hitherto, a vapor deposition method such as spattering and a method by coating are applied for forming the layer constituting a device using an organic metal complex, the fluorescent light emission organic metal complex is included in this category.

In the coating using a solution system which is superior to the spattering method in the cost merit, a polar solvent is generally used by skilled one for dissolving the organic metal complex.

A problem is posed that that the concentration quenching ability of an inclusion compound, a light emission compound having a dendrimer structure and an organic metal complex having a ligand containing a polymer chain which are said that they display high concentration quenching inhibiting ability in the usual organic EL device is not sufficiently displayed when the solvent capable of easily dissolving the organic metal complexes.

It is found by the inventor that the concentration quenching inhibiting ability inherently owned by the inclusion type organic metal complex and that having the ligand having a polymer chain can be fully displayed by using such compounds in a form of dispersion of fine particle dispersion not the form of solution.

In the case that the organic metal complex is used as the dispersion or fine particle dispersion, not in the form of solution, a merit in the manufacturing of the organic EL device that the average particle size or the dispersion concentration can be tuned so as to optimize for each of the materials can be also obtained.

Moreover, an effect of the invention can be obtained that the thin layer properties of individual material can be easily optimized or tuned since molecular interaction within micro range can be formed in the dispersion system compared with the uniform solution system.

The solvent for dispersing the phosphorescent light emission organic metal complex is not specifically limited as long as the complex can be dispersed by the solvent, and a nonpolar solvent, alcohol and water which are generally considered as a poor solvent are preferably used as the solvent.

<<Composite>>

In the invention, it is arrowed that the phosphorescent light emission organic metal complex, which is later described in detail, is included in an inclusion compound to form a composite.

It is preferable that the composite exits in a form of that the phosphorescent light emission organic metal complex, which is also called as light emission dopant and described later in detail, is included in the inclusion compound. The inclusion compound preferably has a positive hole transfer group or an electron transfer group. The positive hole transfer group and the electron transfer group are described in the description of the inclusion compound.

The inclusion compound may be used in a form of polymer having partial structures having the inclusion ability as repeating unit.

The inventors attain rising in the external quantum efficiency and prolonging the lifetime of the organic EL device and lowering in the driving voltage by dissolving the above problem by the organic EL device manufactured by using the composite according to the invention. The details of the investigation are described below.

In known light emission compound having the dendrimer structure, which is a compound having a dendron, an organic light emission device using a fluorescent color conversion membrane having a fixed organic fluorescent dye formed by including an organic fluorescent dye into a cyclodextrin derivative and an organic electroluminescent device containing a inclusion complex of an organic compound and cyclodextrin, a inclusion effect (also called as cage effect) caused by including the light emission material in the internal space of the inclusion compound is successfully obtained. By the inclusion effect, inhibition of the concentration quenching caused by hindrance of closing of the dopants with together by spatial factors, inhibition in the degradation of the material and improving in the stability of device can be obtained. On the other hand, a undesired tendency is posed such as lowering in the recombination efficiency of positive hole and electron which is essential for light emission of the organic EL device is lowered, and lowering in the light emission efficiency and rising in the driving voltage caused by inhibition of the smoothly energy transfer from the triplet excited state of the compound formed by the recombination of positive hole and electron to the phosphorescent light emission material or the organic metal complex.

As a result of investigation by the inventors, it is considered that the balance of inclusion effect and the charge injection is the key for solving such problem, and the intermolecular action between the inclusion compound and organic metal complex is noted as a means for controlling the above balance. The molecular interaction is expressed by the degree of inclusion of the organic metal complex by the inclusion compound.

The balancing situation can be presumed by measuring the inhibiting ability on the concentration quenching of each of the organic metal complexes and the composites as the parameter expressing the molecular interaction. In the invention, the concentration for displaying the concentration quenching is determined by the fluorescent light photometry, and is described later in detail.

The composite usable in the invention is useful for the material for constituting one kind of lamp such as various kinds of light source and lighting apparatus additionally to the various indication devices and displays. Moreover, it is also useful as the material for indication apparatus such as backlight of a liquid crystal display. Among them, the device is preferably used as the material of the organic EL device to be used as the above indication apparatus and the lighting apparatus and particularly useful for the constituting material of the light emission layer constituting the organic El device; the light emission layer is later described in detail.

The synthesis of the composite is carried out by including the phosphorescent light emission organic metal complex into the inclusion compound, and such synthesis can be performed referring the synthesizing method of known inclusion compound in a state of that the guest molecule is included in the internal space of the inclusion compound. Such synthesis method is known to a person skilled in the art.

<<Inclusion Compound>>

The inclusion compound usable in the invention is described below.

The inclusion compound usable in the invention is a compound having the inclusion ability as follows.

(Inclusion)

In the invention, the inclusion is a phenomenon of forming the composite of the invention by encircling the compound to be included by the inclusion compound by a bonding force such as an ion bond force, an ion-dipolar interaction, a hydrogen bond, an interaction of charge transfer, a van der Waals attraction and a π-π interaction (π stack). In the invention, the compound to be included is the phosphorescent light emission compound.

In the invention, the sate in which the guest compound is encircled by the including compound preferably includes a state in which the inclusion compound is formed a molecule composite with the guest compound by molecular interaction and a state in which the guest compound is not completely included in the internal space of the inclusion compound additionally to the sate in which the guest compound is completely or partially included in the inclusion compound. In the invention, the state in which the guest compound is incompletely included in the internal space of the inclusion compound is preferable since the effect of the invention such as raising the external output quantum efficiency can be further successfully obtained.

(Confirmation Method of Inclusion)

For confirming that the phosphorescent light emission organic metal complex is included by the inclusion compound to form the composite or the organic metal complex exists in a not included state, a known method for confirming the inclusion compound can be applied.

For example, the formation of the inclusion compound can be confirmed by disappearance of the organic metal complex in the solution when the inclusion in a solvent system in which the inclusion compound is dissolved and the organic metal complex is not dissolved.

As the more quantitative confirming means, $^1$H-NMR or $^{15}$C-NMR (nuclear magnetic resonance) can be applied. By such method, it can be quantitatively confirmed that the organic metal complex exists in the free state or in a state forming the composite with the inclusion compound.

The balance of the inclusion effect and the charge injection, namely the strength of molecular interaction between the inclusion compound and the organic metal complex, can be confirmed by the degree of inclusion, also referred to as concentration quenching inhibiting degree, calculated according to the following description.

The degree of inclusion is described below.

<<Calculation Method of Degree of Inclusion (Concentration Quenching Inhibiting Degree)>>

The concentration of the composite or non-included organic metal complex at which the concentration quenching is disappeared is determined by measurement of the intensity of fluorescent light and the inhibition degree is calculated for presuming the degree of inclusion.

In concrete, the degree of inclusion can be calculated by the follows operation. Synthesized composite, also referred to as included compound, is purified by gel filtration chromatography or column chromatography and the fluorescent light is measured at various concentrations and the measurements are each repeated for three times and the measured values are averaged.

From the fluorescent light intensity at each of the various concentrations, the concentration C causing the concentration quenching is determined. The concentration $C_0$ causing the concentration quenching of the non-included organic metal complex was determined in the same manner as the reference. The compound is defined as an included compound, namely the organic metal complex is included by the inclusion compound, when the value of $C/C_0$ is not less than 1.1. In the invention, the value of $C/C_0$ is preferably not less than 1.2 and more preferably from 1.4 to 3.9.

The concentration of the phosphorescent dopant in the included compound can be determined and calculated by inductively coupled plasma ICP which is a method usually known by skilled one.

The balance between the inclusion effect and the charge injection is optimized by considering the molecular interaction between the inclusion compound and the organic metal complex based on the degree of inclusion (inhibition degree of concentration quenching) so that the organic EL device utilizing the high light emission efficiency of the phosphorescent light emission type organic EL element while having long light emission life can be developed by the inventors. It is also found that the organic EL device of the invention displays superior property that the driving voltage is lowered.

As a method for controlling the including condition of the organic metal complex in the composite formed by the phosphorescent light emission organic metal complex included in the inclusion compound, the including ratio of the inclusion compound to the organic metal complex can be controlled, for example, a 1:1 included material and a 2:1 included material, by selecting the combination of the including compound and the phosphorescent light emission dopant. As a result of the control of the including state, concretely controlling the balance the inclusion effect and the molecular interaction, not only the raising in the external output quantum efficiency and prolonging the light emission lifetime but also lowering in the driving voltage of the device can be realized.

<<Concrete Example of Inclusion Compound>>

The inclusion compounds usable in the invention are the following compounds having the including ability. Examples of such compound include a crown ether derivative, a cyclophane derivative, a calixarene derivative, a carbon-nanotube derivative, a cyclodextrin derivative, a cyclotriphosphazene, a cyclocryptande derivative and a potande derivative. Among them, the calixarene derivative, crown ether derivative, and cyclodextrin derivative are preferable and the calixarene derivative and crown ether derivative are particularly preferable.

The calixarene derivative, crown ether derivative and cyclodextrin derivative preferably usable as the inclusion compound in the invention are concretely described below.

(Calixarene Derivative)

The calixarene derivative usable in the invention is generic term of compounds having a cyclic structure formed by a phenol derivative bonded with an alkylene group or an oxyalkylene group as represented by the following Formula A. The phenolic hydroxyl group in the molecule may be substituted by a substituent.

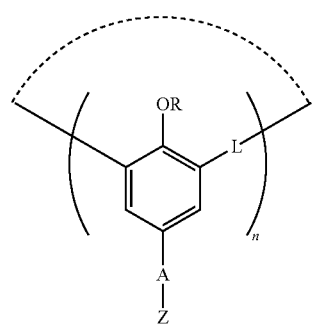

Formula A

In Formula A, the divalent bonding groups represented by A or L are each a hydrocarbon group such as an alkylene group, an alkenylene group, an alkynylene group and arylene group, and they may be the alkylene group, alkenylene group, alkynylene group and arylene group each having a hetero group such as a nitrogen atom, a sulfur atom and a silicone atom. The divalent bonding group may be a group derived form a compound having an aromatic ring, also called as hetero aromatic compound, such as a thiophene-2,5-di-yl group and a pyrazine-2,3-di-yl group, and a chalcogen atom such as a oxygen atom and a sulfur atom. Moreover, the bonding group may be a group capable of bonding through a hetero atom such as an alkylamino group, a dialkylsilane-di-yl group.

Moreover, a divalent group derived from an aromatic heterocyclic ring selected from, for example, a carbazole ring, a carboline ring, a diazacarbazole ring which is also called monoazacarboline ring and has a ring structure of carboline ring in which a carbon atom is replaced by a nitrogen atom as the divalent bonding group, a triazole ring, a pyrrole ring, a pyridine ring, a pyrazine ring, a quinoxaline ring, a thiophene ring, an oxadiazole ring, a dibenzofuran ring, a dibenzothiophene ring and an indole ring are usable as the divalent bonding group represented by A or L.

These may be substituted with R which will be described later.

The compound represented by Formula A may have the following substituent represented by R.

Examples of the substituent represented by R in Formula A include an alkyl group such as a methyl group, an ethyl group, a propyl group, an isopropyl group, a tert-butyl group, a pentyl group, a hexyl group, an octyl group, a dodecyl group, a tridecyl group, a tetradecyl group and a pentadecyl group; a cycloalkyl group such as a cyclopentyl group and a cyclohexyl group; an alkenyl group such as a vinyl group and an allyl group; an alkynyl group such as an ethynyl group and a propalgyl group; an aryl group such as a phenyl group and a naphthyl group; an aromatic hetero group such as a furyl group, a thienyl group, a pyridyl group, a pyridazinyl group, a thiazolyl group, a pyrimidinyl group, a pyradinyl group, a triazinyl group, an imidazolyl group, a pyrazolyl group, a thiazolyl group, a quinazolyl group, a carbazolyl group, a carbolinyl group, a diazacarbazolyl group having a ring structure of carboline ring in which one of the carbon atoms is replaced by a nitrogen atom, and a phthalidinyl group; a heterocyclic group such as a pyrrolidyl group, an imidazolidyl group, a morpholyl group and an oxazolidyl group; an alkoxy group such as a methoxy group, an ethoxy group, a propoxy group, a pentyloxy group and a hexyloxy group, an octyloxy group and a dodecyloxy group; a cycloalkoxy group such as a cyclopentyloxy group and a cyclohexyloxy group; an aryloxy group such as a phenoxy group and a naphthyloxy group; an alkylthio group such as a methylthio group, an ethylthio group, a propylthio group, a pentylthio group, a hexylthio group, an octylthio group and a dodecylthio group; a cycloalkylthio group such as a cyclopentylthio group and cyclohexylthio group; an arylthio group such as a phenylthio group and a naphthylthio group; an alkoxycarbonyl group such as a methyloxycarbonyl group, an ethyloxycarbonyl group, a butyloxycarbonyl group, an octyloxycarbonyl group and a dodecyloxycarbonyl group; an aryloxycarbonyl group such as a phenylocycarbonyl group and a naphthyloxycarbonyl group; a sulfamoyl group such as an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group and a 2-pyridylaminosulfonyl group; an acyl group such as an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group and a pyridylcarbonyl group; an acyloxy group such as an acetyloxy group, an ethylcarbonyloxy group, a butylcarbonyloxy group, an octyloxycarbonyl group, a dodecylcarbonyloxy group and a phenylcarbonyloxy group; an amido group such as a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylammino group, a dodecylacrbonylamino group, a phenylcarbonylamino group and naphthylcarbonylamino group; a carbamoyl group such as an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group; a ureido group such as a methylureido group, an ethylureido group, a pentylureido group, a cyclohexylureido group, an octylureido group, a dodecylureido group, a dodecylureido group, a phenylureido group and a 2-pyridylaminoureido group; a sulfinyl group such as a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group; an alkylsulfonyl group such as a methylsulfonyl group, an ethylsulfonyl group, a butylsulfonyl group, a cyclohexylsulfonyl group, a 2-ethylhexylsulfonyl group and a dodecylsulfonyl group; an arylsulfonyl group and a heteroarylsulfonyl group such as a phenylsulfonyl group, a naphthlsulfonyl group and a 2-pyridylsulfonyl group; an amino group such as an amino group, an ethylamino group, a dimethylamino group, a butylamino group, a cyclopentylamino group, a 2-ethylhexylamino group, a dodecylamino group, an anilino group, a naphthylamino group and a 2-pyridylamino group; a halogen atom such as a fluorine atom, a chlorine atom and a bromine atom; a fluorohydrocarbon group such as a fluoromethyl group, a trifluoromethyl group, a pentafluoroethyl group and a pentafluorophenyl group; a cycno group; a nitro group; a hydroxy group; a mercapto group; and a silyl group such as a trimethylsilyl group, a triisopropylsilyl group, a triphenylsilyl group and a phenyldiethylsilyl group.

These substituents may be further substituted by the foregoing substituent. The substituents may form a ring by bonding with together.

Concrete examples of the calixarene derivative are listed bellow but the invention is not limited to them.

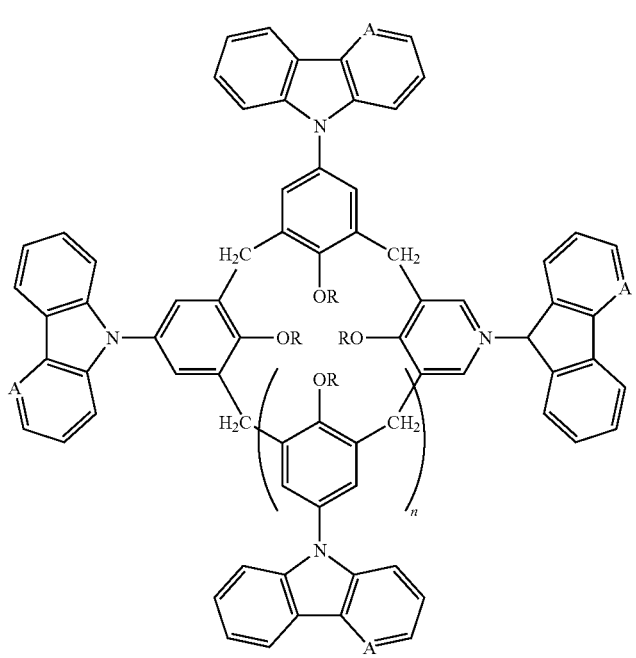

CA-1 n = 1-6
R = H, Me, Ac
A = CH, N

In CA-1, A is CH or N, R is a hydrogen atom, a methyl group or an acetyl group, and n is an integer of from 1 to 6.

(Crown Ether Derivative)

The crown derivative usable in the invention is general term of a polyether such as those represented by Formula B or C which has ability of including a metal ion or an organic ion by functioning as a multi-dented ligand, in which the oxygen atom may be replaced by a nitrogen atom or a sulfur atom.

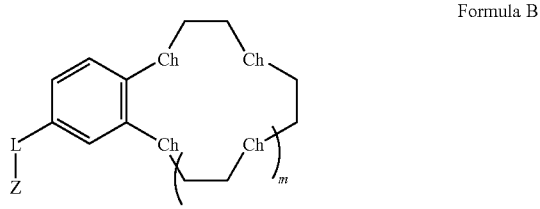

Formula B

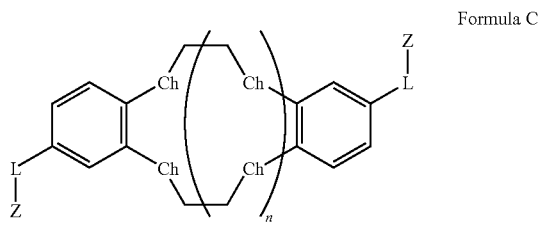

Formula C

In Formulas B and C, L is a single bond or a divalent bonding group, Ch is an oxygen atom or a sulfur atom. m is an integer f from 1 to 9, n is an integer of from 1 to 3, and Z is a residue group of a fluorescent compound or that of a phosphorescent compound.

In Formulas A and B, the divalent bond represented by L is synonym of the divalent bond represented by A or L in Formula A.

As the fluorescent compound to be used for the fluorescent compound residue group represented by Z in Formulas B and C, the dyes and fluorescent dopants (also called as fluorescent light emission compounds) and the fluorescent compounds described later are cited.

As the phosphorescent compound to be used for the phosphorescent compound residue group represented by Z in Formulas B and C, the later described phosphorescent compounds (also called as phosphorescent dopants) are cited.

The crown ether derivative represented by Formula B or C may have a substituent the same as the substituent R of the calixarene derivative represented by Formula A.

Concrete examples of the crown ether derivative usable in the invention are described below, but the invention is not limited to them.

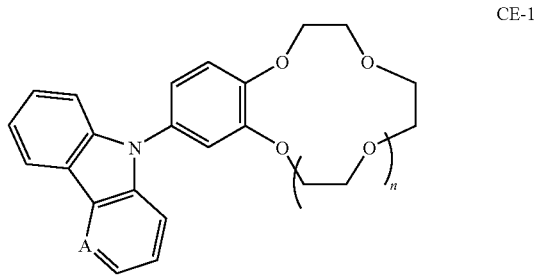

CE-1 n = 1-9
A = CH, N

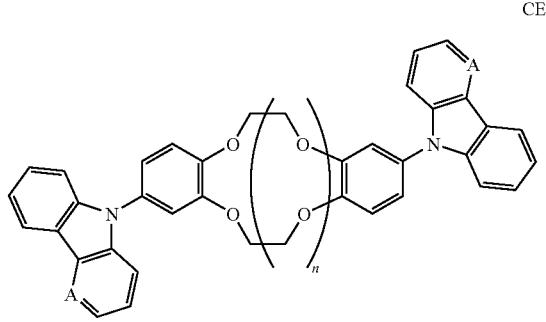

CE-2 n = 1-3
A = CH, N

In the above concrete examples CE-1 and CE-2, A is CH or N and n is an integer of from 1 to 9.

(Cyclodextrin Derivative)

The cyclodextrin derivative usable in the invention is general term of the compounds having a structure formed by cyclizing plural D-gulcopyranose groups by α-1,4-glycoside bonds. The primary and secondary hydroxyl groups existing in the molecule may be substituted by a substituent.

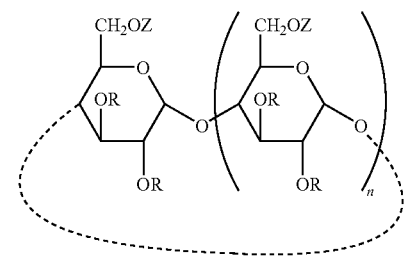

Formula D

In Formula D, R is a substituent, Z is a residue group of fluorescent compound or a residue group of a phosphorescent compound.

The substituent represented by R in Formula D is synonym with the substituent represented by R in Formula A.

As the fluorescent compound to be used for the fluorescent compound residue group represented by Z in Formula D, the dyes and fluorescent dopants (also called as fluorescent light emission compounds) and the fluorescent compounds described later are cited.

As the phosphorescent compound to be used for the phosphorescent compound residue group represented by Z in Formula D, the later described phosphorescent compounds (also called as phosphorescent dopants) are cited.

Examples of the cyclodextrin derivative preferably usable in the invention are described below, but the invention is not limited to them.

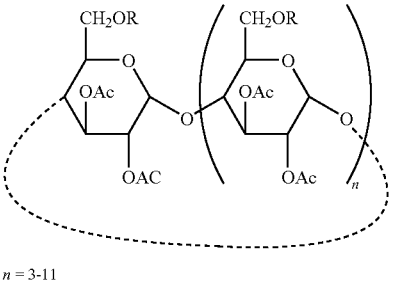

n = 3-11

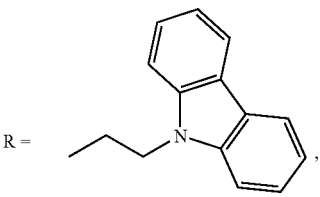

R =

CD-1

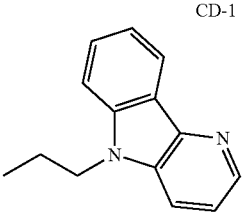

CD-2

In CD-1 and CD-2, Ac is an acetyl group.

The inclusion compound usable in the invention is preferably has at least a positive hole transfer group or an electron transfer group from the view point of rising in the light emission efficiency of the device. The positive hole transfer group and the electron transfer group of the inclusion compound to be used in the invention are described below.

(Positive Hole Transfer Group of Inclusion Compound)

The positive hole transfer group to be contained in the inclusion compound usable in the invention is described below.

As the positive hole transfer group to be contained in the inclusion compound usable in the invention, a substituent is preferably used, which is derived from the later mentioned positive hole transfer material to be contained in the positive hole transfer layer constituting the organic EL device of the invention.

The positive hole transfer material containing the positive hole transfer group as a partial structure in the molecule is a substance having one of abilities of positive hole injection, positive hole transfer or electron barrier, which may be an organic substance or an inorganic substance. Examples of the material include a triazole derivative, an oxadiazole derivative, an imidazole derivative, a carbazole derivative, a carboline derivative, a diazacarbazole derivative (diazacarbazole is a compound formed by replacing one of the carbon atoms constituting the carboline derivative by a nitrogen atom), a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline type polymer, known materials such as an electroconductive oligomer, particularly a thiophene oligomer, a porphyrin compound, an aromatic tertiary amine compound, and a styrylamine compound.

Typical examples of the aromatic tertiary amine compound and the styrylamine compound include N,N,N',N'-tetraphenyl-4,4'-diaminophenyl, N,N'-diphenyl-N,N'-bis(3-methylphenyl)-[1,1'-biphenyl]-4,4'-diamne) (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,41-diaminobiphenyl, N,N,N',N'-tetraphenyl-4,4'-diaminodiphenyl ether, 4,41-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbenzene, N-phenylcarbazole, ones having two condensed aromatic rings described in U.S. Pat. No. 5,061,569 such as 4,4'-bis[N-(1-naphthyl)-N-phenylamino]biphenyl, and ones composed of three triphenylamine units bonded in a star burst shape described in JP-A 4-308688 such as 4,4',4"-tris-[N-(3-methylphenyl)-N-phenylamino]triphenylamine, hereinafter abbreviated as MTDATA.

A preparation method of the dispersion relating to the invention is described below.

(a) Preparation of Dispersion (Fine Particle Dispersion) by Re-Precipitation Method.

In 30 ml of tetrahydrofuran (THF), 300 mg of polyvinylcarbazole (PVK) and 18 mg of tris(2-phenylpyridine iridium Ir(ppy)$_3$ were dissolved. Then 50 ml of an ethanol/THF (9/1) solution was vigorously stirred and 10 ml of the above THF solution was dropped by a micro syringe into the ethanol/THF solution to obtain a primary dispersion. The primary dispersion was gradually concentrated under nitrogen gas stream spending 6 hours while stirring until the volume of the dispersion was reached to be half to obtain an objective dispersion having an average particle size of 60 nm.

(b) Preparation of Dispersion (Fine Particle Dispersion: Nano Fine Particle) by Emulsification Dispersing Method.

In a pot of Cleamix CLM, manufactured by M-tech Co., Ltd., 12 g of polyvinylcarbazole (PVK), 0.72 g of tris(2-phenylpyridine)iridium Ir(ppy)$_3$ and 100 ml of 1,2-dichloroethane were charged and dissolved by stirring.

To the above solution, 270 ml of purified water was added and emulsified for 5 minutes at 20,000 rpm. After that, 1,2-dichloroethane was removed by flow out to obtain an aqueous fine particle dispersion having an average particle size of 60 nm.

Thereafter, the solvent was replaced by n-butyl alcohol by a common method to obtain the objective fine particle alcohol dispersion having an average particle size of 50 nm.

(c) Preparation of Nano Fine Particle Dispersion Using Apex Mill

To 300 ml of ethyl alcohol, 50 g of 4,4'-bis[N-(1-naphthyl)-N-phenylamino]biphenyl (α-NPD) and dispersed by Apex Mill, manufactured by Kotobuki Kogyo Co., Ltd., for 20 minutes at a circumstance speed of 8 m/sec using beads of 0.05 mm to obtain an objective fine particle alcohol dispersion having an average particle size of 35 nm.

Preferable concrete examples of the layer constitution of the organic EL element of the invention are described below, but the invention is not limited to them.

(i) Anode/Light emission layer/Electron transfer layer/Cathode (ii) Anode/Positive hole transfer layer/Light emission layer/Electron transfer layer/Cathode (iii) Anode/Positive hole transfer layer/Light emission layer/Positive hole blocking layer/Electron transfer layer/Cathode (iv) Anode/Positive hole transfer layer/Light emission layer/Positive hole blocking layer/Electron transfer layer/Electron transfer layer/Cathode buffer layer/Cathode (v) Anode/Anode buffer layer/Positive hole transfer layer/Light emission layer/Positive hole blocking layer/Electron transfer layer/Cathode buffer layer/Cathode (Organic Compound Layer)

Among the above layer constitution, the positive hole transfer layer, light emission layer, positive hole blocking layer and electron transfer layer are cited as the organic compound layer relating to the organic El device of the invention. Other than the above layers, any layer such as a positive hole injection layer, electron injection layer is defined as the organic compound layer as long as an organic compound is contained therein. Moreover, the anode buffer layer and the cathode buffer layer are each an organic compound layer when the anode buffer layer and the cathode buffer layer each contains an organic compound.

The organic compound layer includes a layer containing later described "organic EL device material usable for a constituting layer of the organic EL device".

(Inorganic Compound Layer)

The inorganic layer is a layer principally formed by an inorganic compound, concretely, the anode buffer layer and the cathode buffer layer each formed by the inorganic compound among the above layers can be cited. In the above, "principally formed" means that the component occupies not less than 50% of the ingredient of the layer.

<<Positive Hole Transfer Layer>>

The positive hole transfer layer is a layer comprising a positive hole transfer material having positive hole transferring ability. The positive hole injection layer and the electron blocking layer are included in the positive hole transfer layer in wide means. Single or plural positive hole transfer layers can be provided.

The positive hole transfer material is a material having at least one of positive hole injection or transferring ability and an electron barring ability, and may be an organic substance or inorganic substance.

In the positive hole transfer layer to be used in the invention, known substances such as a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a silazane derivative, an aniline type polymer, and an electroconductive oligomer, particularly a thiophene oligomer are usable.

Though the above mentioned material can be used as the positive hole transfer material, a porphyrin compound, an aromatic tertiary amine compound and a styrylamine compound, particularly the aromatic tertiary amine compound are preferably used.

As typical examples of the aromatic tertiary amine compound and the styrylamine compound, these the same as the aromatic tertiary amine compound and the styrylamine compound described as the positive hole transfer group to be contained in the foregoing inclusion compounds can be applied.

Furthermore, a polymer material in which such material is introduced into the polymer chain or the material constituted the backbone thereof are also usable. An inorganic material such as p-type Si and p-type SIC is usable for the positive hole injection material or the positive hole transfer material.

The positive hole transfer layer can be formed by making the above positive hole transfer material to a thin layer by a known method such as a vacuum deposition method, a spin coating method, a casting method, a printing method including an ink-jet method and a BL method. The thickness of the positive hole transfer layer is usually from about 5 nm to 5 μm, and preferably from 5 nm to 200 nm though the layer thickness is not specifically limited. The positive hole transfer layer may be a single layer composed of one or two or more kinds of the above positive hole transfer materials.

Concrete examples of the compound preferably usable for forming the positive hole transfer layer of the organic EL device of the invention are listed below, however the invention is not limited to them.

A. Positive Hole Transfer Material

OC-1
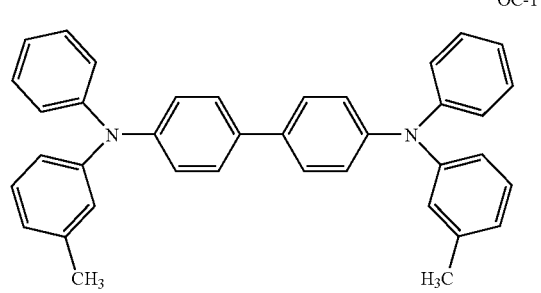

OC-2
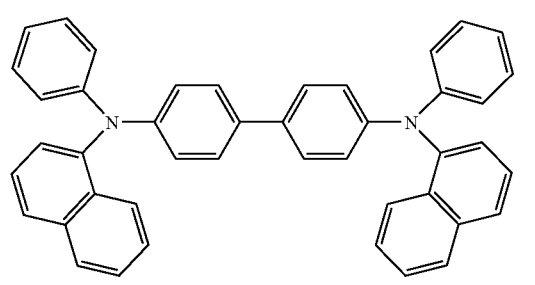

OC-3
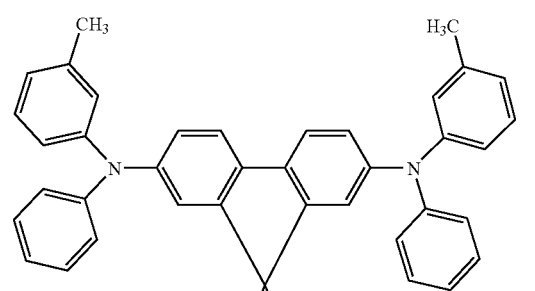

OC-4
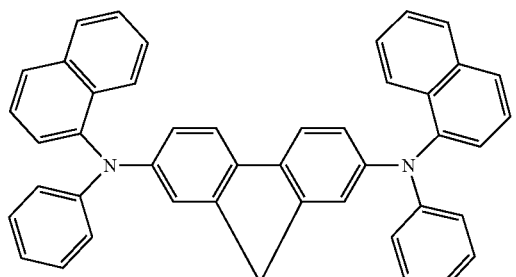

OC-5
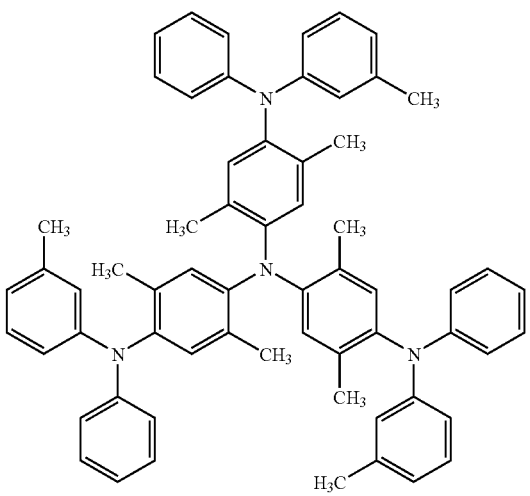

<<Electron Transfer Material>>

The electron transfer layer usable in the invention may one having an ability of transferring an electron injected from the cathode to the light emission layer. As the material for forming such layer, one optionally selected from known materials can be used. The electron transfer layer is a layer containing a material capable of transferring the electron, and an electron injection layer, a positive hole blocking layer are also included in the electron transfer layer in wider means. One or plural electron transfer layers may be provided.

Examples of the material to be used in the electron transfer layer, hereinafter referred to as electron transfer material, include a nitro-substituted fluorene derivative, a diphenylquinone derivative, a thiopyrazine dioxide derivative, a heterocyclic tetracarboxylic acid anhydride such as naphthalene perylene, a carbodiimide, a fuluorenilydenemethane derivative, a derivative of anthraquinonedimethane and anthrone, and an oxadiazole derivative. In the oxadiazole derivative, a thiadiazole derivative formed by replacing the oxygen atom of the oxadiazole derivative by a sulfur atom, and a quinoxaline derivative having a quinoxaline ring which is known as an electron attractive group are also usable as the electron transfer material.

A polymer material in which the above material is introduced into the polymer chain or the above material composes the backbone can be used.

A metal complex of 8-quinolinol derivative such as aluminum tris(8-quinolinol) ($Alq_3$), aluminum tris(5,7-dichloro-8-quinolinol), aluminum tris(5,7-dibromoro-8-quinolinol), aluminum tris(2-methyl-8-quinolinol), tris(5-methyl-8-quinolinol)aluminum, zinc bis(8-quinolinol) (Znq), and metal complexes formed by replacing the central metal atom of metal of the above compound by In, Mg, Cu, Ca, Sn, Ga or Pb are also usable as the electron transfer material.

Other than the above, a metal free or metal phthalocyanine, and ones formed by substituting at the terminal of such phthalocyanine by an alkyl group or a sulfonic acid group are also preferably usable as the electron transfer material. Furthermore, the styrylpyrazine derivatives exemplified as the material for the light emission layer are usable as the electron transfer, and an inorganic semiconductor such as n-type Si and n-type SiC can be used as the electron transfer material as same as in the positive hole injection layer and the positive hole transfer layer.

The electron transfer layer can be formed by subjecting the above-described materials to a known thin layer forming method such as a vacuum deposition method, a spin coating method, a casting method, a printing method including an LB method.

(Thickness of Electron Transfer Layer)

The electron transfer layer can be formed by subjecting the above-described materials to a known thin layer forming method such as a vacuum deposition method, a spin coating method, a casting method, a printing method including an ink-jet method, and a LB method. The thickness of the electron transfer layer is usually from about 5 nm to 5 μm, and preferably from 5 nm to 200 nm though the layer thickness is not specifically limited. The electron transfer layer may be a single layer composed of one or two or more kinds of the above electron transfer materials.

Concrete examples preferably used for forming the electron transfer layer of the organic EL device of the invention are listed below, however the invention is not limited to them.

C. Electron Transfer Material

OC-19

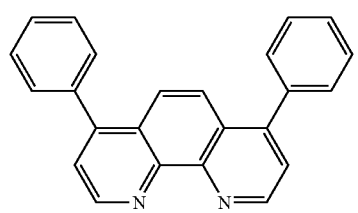

OC-20

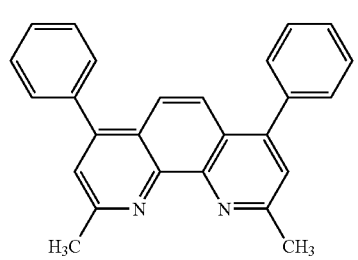

-continued

OC-21

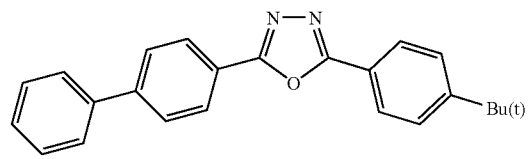

OC-22

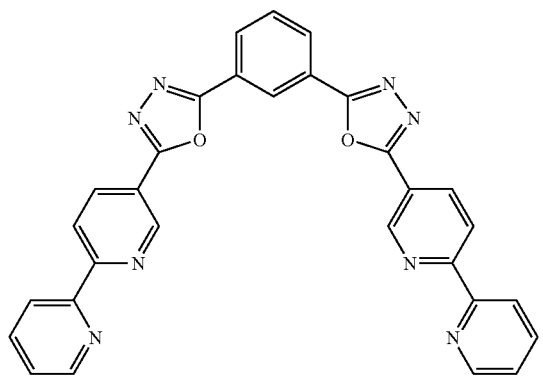

OC-23

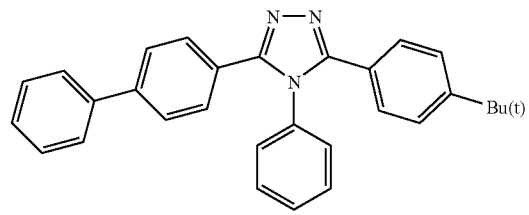

OC-24

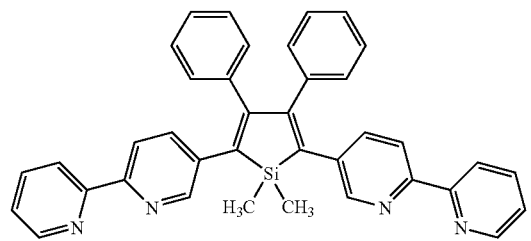

OC-25

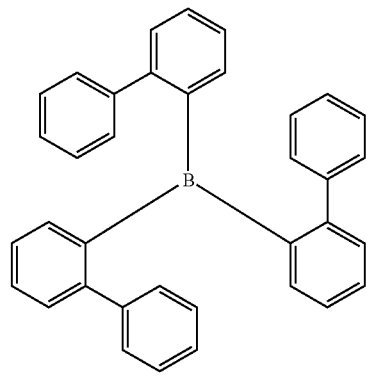

OC-26

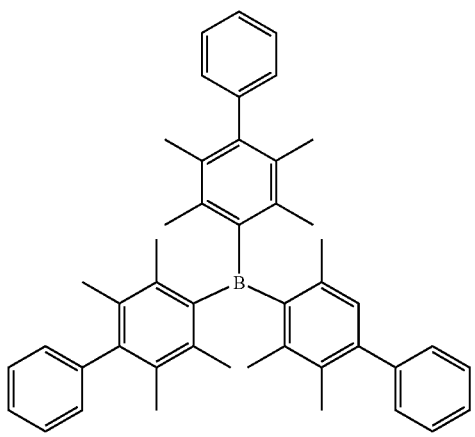

OC-27

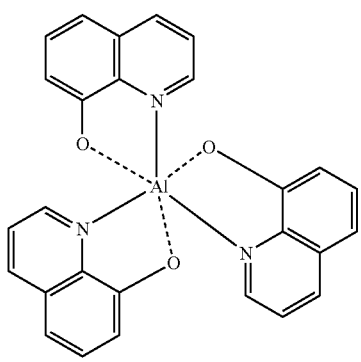

OC-28

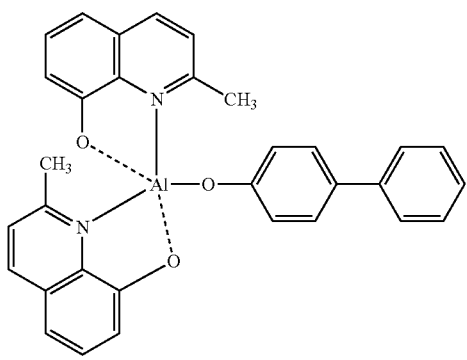

<<Light Emission Material>>

The light emission layer to be used in the light emission layer is described below.

The light emission layer to be used in the invention is a layer in which electrons and positive holes injected from the electrode, the electron transfer layer or the positive hole transfer layer are recombined to emit light, and the portion of the light emission may be either the interior of the light emission layer or the interface of the light emission layer and the adjacent layer.

The organic EL device having high light emission efficiency and long lifetime can be manufactured by using the composite of the invention, which composed of the inclusion compound and the phosphorescent light emission material included in the inclusion compound, in the light emission layer to be used in the invention.

Two principles can be cited as the reason of the light emission, one of them is an energy translation type such as that excited state of the host compound is formed by occurrence of recombination of the carriers on the host compound transferring the carrier and the energy of excited state is transferred to the phosphorescent compound to emit light, and another one is a carrier trap type such as that the phosphorescent compound acts as a carrier trap and the recombination is caused on the phosphorescent compound to emit light. In both of the cases, it is essential condition that the energy of the phosphorescent compound in the excited state is lower than that of the host compound in the excited state.

The peak wavelength of the emitted light is not specifically limited and the wavelength of the emitted light can be varied in principle by selecting the central metal, the ligand and the substituent of ligand. It is preferable that the spectrum of the emitted phosphorescent light has the maximum peak within the range of from 380 to 480 nm.

As the device emitting light having such wavelength, an organic EL device emitting blue light and that emitting white light are cited, and such devices can be operated at lower light emission voltage and lower electric consumption.

Plural kinds of light different from each other in the color can be mixed for obtaining optional color light by using plural kinds of phosphorescent compounds. Emission of white light can be made possible by controlling the kind and the doping amount of the phosphorescent compound so that the device can be applied to a lighting apparatus and backlight.

<<Host Compound>>

The host compound to be used in the invention is a compound having a phosphorescent quantum efficiency of the phosphorescent light emission of less than 0.01 at room temperature (25° C.) among the compounds contained in the light emission layer.

In the light emission layer to be used in the invention, plural kinds of known host compound may be used. By the use of plural kinds of host compound, moving of charge can be controlled so as to raise the efficiency of the organic EL device. These known host compounds are preferably ones having the positive hole transfer ability or the electron transfer ability and further capable of inhibiting shift of the wavelength of emitting light to longer side and have high glass transition temperature Tg.

Concrete examples of the host compound are those described in the following publications:

JP-A 2001-257976, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-141173, 2002-352957, 2002-203683, 2002-363227, 2002-231453, 2003-3165, 2002-234888, 2002-27048, 2002-255934, 2002-260861, 2002-280183, 2002-299060, 2002-302516, 2002-305083, 2002-305084 and 2002-308837.

The light emission layer may contain a host compound having the maximum fluorescence wavelength. In such case, light emitted from the other host compound having the maximum fluorescence wavelength can also be obtained as the electric field light emission of the organic EL device by energy transfer from the other host compound and the phosphorescent compound to the fluorescent compound. Ones having high fluorescence quantum yield in a solution state are preferable as the host compound having the maximum fluorescence wavelength. The fluorescence quantum yield is preferably not less than 10% and more preferably not less than 30%. Concrete examples of the host compound having the maximum fluorescence wavelength include a coumarin type dye, a pyran type dye, a cyanine type dye, a croconium type dye, a squalium type dye, an oxobenzanthracene type dye, a fluorescein type dye, a rhodamine type dye, a pyrylium type dye, a perylene type dye, a stilbene type dye and a polythiophene type dye. The fluorescence quantum yield can be determined by the method described in "4$^{th}$ edition, Jikkenn Kagaku Kouza (The course of experimental chemistry), 7, Spectroscopy II", p. 362, Maruzen (1992).

Figure 4:
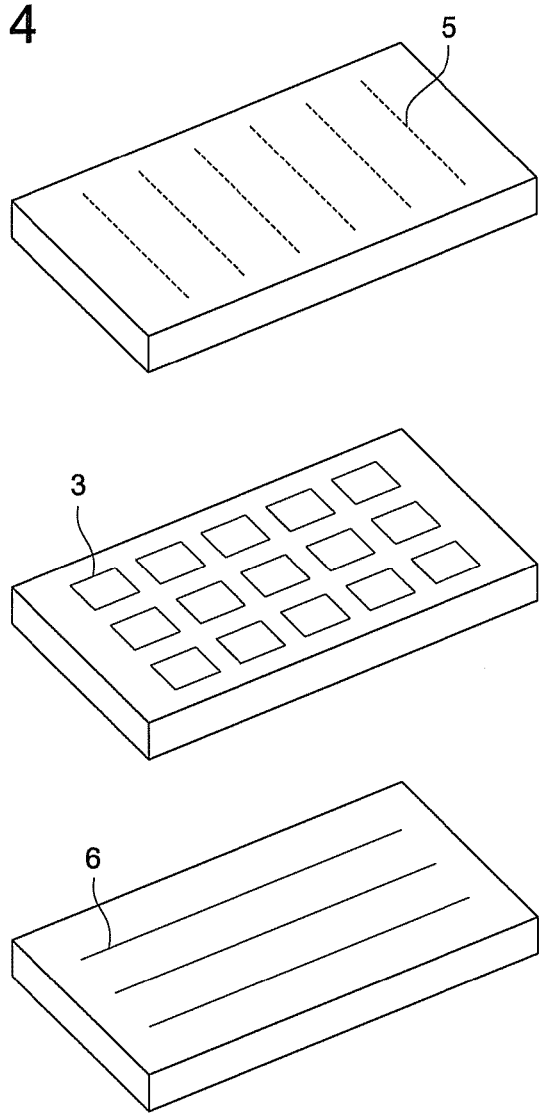
FIG. 4 is a schematic drawing of a passive matrix type full color displaying apparatus.

In the invention, color of the emitted light is determined by applying a result measured by an irradiation luminance spectrometer CS-1000, manufactured by Konica Minolta Sensing Co., Ltd., to CIE coordinate according to FIG. 4.16 on p. 108 of "Shinpen Shikisai Kagaku Handbook (New Edition, Color Science Handbook)" edit. by The Color Science Association of Japan, published by Tokyo Daigaku Shuppan Kai.

The light emission layer can be formed by making the above compounds to a thin layer by a known method such as a vacuum deposition method, a spin coat method, a casting method, A LB method and an ink-jet method. The thickness of the light emission layer is usually from 5 nm to 5 μm and preferably from 5 nm to 200 nm though the thickness is not specifically limited. The light emission layer may have a single layer structure composed of one or two or more kinds of the phosphorescent compound and the host compound or a multi-layer structure composed plural layers having the same composition or different from each other in the composition.

Concrete examples of the compound preferably used as the host compound of the light emission layer of the organic EL device of the invention are listed below, however the invention is not limited to them.

B. Host

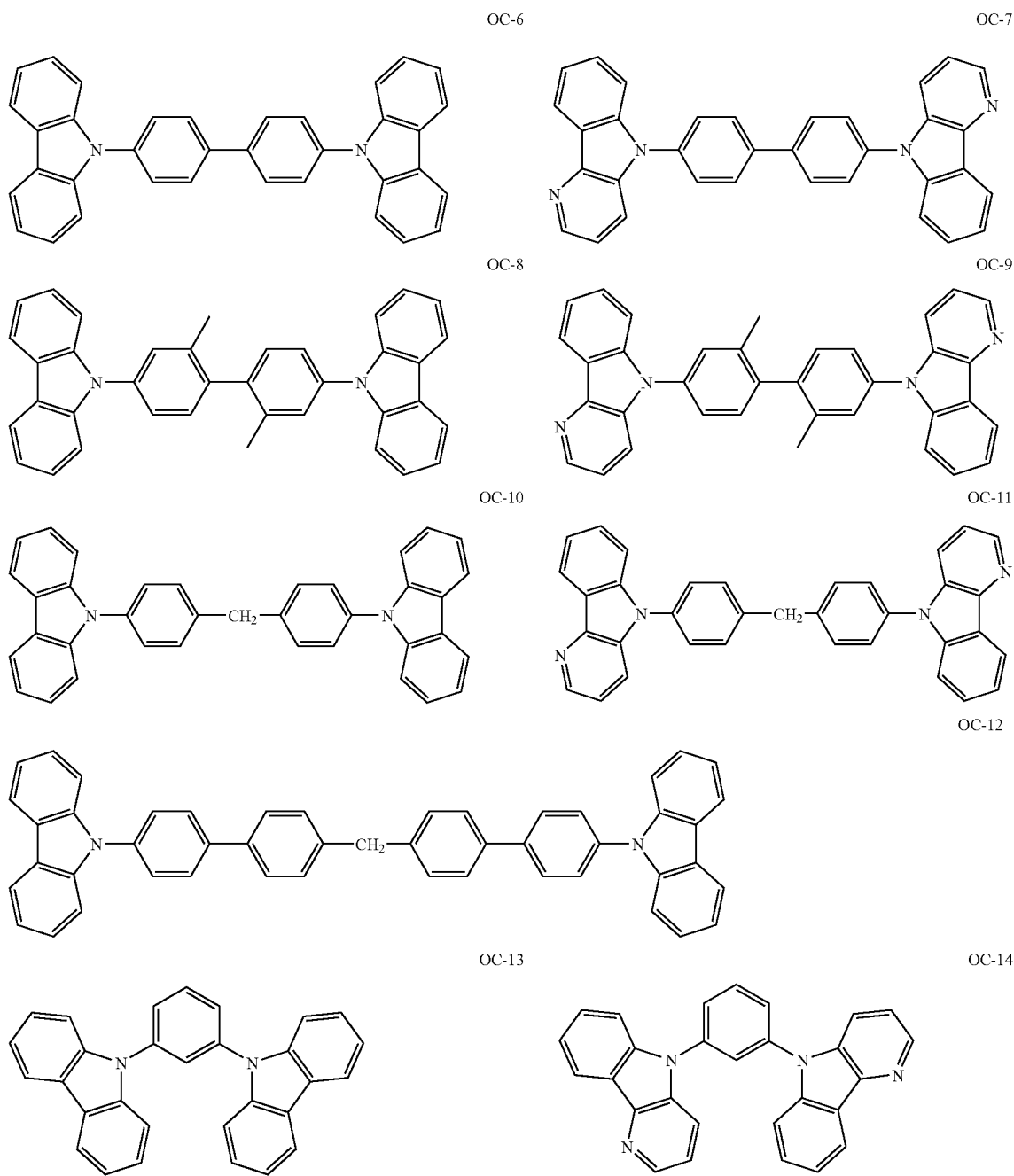

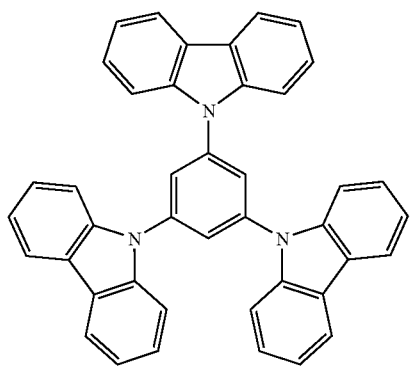

OC-15

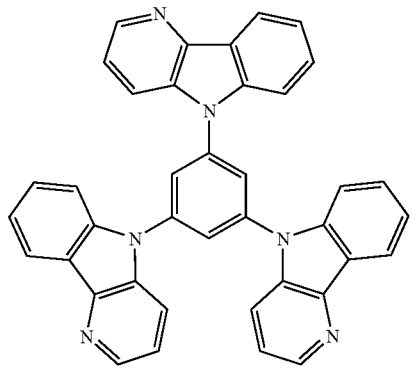

OC-16

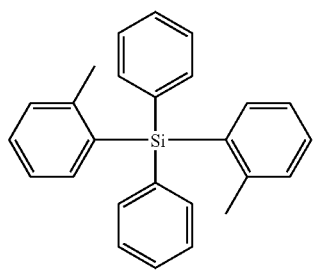

OC-17

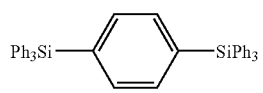

OC-18

<<Phosphorescence Emission Material (also Referred to as Phosphorescent Compound, Phosphorescent Dopant or Phosphorescence Emission Dopant)>>

The phosphorescent compound to be used in the invention is preferably ones suitably selected from the following organic metal complexes which is also referred to as phosphorescent compound.

Examples of the phosphorescent compound include the iridium complexes described in JP-A 2001-247859, compounds represented by the formulas described on pages 16 to 18 of International Publication 00/70,655 pamphlet such as tris(2-phenylpyridine)iridium, osmium complexes, and platinum complexes such as 2,3,7,8,12,13,27,18-octaethyl-21H, 23H-porphyrine platinum complex. The organic EL device having high internal quantum efficiency can be obtained by the use of such phosphorescent compound as the dopant.

A complex containing a metal included in $8^{th}$ group, $9^{th}$ group and $10^{th}$ group of the periodic table is preferably used as the phosphorescent compound to be used in the invention, and the compound is more preferably an iridium compound, an osmium compound, a platinum compound (platinum complex compound) and a rear-earth metal complex.

In the phosphorescent compound (phosphorescence emission compound) to be used in the invention, light emission from the triplet excited state is observed, and the phosphorescent quantum yield is preferably not less tan 0.001, more preferably not less than 0.01, and particularly preferably not less than 0.1, at 25° C.

The above quantum yield can be determined by the method described in "$4^{th}$ edition, Jikkenn Kagaku Kouza (The course of experimental chemistry), 7, Spectroscopy II", p. 398, Maruzen (1992). Though the phosphorescent quantum yield in the solution state can be measured by using various solvents, it is arrowed that the above phosphorescent quantum yield can be obtained in optional one of the above solvent.

Concrete examples of compound preferably usable as the phosphorescent compound (also referred to as phosphorescence emission compound or light emission dopant) to be used in the light emission layer of the invention are listed below, however the invention is not limited to them.

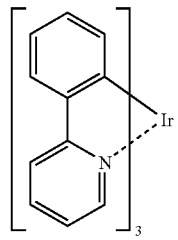

PD-1

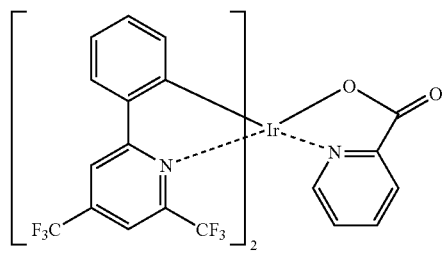

PD-2

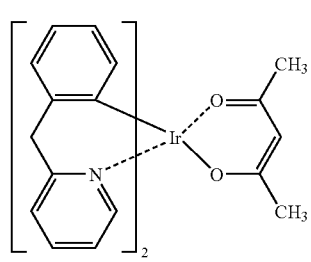

PD-3

PD-4

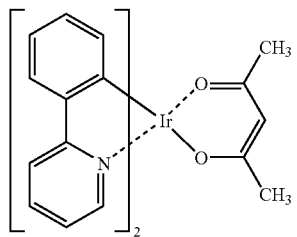

PD-5

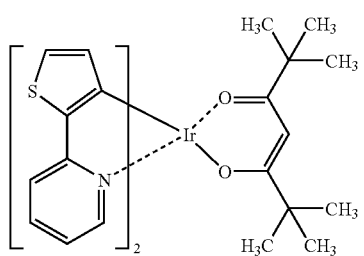

PD-6

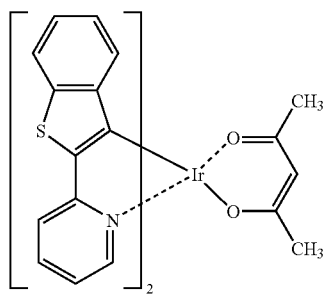

PD-7

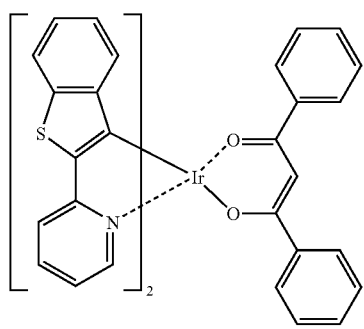

PD-8

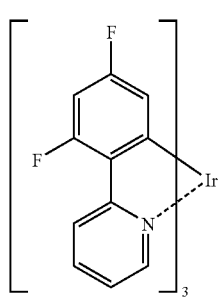

PD-9

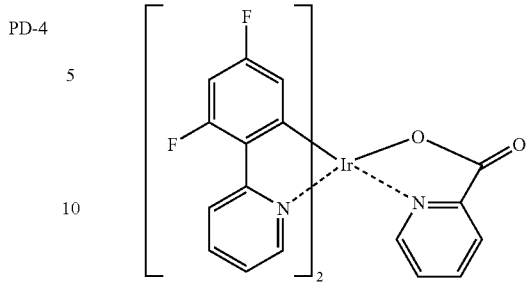

PD-10

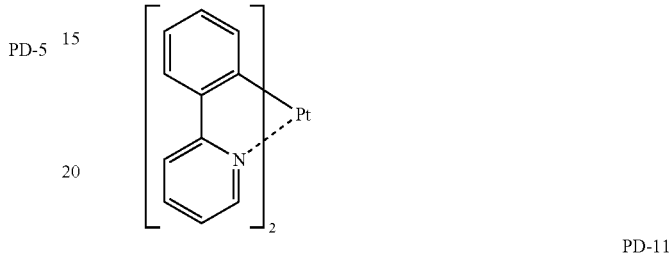

PD-11

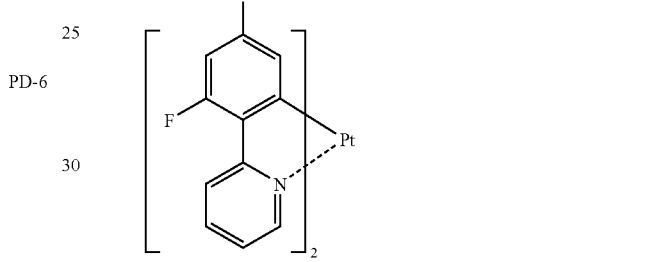

PD-12

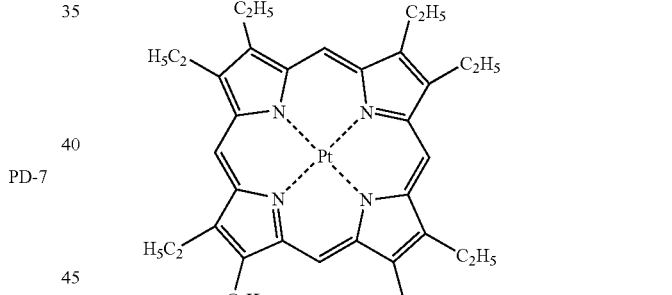

PD-13

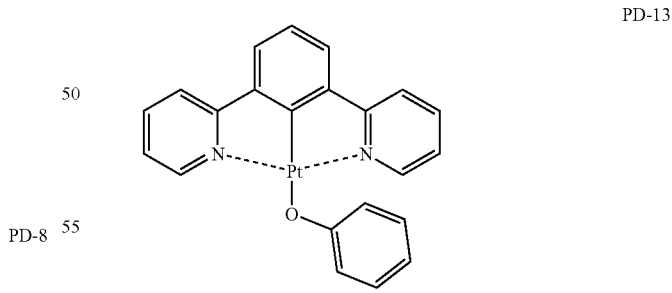

The above organic metal complexes may be used singly or in combination. These compounds can be synthesized by referring the method described in Inorg. Chem. 40, pp. 1704-1711, for example.

A blue light emission ortho metal complex as follows in which blue light emitted from the triplet excited state is preferably used as the phosphorescent compound (phosphorescence emission compound).

Moreover, a dendrimer type phosphorescence emission organic metal complex represented by Formula D can be used as the phosphorescent compound relating to the invention.

P-[(dendron)$_m$]$_n$   Formula D

In Formula D, dendron is a tree-shaped molecular represented by the following Formula E, n is an integer of more than 0 and m is an integer of more than 0 and less than n. P is a phosphorescence emission organic metal complex constituting the core.

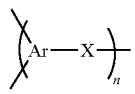

Formula E

In Formula E, Ar is a trivalent group introduced from an aromatic hydrocarbon ring or an aromatic heterocyclic ring, and X is a single bond or a divalent bonding group bonded with the phosphorescence emission organic metal complex P as the core. n is number of diverging also referred to as number of generation.

As the aromatic hydrocarbon ring represented by Ar in Formula E, a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring and anthranthrene ring are cited for example. These rings may have a substituent represented by R in Formula A As the aromatic heterocyclic ring represented by Ar in Formula E, a furan ring, a thiophene ring, an oxazole ring, a pyrrole ring, a pyridine ring, a pyridazine ring, a pyrimidine ring, a pyrazine ring, a triazine ring, a imidazole ring, a pyrazole ring, a thiazole ring, an indole ring, an indazole ring, a benzimidazole ring, a benzothiazole ring, a benzoxazole ring, a quinoxaline ring, a quinazoline ring, a cinnoline ring, a quinoline ring, an isoquinoline ring, a phthaladine ring, a naphthiridine ring, a carbazole ring, a carboline ring, a diazacarbazole ring (a ring formed by replacing one of carbon atoms of a carboline ring by a nitrogen atom) can be cited, for example.

These rings may have a substituent represented by R in Formula A.

A divalent bonding group represented by X in Formula E is synonym with the divalent bonding group represented by A in Formula A.

The concrete examples of the dendrimer represented by Formula D are listed below; the invention is not limited to them.

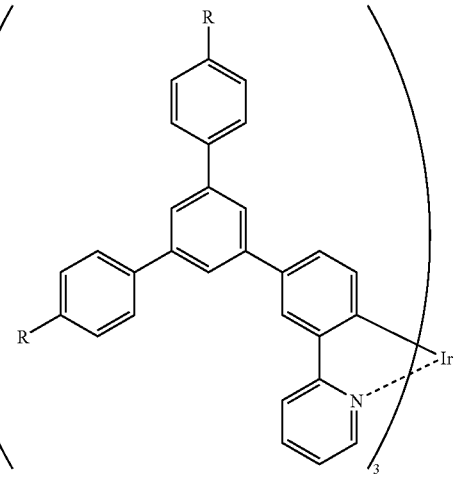

D-1

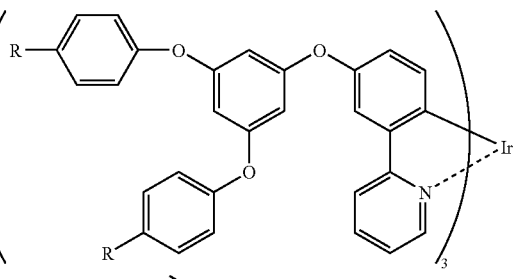

D-2

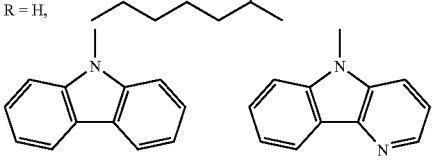

R = H,

The phosphorescent compounds to be used in the invention can be synthesized by applying the methods described in, for example, Organic Letter, 3, No. 16, pp. 2576 to 2581 (2001), Inorganic Chemistry, 30, No. 8, pp. 1685 to 1687 (1991), J. Am. Chem. Soc., 123, p. 4304 (2001), Inorganic Chemistry, 40, No. 7, pp. 1704 to 1711 (2001), Inorganic Chemistry, 41, No. 12, pp. 3055 to 3066 (2002), New Journal of Chemistry, 26, p. 1171 (2002) and the methods referred in these publications.

Other than the above, iridium complexes represented by the formulas described in, for example, J. Am. Chem. Soc. No. 123, pp. 4304 to 4312 (2001), International Publication 00/70655 pamphlet and 02/15645 pamphlet, and JP-A 2001-247859, 2001-345183, 2002-117978, 2002-170684, 2002-203678, 2002-235076, 2002-302671, 2002-324679, 2002-332291, 2002-332292 and 2002-338588, the iridium complexes described in these publications as the concrete examples and the iridium complexes represented by Formula IV described in JP-A 2002-8860 are usable.

<<Phosphorescent Dopant (also Referred to as Phosphorescence Compound)>>

A fluorescent dopant may be added into the light emission layer of the organic EL device of the invention additionally to the dopant composed of the phosphorescent compound. Typical examples of the phosphorescent dopant include a coumarin type dye, a pyrane type dye, a cyanine type dye, a chroconium type dye, a squalium type dye, an oxobenzanthracene type dye, a fluorescein type dye, a rhodamine type dye, pyrylium type dye, a perylene type dye, a stilbene type dye, a polythiophene type dye, a rear-earth complex type phosphorescent substance and another fluorescent compound.

Preferable examples of the fluorescent dopant are listed below; the invention is not limited to them.

4. Light Emission Dopant to the positive hole blocking layer forming material is that the compound has high electron mobility and low positive hole mobility and that the compound preferably has ionization potential higher than that of the light emission layer or band gap larger than that of the light emission layer for efficiently enclosing the positive hole in the light emission layer. It is effectual for enhancing the effects of the invention to use at least one of a styryl compound, a triazole derivative, a phenanthroline derivative, an oxadiazole derivative and a boron derivative as the positive hole blocking material.

FD-1

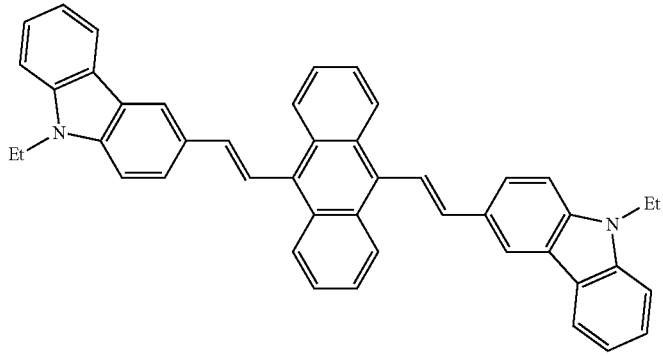

FD-2

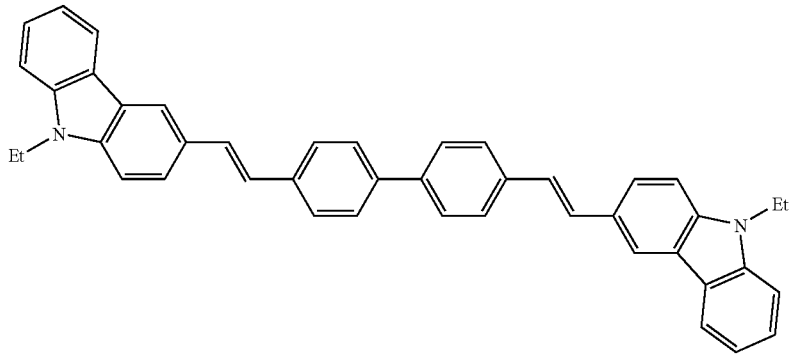

FD-3

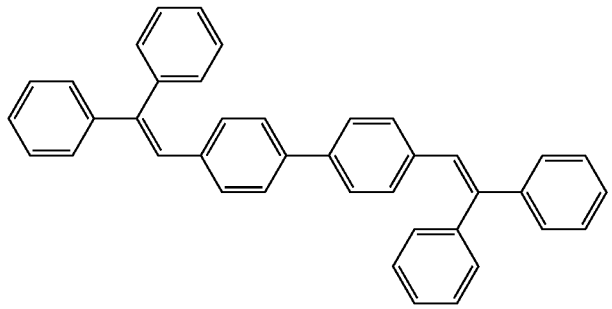

<<Blocking Layer: Positive Hole Blocking Layer and Electron Blocking Layer>>

The positive hole blocking layer is an electron transfer layer in wide meaning and comprised by a material having electron transfer ability and little positive hole transfer ability, by which the probability of recombination of the positive hole and the electron can be raised by blocking the positive hole while transferring the electron.

The positive hole blocking layer is formed by a compound by which arrival of the electron moved from the positive hole transfer layer to the cathode is blocked and the electron injected from the anode can be efficiently transferred in the direction to the light emission layer. The properties required Examples of the compound other than the above, those exemplified in JP-A 2003-31357, 2003-31368 and Japanese Patent No. 2721441 are cited.

Besides, the electron blocking layer is a positive hole transfer layer in wide meaning and comprised by a material having positive hole transfer ability and little electron transfer ability, by which the probability of recombination of the positive hole and the electron can be raised by blocking the electron while transferring the positive hole.

The positive hole blocking layer and the electron blocking layer can be formed by making the above materials to a thin layer state by a known method such as a vacuum deposition method, a spin coating method, a casting method, an ink-jet method and LB method.

<Anode>>

The anode in the organic EL device is preferably one composed of a metal, an alloy, an electroconductive compound or a mixture thereof each having a large work function of not less than 4 eV. The concrete examples of such electrode material include transparent electroconductive material such as a metal such as Au, CuI, indium tin oxide (ITO), $SnO_2$ and ZnO. Moreover, an amorphous substance capable of forming a transparent electroconductive layer such as IDIXO ($In_2O_3$—ZnO) is also usable. The anode is formed by forming a thin layer of such material by a method such as vapor deposition and spattering. The desired pattern of the anode may be formed by photolithography. When so high pattern precision of not less than 100 μm is not necessary, the pattern may be formed by using a mask on the occasion of the vapor deposition or spattering of the electrode material. When light is output through the anode, the transparency of the anode is preferably not less than 10%, and the sheet resistivity of the anode is preferably not more than several hundreds ohms per square meter. The thickness of the anode is usually from 10 nm to 1,000 nm and preferably from 10 nm to 200 nm though the thickness is varied depending on the kind of material.

<<Cathode>>

In the cathode, a metal referred to as electron injection-metal, an alloy, an electroconductive compound and a mixture thereof each having low working function such as not more than 4 eV is used as the electrode material. Concrete examples of the electrode material include sodium, potassium, a potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and a rear-earth metal. Among them a mixture of the electron injection metal and a second metal having a high working function and stable such as the magnesium/silver mixture, magnesium/aluminum mixture, magnesium/indium mixture, aluminum/aluminum oxide ($Al_2O_3$) mixture and lithium/aluminum mixture, and aluminum are suitable from the viewpoint of electron injection ability and durability against oxidation.

The cathode can be formed by making such electrode material to a thin layer by a method such as vapor deposition and spattering. The sheet resistivity of the cathode is preferably not more than several hundreds ohms per square meter and the thickness is usually from 10 nm to 6 μm and preferably from 50 nm to 200 nm. It is suitable for raising the luminance of emitted light that at least one of the anode and cathode of the organic EL device is transparent or semitransparent for permeating emitted light.

A transparent or semitransparent cathode can be prepared by forming a layer of the electroconductive material described in the description of the anode on a previously prepared layer of the above described metal having a thickness of from 1 nm to 20 nm, and a device having transparent anode and transparent cathode can be manufactured by applying such electrode.

<<Method for Forming Electrode by Coating>>

The method for forming the electrode relating to the invention such as anode and cathode is described below.

The electrode is frequently formed by spattering of indium tin oxide (ITO) or vacuum deposition of metal such as aluminum and calcium. As the method for forming the anode and cathode by the coating (solution coating or dispersion coating) relating to the invention, a method for making the electrode by the PEDOT derivative described in Tokuhyo 2005-501373 and U.S. Pat. No. 5,035,926, a technology for forming a transparent electrode by coating and heating treatment of the fine particles of a metal such as indium, tin, antimony, aluminum and zinc described in JP-A 2005-183054 and a method for forming a circuit by coating an electroconductive past such as a silver paste described in JP-A 2002-324966 are disclosed. Such methods can be applied.

The injection layer, blocking layer and electron transfer layer to be used as the constitution layer of the organic EL device of the invention are described.

<<Buffer Layer>>: Anode Buffer Layer and Cathode Buffer Layer

An injection layer is provided according to necessity, and the buffer layer includes the cathode buffer layer, the electron injection layer and the node buffer layer and the positive hole injection layer, and each may be provided between the anode and the light emission layer or positive hole transfer layer and between the cathode and the light emission layer or the electron transfer layer, respectively.

The buffer layer is a layer provided between the electrode and the organic compound layer for lowering the driving voltage and raising the emitting light luminance, which is described in detail on pp. 123 to 166, Chapter 2 of Section 2 "Electrode material" of "Yuuki EL Soshi to sono Kogyoka Saizensen (organic EL element and Forefront of Industrialization of it)" NTS Co., Ltd., ($30^{th}$ Nov. 1998) and the buffer layer includes the anode buffer and the cathode buffer layer.

The anode buffer (positive hole injection layer) is described in detail in JP-A 9-45479, 9-260062 and 8-288069, and a phthalocyanine buffer layer typified by copper phthalocyanine, an oxide buffer layer typified by vanadium oxide, an amorphous carbon layer, and a polymer buffer layer using an electroconductive polymer such as polyaniline (Emeraldine) and polythiophene are cited as concrete examples.

Among the above, the oxide buffer layer containing the vanadium oxide as the principal component is defined as the inorganic compound layer for example.

The cathode buffer layer (electron injection layer) is also described in detail in JP-A 6-325871, 9-17574 and 10-74586, and a metal buffer layer typified by strontium and aluminum, an alkali metal compound buffer typified by lithium fluoride, an alkali-earth metal compound buffer typified by magnesium fluoride, and an oxide buffer layer typified by aluminum oxide are cited as concrete examples. The buffer layer (injection layer) is desirably a very thin layer and the thickness is preferably from 0.1 nm to 5 μm though the thickness is varied according to the material.

Among the above-described, the metal buffer layer typified by strontium and aluminum, the alkali compound buffer typified by lithium fluoride, the alkali-earth metal compound buffer layer typified by magnesium fluoride and the oxide buffer layer typified by aluminum oxide are the inorganic compound layer relating to the invention.

<<Substrate (Also Called as Base Plate, Substrate Material and Support)>>

As the preferably used substrate, glass, quartz and light permeable plastic film are cited though the kind of the material such as glass and plastics of the substrate is not specifically limited as long as the material is transparent. Particularly preferred substrate is a resin film which can provide flexibility to the organic EL device.

Examples of the resin film include a film of polyethylene phthalate (PET), polyethylene naphthalate (PEN), polyethersulfone (PES), polyetherimide, polyetheretherketone, polyphenylenesulfide, polyallylate, polyimide, polycarbonate (PC), cellulose triacetate (TAC) and cellulose acetate propionate. An inorganic substance layer, an organic substance layer or a hybrid layer thereof may be provided on the surface of the resin film.

The external efficiency at room temperature of the organic EL device is preferably not less than 1% and more preferably not less than 5%. The external quantum efficiency is as follows:

External quantum efficiency=Photon number output to the exterior of organic EL device/Number of electron flowed in the organic EL device×100

A color improving filter such as a color filter and a color conversion filter for conversing light emitted from the organic EL device to multicolor may be applied. When the color conversion filter is used, the λmax of the light emitted from the organic EL device is preferably not more than 480 nm.

<<Organic EL Device Material Necessary for Constituting Layer of Organic EL Device>>

Compounds suitably applied as the constituting material of the constituting layer of the organic EL element of the invention are concretely described below. The following compounds can be used in any of the organic compound layers of the invention in a region in which the material does not influence on the properties of the organic EL device.

(Vinyl Monomer)

A vinyl monomer represented by the following Formula 1 can be used; the invention is not limited to that.

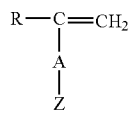

Formula 1

R in Formula (I) represents a hydrogen atom or a methyl group. A is a divalent bonding group or a single bond. Z is a residue of a fluorescent compound or a phosphorescent compound (or called a phosphorescent emitting compound residue).

In Formula 1, the divalent bonding group represented by A may be a hydrocarbon group such as an alkylene group, an alkenylene group, an alkynylene group and an arylene group, or the alkylene group, alkenylene group, alkynylene group or arylene group each containing a hetero atom such as a nitrogen atom, a sulfur atom or a silicon atom, or a group derived from a compound having an aromatic heterocyclic ring, which are also referred to as hetero aromatic compound, such as thiophene-2,5-di-yl group and pyrazine-2,3-di-yl group, or may be a chalcogen atom such as an oxygen atom and a sulfur atom. The divalent bonding group may be also a group bonded through a hetero atom such as an alkylimino group, a dislkylsilane-di-yl group and a diarylgermane-di-yl group.

Furthermore, a divalent group derived from a aromatic heterocyclic ring such as a carbazole ring, a carboline ring, a diazacarbazole ring which is a ring formed by replacing one of the carbon atoms constituting the carboline ring by a nitrogen atom and is also called as a monoazacarboline ring, a triazole ring, a pyrrole ring, a pyridine ring, a pyrazine ring, a quinoxaline ring, a thiophene ring, an oxadiazole ring, a dibenzofuran ring, a dibenzothiophen ring and an indole ring can be cited as the divalent represented by A.

The compound represented by Formula A may have a substituent represented by R.

As the fluorescent compound to be used for the fluorescent compound residue in Formula 1, the compounds described as the foregoing fluorescent dopant (also referred to as fluorescent light emission compound), a rear-earth metal complex and another fluorescent compound can be cited.

As the phosphorescent compound to be used for the phosphorescent compound residue in Formula 1, the organic phosphorescent compounds described as the foregoing phosphorescent compound and compounds described in known publications are usable.

Concrete examples of the vinyl monomer usable in the invention are listed below but the invention is not limited to them.

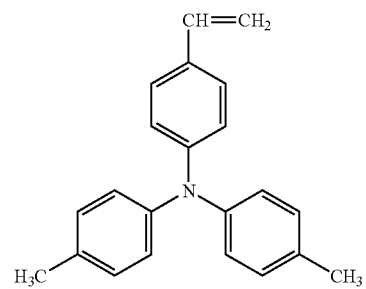

VM-1

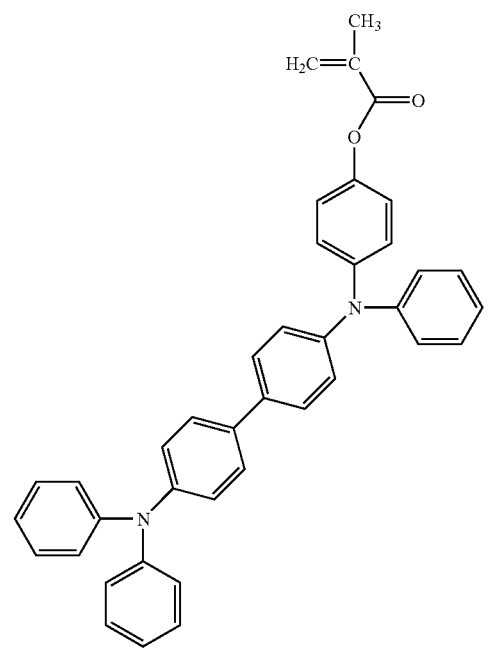

VM-2

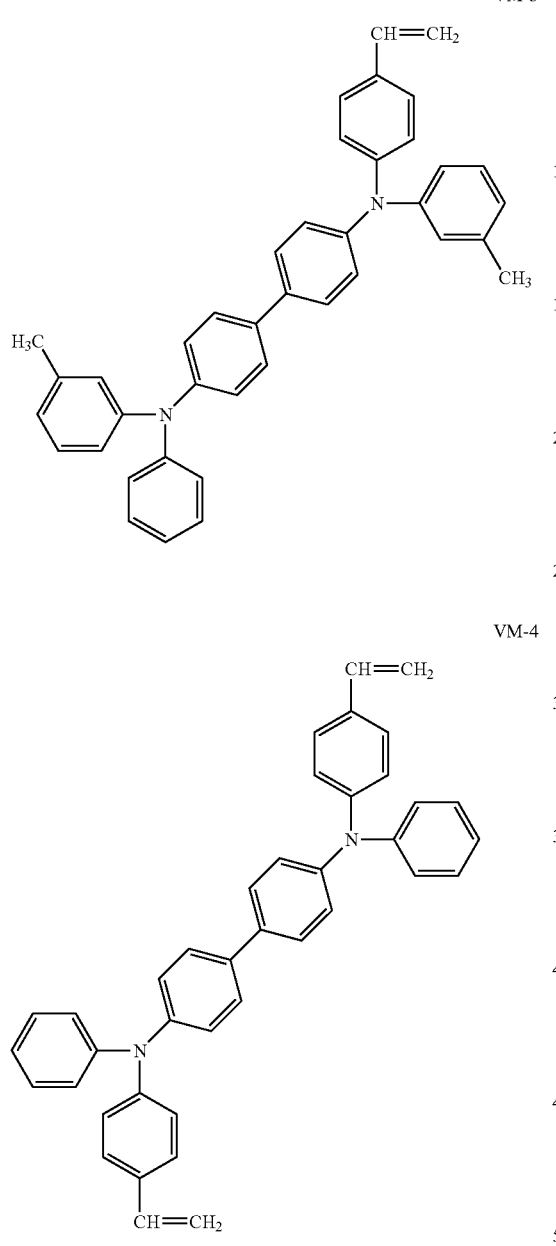
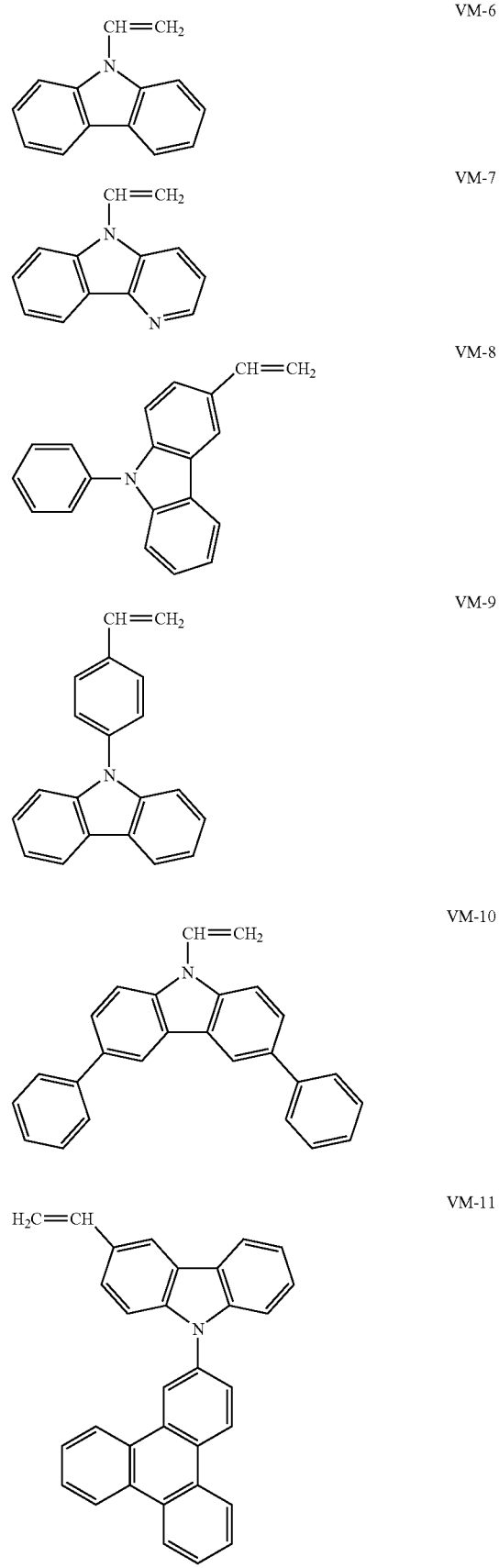

VM-12
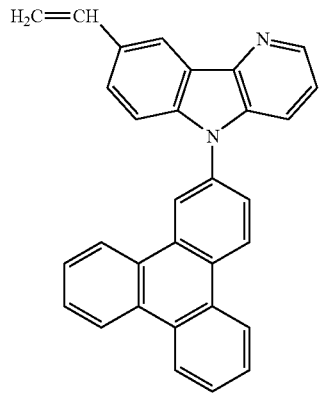
VM-13
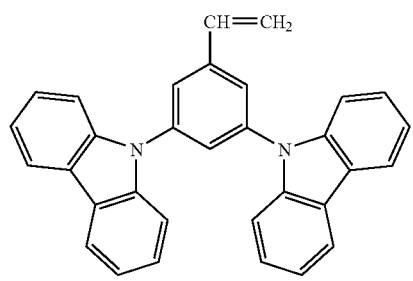
VM-14
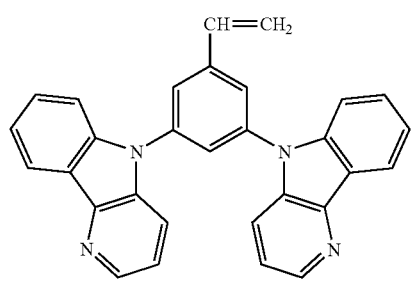
VM-15
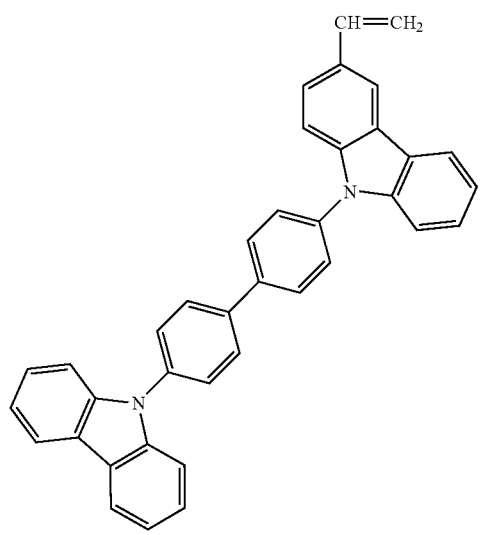
VM-16
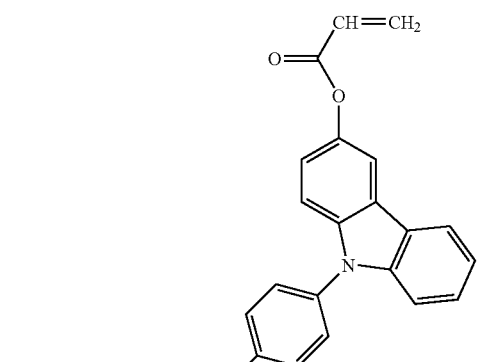
VM-17
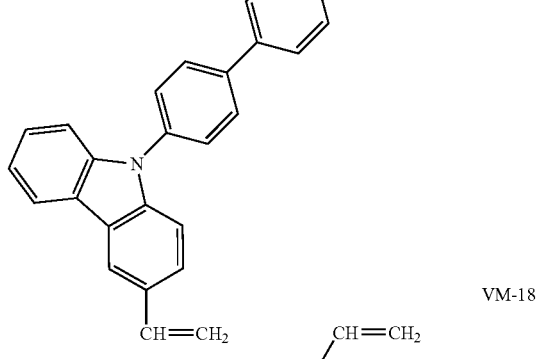
VM-18
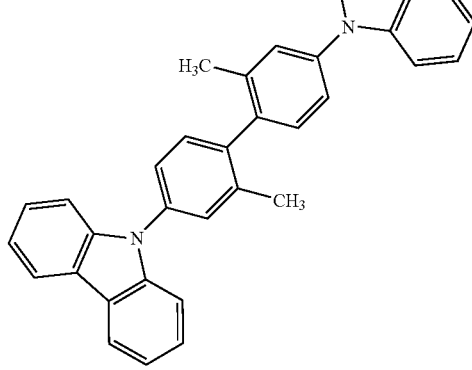

VM-19
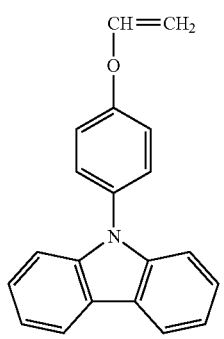
VM-20
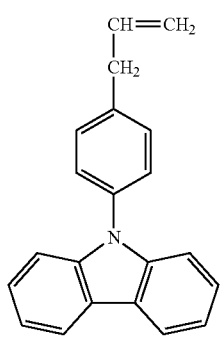
VM-21
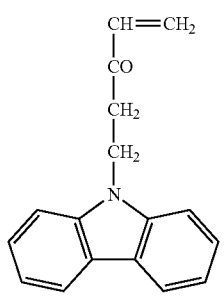
VM-22
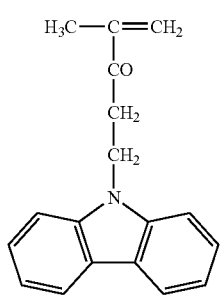
VM-23
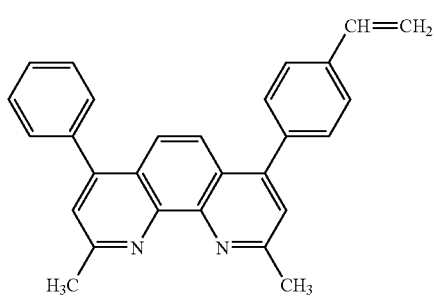
VM-24
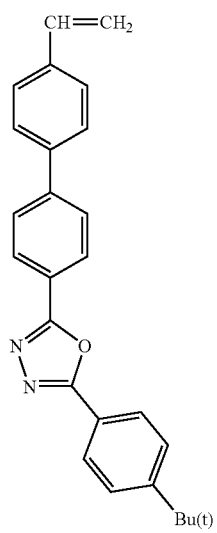
VM-25
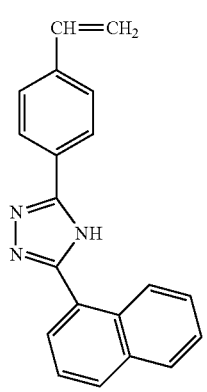
VM-26
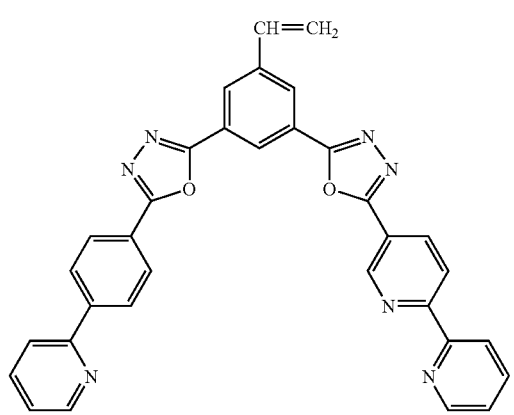

VM-27
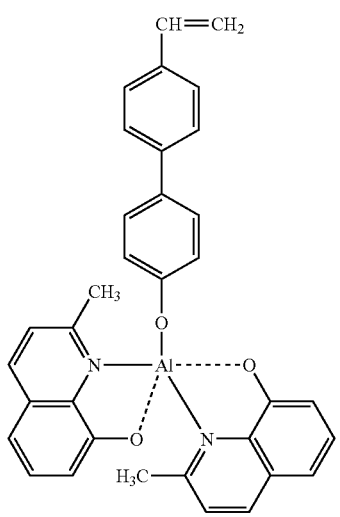

VM-28
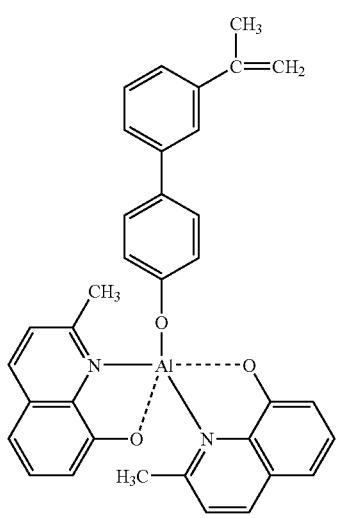

VM-29
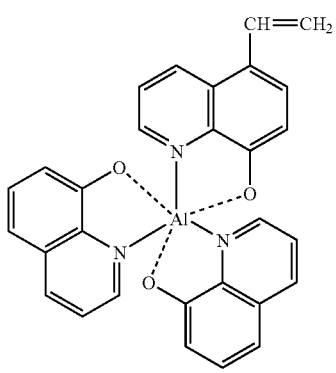

VM-30
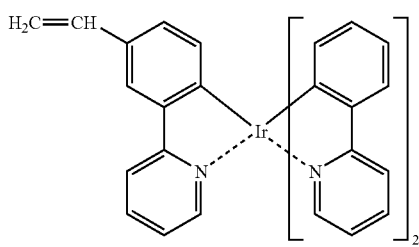

VM-31
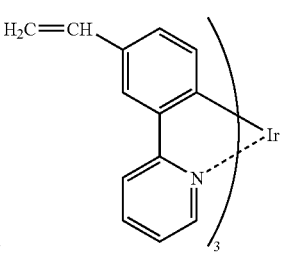

(Vinyl Polymer)

Compounds having a repeating unit represented by the following Formula 2 can be used as a polyvinyl polymer usable in the invention. The polymer may be a homopolymer or a copolymer with another polymerizable monomer.

Formula 2
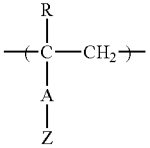

In Formula 2, R is a hydrogen atom or a methyl group, and A is a divalent bonding group or a single bond. Z is a fluorescent compound residue or a phosphorescent compound residue which is also referred to as a phosphorescence emission compound residue and may have an organic metal complex in the molecular structure thereof.

The divalent bonding group represented by A in Formula 2 is synonymous with the divalent bonding group represented by A in Formula 1.

The phosphorescent compound residue and the phosphorescent compound residue represented by Z in Formula 2 are each synonymous with the phosphorescent compound residue and the phosphorescent compound residue represented by Z in Formula 1, respectively.

Examples of the copolymerizable monomer include methacrylic acid and its ester derivatives such as methyl methacrylate, ethyl methacrylate, propyl methacrylate, butyl methacrylate, i-butyl methacrylate, t-butyl methacrylate, octyl methacrylate, cyclohexyl methacrylate, 2-hydroxyethyl methacrylate, 2-hydroxypropyl methacrylate, tetrahydrofurfuryl methacrylate, benzyl methacrylate, dimethylaminoethyl methacrylate and diethylaminoethyl methacrylate; acrylic acid and its ester derivatives such as methyl acrylate, ethyl acrylate, propyl acrylate, butyl acrylate, i-butyl acrylate, t-butyl acrylate, octyl acrylate, cyclohexyl acrylate, 2-hydroxyethyl acrylate, 2-hydroxypropyl acrylate, tetrahydrofurfuryl acrylate, 2-ethoxyethyl acrylate, siethyleneglycolethoxylate acrylate, 3-methoxybutyl acrylate, benzyl acrylate, dimethylaminoethyl acrylate and diethylaminoethyl acrylate; an alkyl vinyl ether such as methyl vinyl ether, ethyl vinyl ether and butyl vinylether; an alkyl vinyl ester such as vinyl formate, vinyl acetate, vinyl butylate, vinyl capronate and vinyl stearate; acrylonitrile; vinyl chloride and styrene.

Concrete examples of vinyl polymer usable in the invention are listed below but the invention is not limited to them.

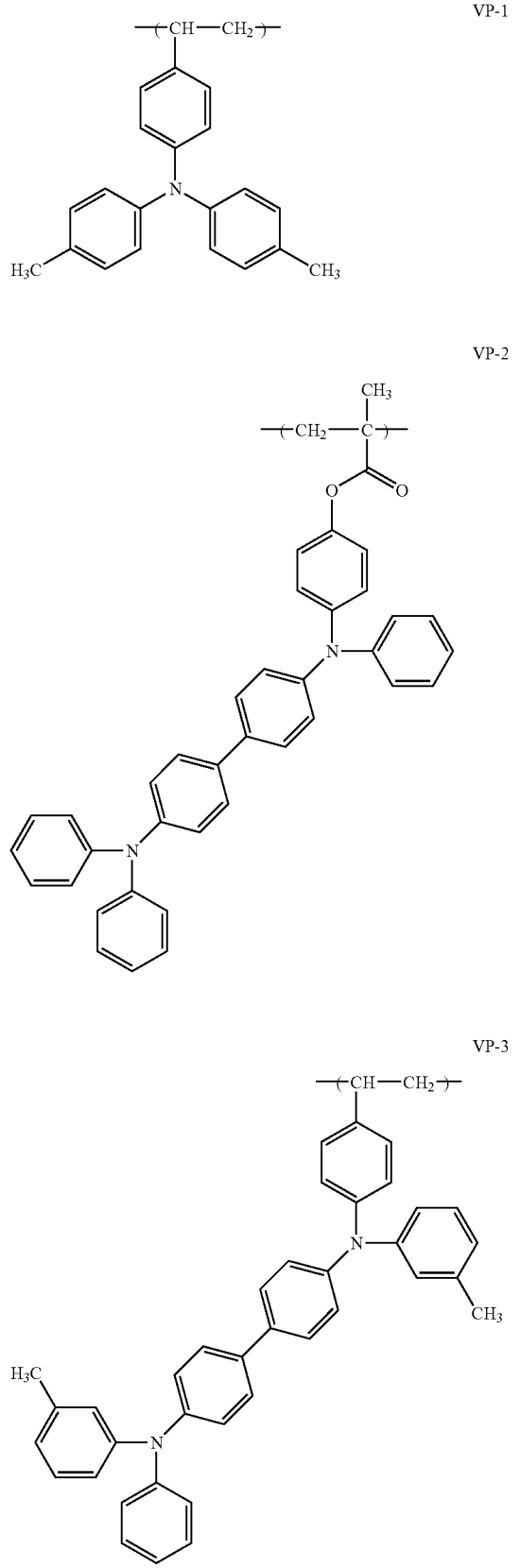
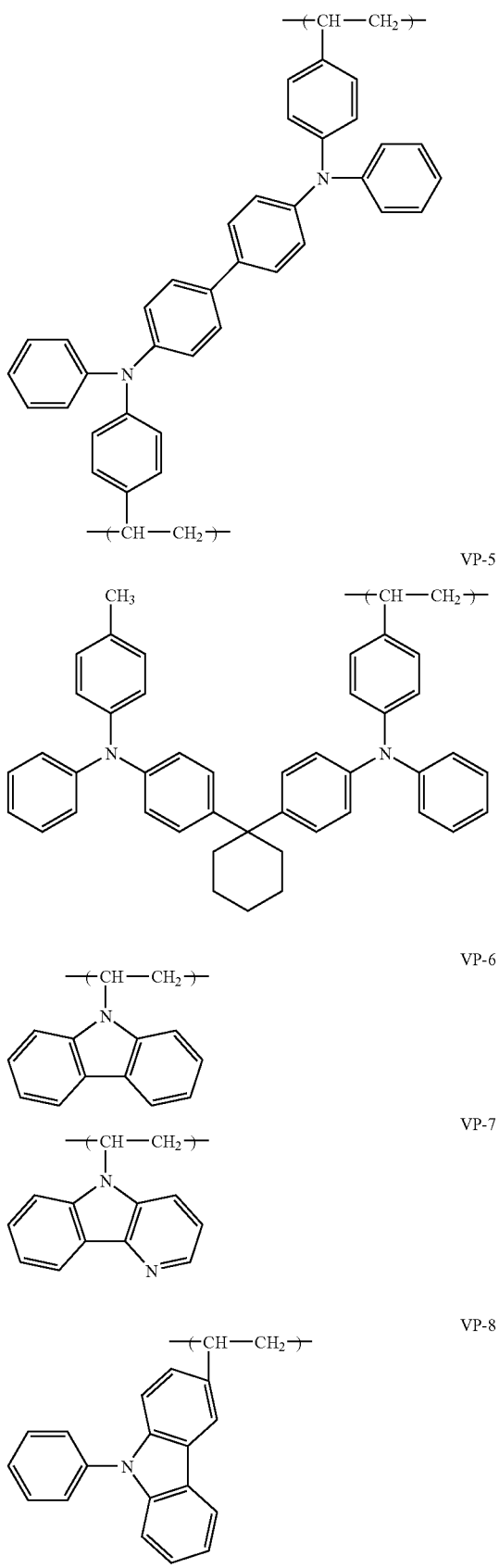

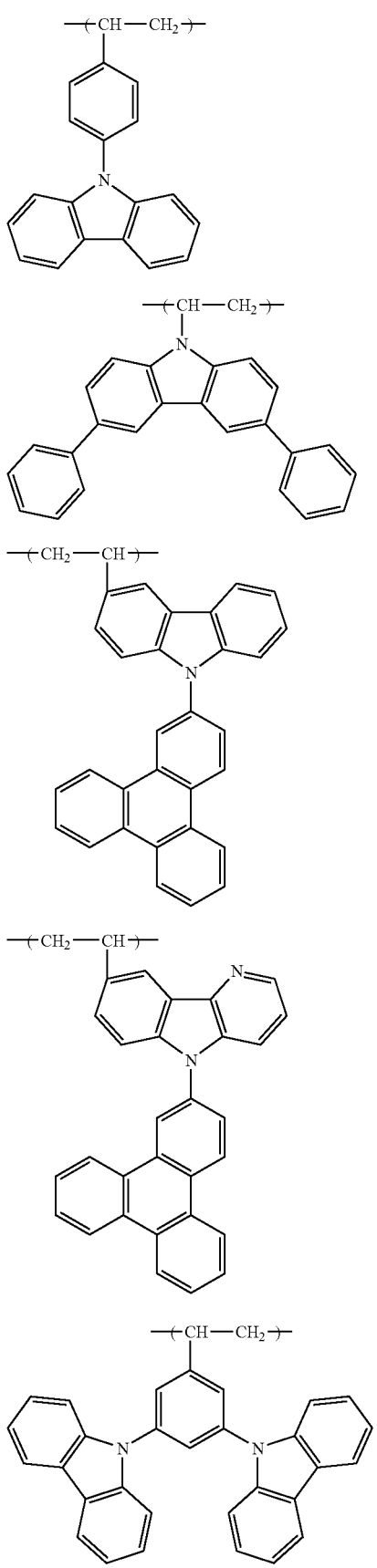
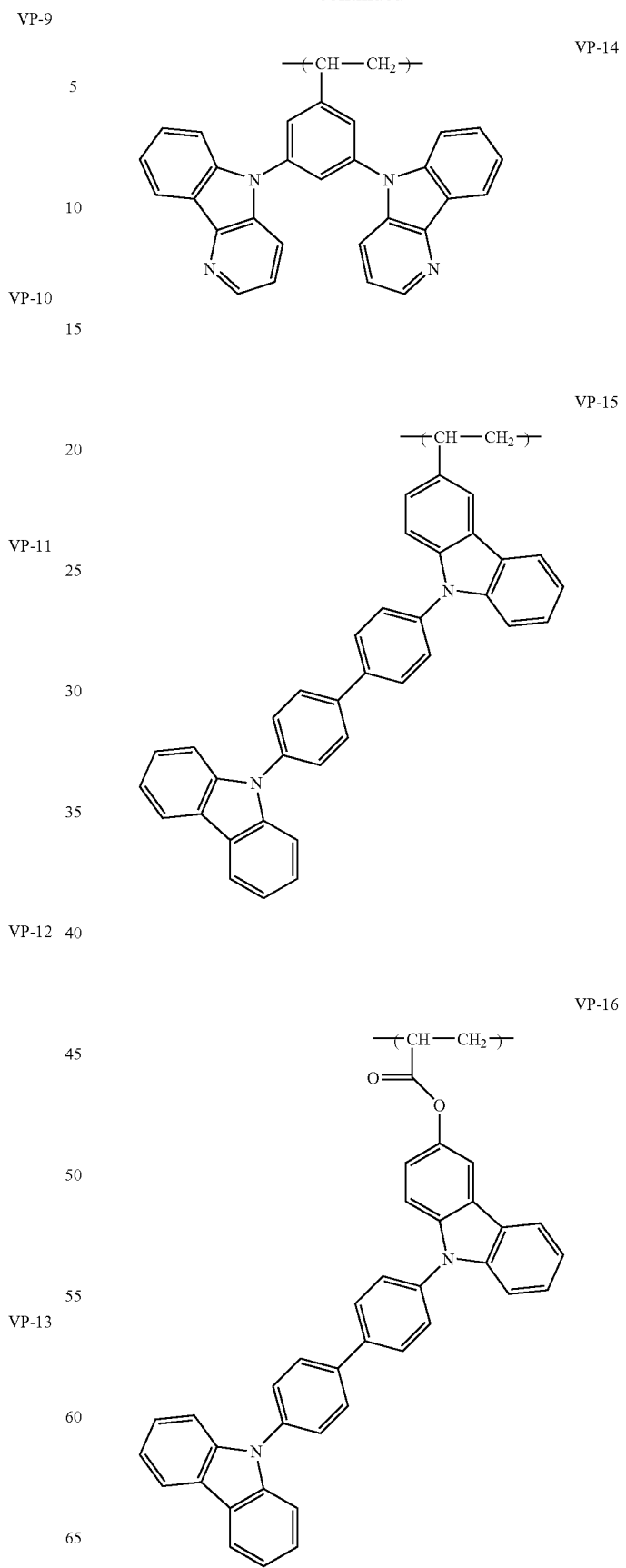

-continued
VP-17
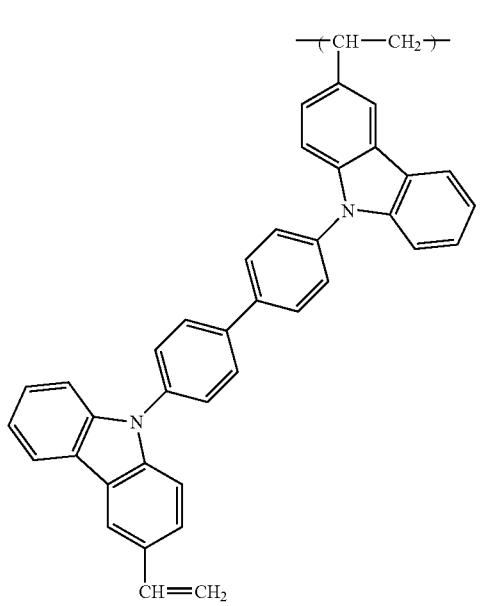
VP-18
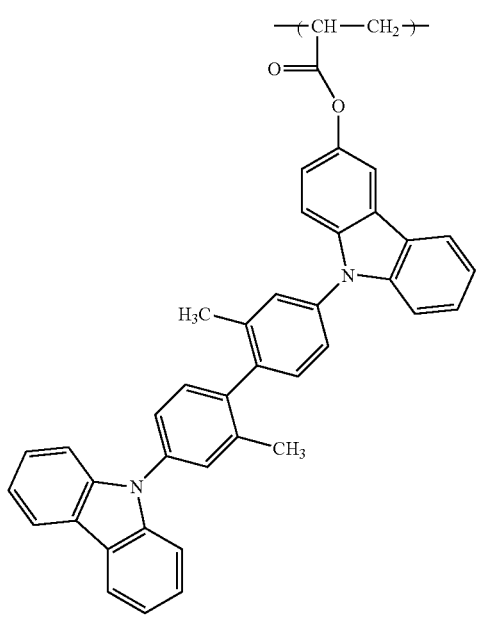
VP-19
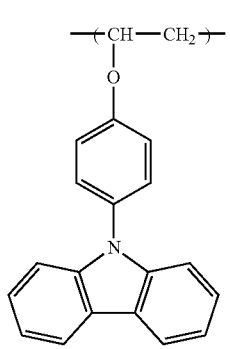
VP-20
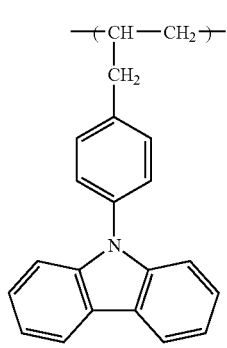
VP-21
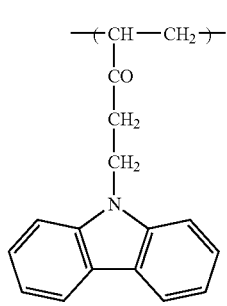
VP-22
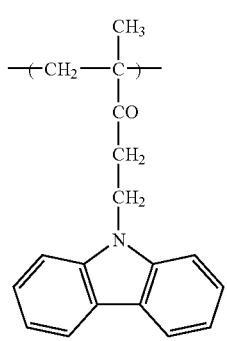
VP-23
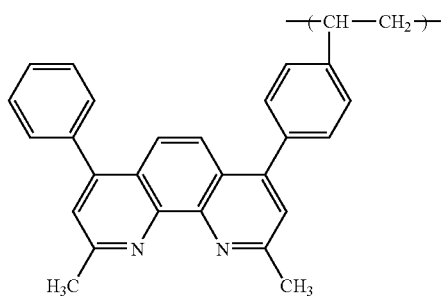

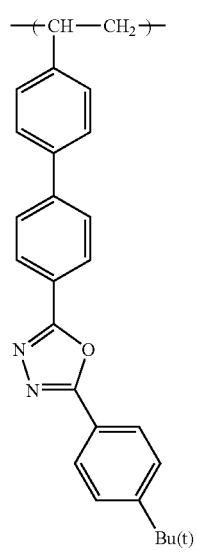 VP-24
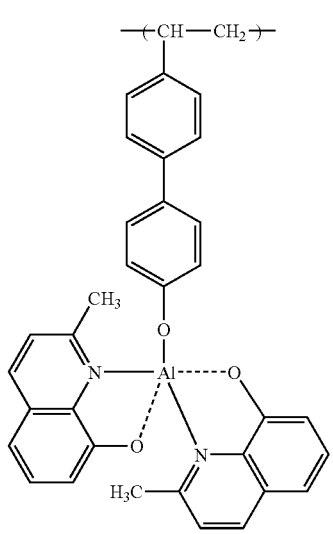 VP-27
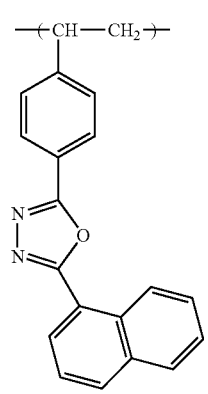 VP-25
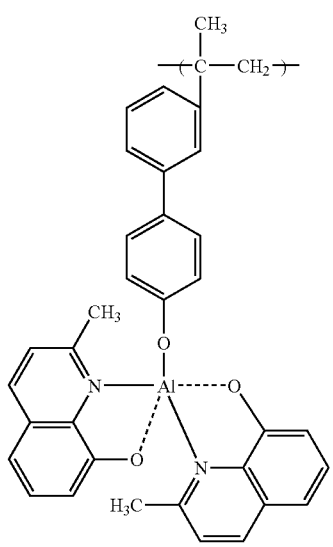 VP-28
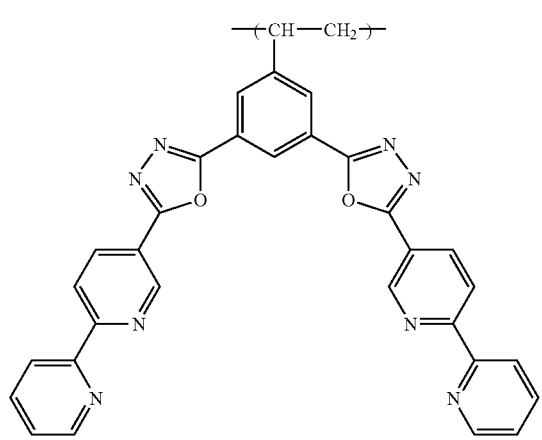 VP-26
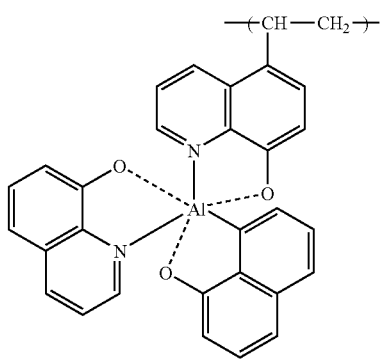 VP-29

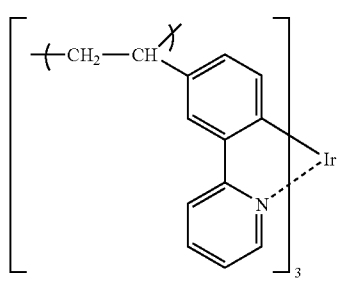

VP-30

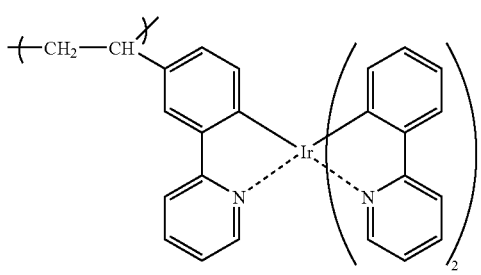

VP-31

(Condensation Polymer)

As a condensation polymer usable in the invention, compounds represented by the following Formula 3 but the invention is not limited to them.

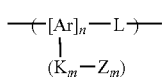

Formula 3

In Formula 3, [Ar]$_n$ is an aromatic hydrocarbon ring or an aromatic heterocyclic ring each having n substitutable positions. Z is a fluorescent compound residue or a phosphorescent compound residue and m of which bond with m positions among n of the substitutable positions through K. K is a divalent bonding group or a single bond. N is an integer for from 1 to 3 and m is an integer of from 1 to n. When the number of each of Z and K is plural, they may be independently the same or different. L is a divalent bonding group selected from the group of bonding groups 1.

As the aromatic hydrocarbon ring represented by Ar in Formula 3, a benzene ring, a biphenyl ring, a naphthalene ring, an azulene ring, an anthracene ring, a phenanthrene ring, a pyrene ring, a chrysene ring, a naphthacene ring, a triphenylene ring, an O-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a picene ring, a pyrene ring, a pyranthrene ring and anthranthrene ring can be cited; these rings each may have a substituent represented by R in Formula A.

As the aromatic heterocyclic ring represented by Ar in Formula 3, for example, a furan ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzothiazole ring, a benzoxazole ring, a quinoxaline ring, a quinazoline ring, cinnoline ring, a quinoline, an isoquinoline ring, a phthaladine ring, a naphthiridine ring, a carbazole ring, a carboline ring and a diazacarbazole ring which is a ring formed by replacing one of the carbon atoms constituting the carboline ring by a nitrogen atom are cited.

These rings each may have a substituent represented by R in Formula A.

The divalent bonding group represented by K in Formula 3 is synonymous with the divalent bonding group represented by A in Formula 1.

The phosphorescent compound residue and the phosphorescent compound residue represented by Z in Formula 3 are each synonymous with the phosphorescent compound residue and the phosphorescent compound residue represented by Z in Formula 1, respectively.

The divalent bonding group represented by L in Formula 3 is selected from the following Group 1 of bonding groups.

Group of Bonding Groups 1

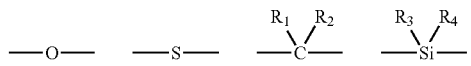

In the above Group 1 of the bonding groups, $R_1$ to $R_4$ are each an alkyl group, an aromatic hydrocarbon group or an aromatic heterocyclic group.

As the alkyl group represented by $R_1$ to $R_3$ in the Group 1 of bonding groups, a methyl group, an ethyl group, a propyl group, an isopropyl group, a tert-butyl group, a pentyl group, a hexyl group, an octyl group, a dodecyl group, a tridecyl group and a pentadecyl group are cited for example. These groups may have a substituent represented by R in Formula A.

As the aromatic hydrocarbon group represented by $R_1$ to $R_3$ in the Group 1 of bonding groups, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenylyl group can be cited for example.

These groups may have a substituent represented by R in Formula A.

As the aromatic heterocyclic group represented by $R_1$ to $R_3$ in the Group 1 of bonding groups, a pyridyl group, a pyrimidinyl group, a furyl group, a pyrrolyl group, an imidazolyl group, a benzimidazolyl group, a pyrazolyl group, a benzimidazolyl group, a pyrazolyl group, a pyradinyl group, a triazolyl group such as 1,2,4-triazole-1-yl group and 1,2,3-triazole-1-yl group, an oxazolyl group, a benzoxazolyl group, a thiazolyl group, an iso-oxazolyl group, an iso-thiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinly group, a diazacarbazolyl group which is a group formed by replacing one of carbon atoms of a carboline ring of carbonyl group by a nitrogen atom, a quinoxalinyl group, a pyridazinyl group, a triazinyl group, quinazolinyl group and phthalazinyl group can be cited.

These groups may have a substituent represented by R in Formula A.

Concrete examples of condensation polymer represented by Formula 3 are listed below but the invention is not limited to them.

CP-1
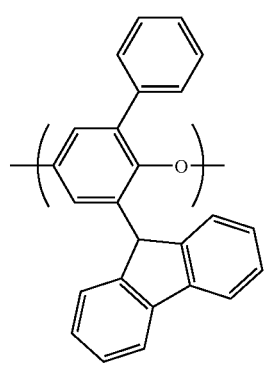
CP-2
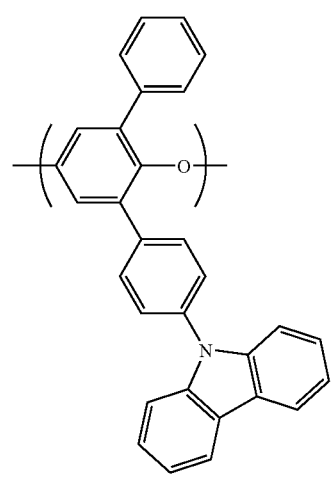
CP-3
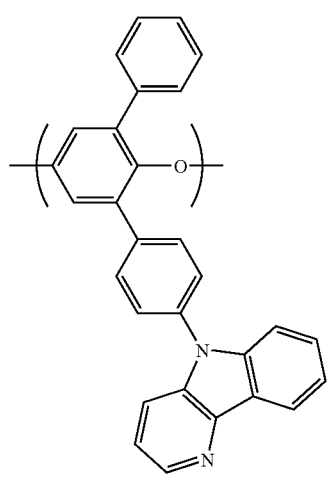
CP-4
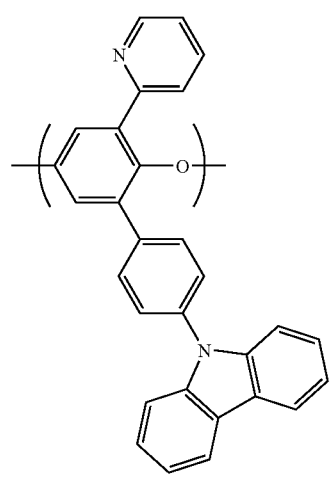
CP-5
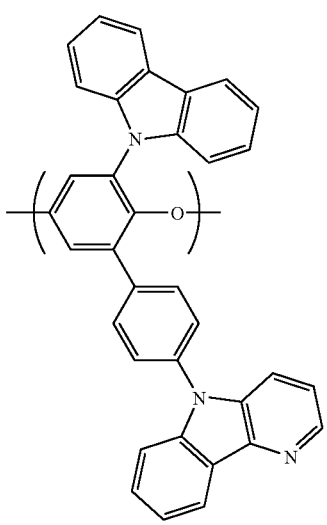
CP-6
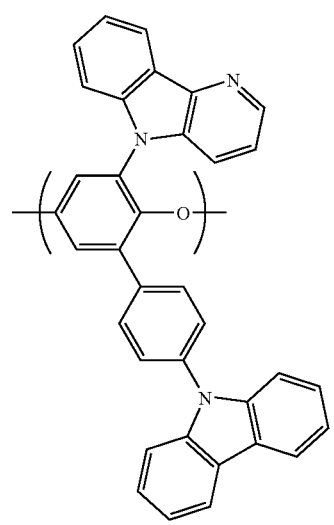

-continued
CP-7
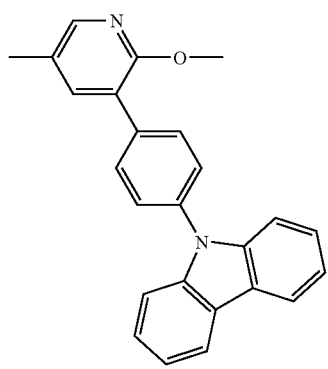
CP-8
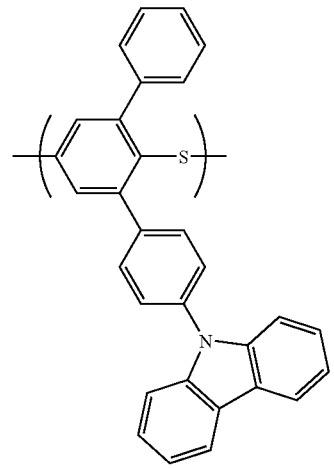
CP-9
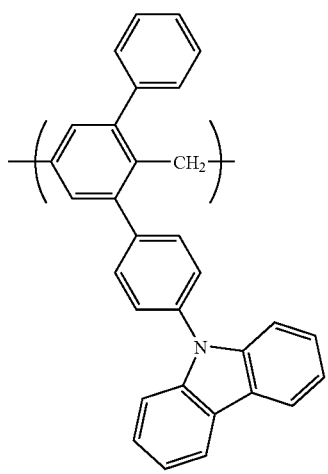
CP-10
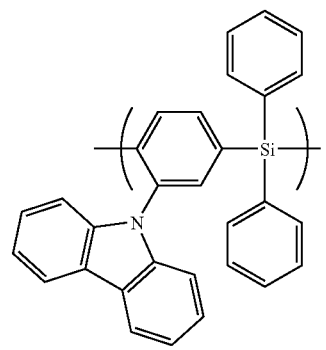
CP-11
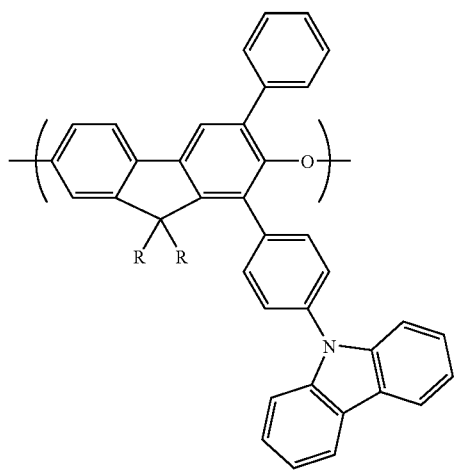
R: 2-ethylhexyl group Others

CP-12

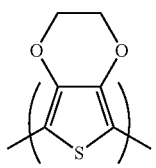

CP-13

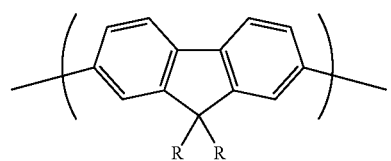

R: 2-ethylhexyl group or octyl group

CP-14

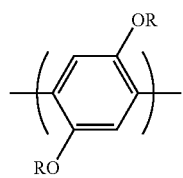

R: 2-ethylhexyl group or octyl group

CP-15

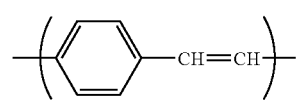

CP-16

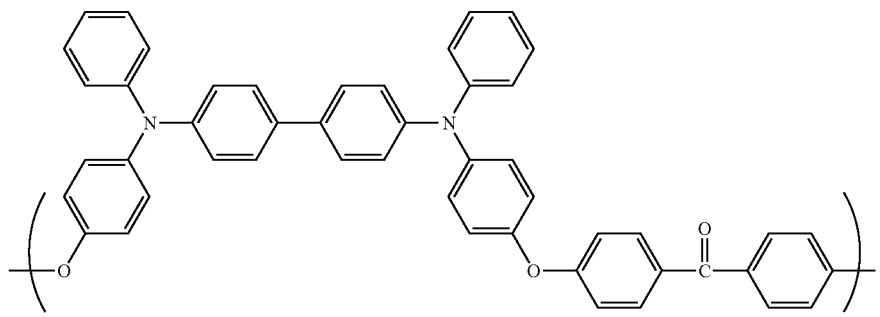

CP-17

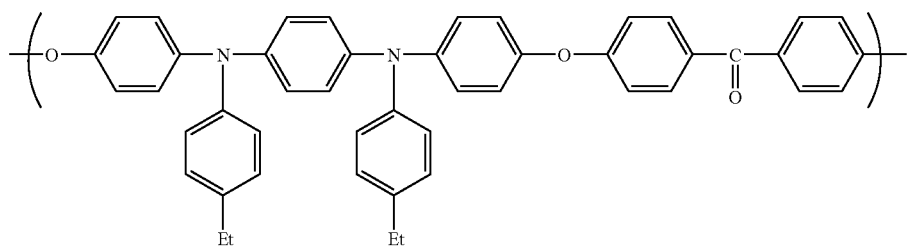

<<Displaying Apparatus and Lighting Apparatus>>

A monocolor or multicolor displaying apparatus and a lighting apparatus using the organic EL device of the invention are described below.

The device may be manufactured in reverse order such as Cathode/cathode buffer layer/Electron transfer layer/Positive hole transfer layer/Light emission layer/Positive hole transfer layer/Anode buffer layer/Anode. When the direct current is applied to thus prepared multi-color display, light emission is observed by applying a voltage of 2 to 40 V to the anode as positive pole and the cathode as negative pole. AC voltage also may be applied; waveform of the AC current may be optionally selected.

The displaying apparatus can be used as a displaying device, a display and various light sources. In the displaying device and the display, full color displaying can be performed by using three kinds of organic EL device each emitting blue, red and green light, respectively.

Examples of the displaying device and the display include televisions, personal computers, mobile apparatuses, AV apparatuses, letter broadcasting displays and information displays for car. The displaying device can be used for displaying a still image and a moving image. The driving method for the moving image may be both of a simple matrix (passive matrix) system or an active matrix system.

The lighting apparatus may be used as domestic lights, lights for lighting in car, backlights for a watch and a liquid crystal display, signboards of advertisement, signal apparatuses, a light sources for light memories, a light source for electrophotographic copiers, a light sources for light communication means and a light sources for photo sensors, but the use of it is not limited to the above.

The organic EL device of the invention may be used as an organic EL device having a resonator structure.

As the purpose of the use of such organic EL device having the resonator structure, a light source of a photo-memory, a light source of an electrophotographic copier, a light source of a light communication apparatus and a light source of a photo-sensor can be cited but the invention is not limited thereto. Such device may be used to the above purposes by causing laser oscillation.

The organic EL device of the invention may be used as a kind of lamp such as a light source for lighting or that for light exposure, and further may be used for a projector for projecting an image and a display for directly observing a still image of moving image. When the device is used for a moving image displaying apparatus, the driving system may be both of a simple matrix (passive matrix) system or an active matrix system. Moreover a full color displaying apparatus can be manufactured by using three or more kinds of organic EL device of the invention emitting light different from each other. A full color image can be displayed by using monocolor light such a white light and color filters such as BGR filters. Moreover, a full color image can be displayed by converting the color of light emitted from the organic El device to another color by a color conversion filter. In such case, the $\lambda_{max}$ of the light emitted from the organic EL device is preferably not more than 480 nm.

One of examples of displaying apparatus composed of the use of the organic EL device of the invention is described referring the drawing.

FIG. 1 is a schematic drawing of an example of displaying apparatus composed of the organic EL device.

Display 1 comprises a display portion A having plural pixels and controller B for performing scan on the display portion A according to image information.

The controller B is connected with the display portion A and transfers scanning signals and image signals to each of the pixels according to image information provided form the exterior so that the pixels at the scanned portion each successively emit light according to the image information to display the image information on the display portion A.

Figure 2:
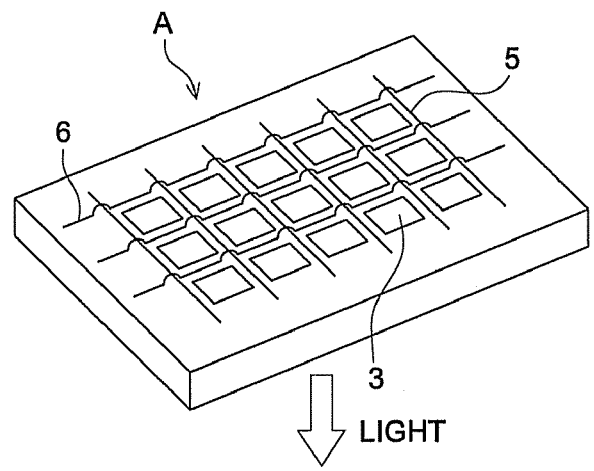
FIG. 2 is a schematic drawing of the displaying part.

FIG. 2 shows a schematic drawing of the displaying portion A.

The display portion A has wiring including scanning lines 5, data lines 6 and plural pixels 3. The principal parts of the displaying portion A are described below. FIG. 2 shows a case in which light emitted from the pixel 3 is taken out in the direction of the white arrow or in the lower direction.

The scanning lines 5 and data lines 6 of the wiring are each composed of an electroconductive material and they are crossing with together at a right angle as grid-like and connected to the pixel 3 at the crossing point; detail of such situation is not shown in the drawing.

The pixel 3 receives image information from the data line 6 when a scanning signal is applied to the pixel and emits light according to the received image data. Full color image can be displayed by suitably placing pixels each emitting light of red region, green region and blue region, respectively.

Figure 3:
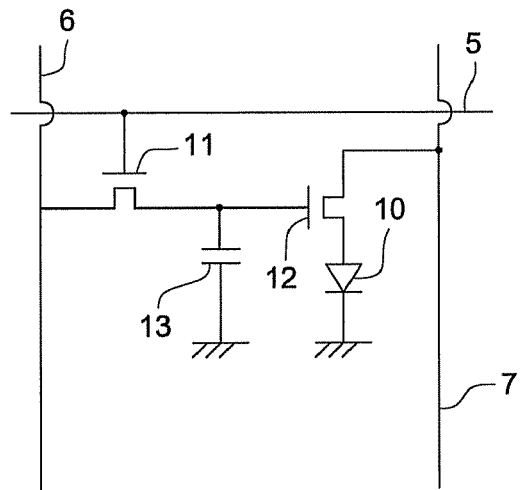
FIG. 3 is a schematic drawing of the pixel.

The light emission process in the pixel is described below. FIG. 3 shows a schematic drawing of the pixel.

The pixel has an organic EL device 10, a switching transistor 11, a driving transistor 12 and a condenser 14. Full color image can be displayed by arranging plural pixels on the same substrate, in each of the pixels, red, green or blue light emitting organic EL device is used respectively.

In FIG. 3, the image data signal is applied to the drain of the switching transistor 11 from the controller B through the data line 6. When the scanning signal is applied to the gate of the switching transistor 11 from the controller B through the scanning line 5, the switching transistor 11 is turned ON so that the image data signal applied to the drain is transferred to the condenser 13 and the gate of driving transistor 12.

The condenser 13 is charged according to the potential of the image data signal and the driving transistor 12 is turned ON by transfer of the image data signal. The drain of the driving transistor 12 is connected to a power line 7 and the source of that is connected to the electrode 10 of the organic EL device and electric current is supplied to the organic EL device 10 from the power line 7 according to the potential of the image data signal applied to the gate.

When the scanning signal is moved to the next scanning line 5 by the successive scanning by the controller B, The driving of the switching transistor 11 is turned OFF. However, driving of the driving transistor 12 is held at the state of ON since the condenser 13 holds the applied potential of the image data signal so that the light emission from the organic EL device 10 is continued until next scanning signal is applied. When the next scanning signal is applied by the successive scanning, the driving transistor 12 is driven according to the potential of next image data signal so that the organic EL device 10 emits light.

Each of the organic EL devices 10 of the plural pixels 3 is respectively emits light by the switching transistor 11 as an active element and the driving transistor 12 each provided to each of the organic EL devices 10. Such light emission system is called as the active matrix system.

The light emission of the organic EL device may be light emission having gradation according to the multi-value image data signal having plural gradation potential or on/off of the emission according to bi-value image data signal.

The potential held by the condenser 13 may be continued to application of next scanning signal or discharged just before the application of next scanning signal.

In the invention, the light emission may be driven by not only the active matrix system but also by the passive matrix system in which the organic EL device emits light according to the data signal only when the scanning signal is applied.

FIG. 4 is a schematic drawing of a displaying apparatus by the passive matrix system. In FIG. 4, plural scanning lines 5 and plural image data lines are each provided in faced state on both sides of the pixels 3 to form a grid state.

The pixel 3 connected to the scanning line 5 limits light corresponding to the image data when the scanning signal is applied to this scanning line. By the passive matrix system, the producing cost can be reduced since the pixel has no active element.

The materials to be used for the organic EL device of the invention can be applied for the organic EL device substantially emitting white light to be used as the lighting apparatus. Plural colors lights are emitted by plural light emission materials are emitted at the same time to obtain white light. The combination of the plural colored lights may be that containing three peaks of emitted light wavelength of three additive primaries of blue, green and red or two peaks of light wavelength utilizing two complimentary colors.

The combination of the light emission materials for obtaining plural color emission lights may be either a combination of plural materials (light emission dopants) emitting phosphorescence or fluorescence or a combination of the material emitting fluorescence or phosphorescence and the dye material capable of emitting light by exciting by light emitted from the above light emission material. The combination of the plural light emission dopants is preferable in the white light emission organic electroluminescent device.

As the layer constitution of the organic electroluminescent device for obtaining plural colored lights, a method in which the plural light emission dopants are contained one light emission layer, a method in which the device has plural light emission layers and the dopants each emitting light different in the wavelength are each separately contained in each of the layers and a method in which fine pixels each emitting light in the wavelength are formed in a matrix state are applicable.

The white light emitting organic electroluminescent device may be subjected to patterning on the occasion of the layer formation by using a metal mask or a ink-jet printing method according to necessity. When the pattering is applied, the patterning may be applied only for the electrodes, the electrodes and the light emission layer or the entire layers of the device.

The light emission material to be used in the light emission layer is not specifically limited. In the backlight for the liquid displaying device, the platinum complexes relating to the invention and known light emission materials are optionally selected for forming white light so as to fit the wave length range corresponding to the color filter CF.

The white light emission organic EL device are usefully used for various light source, lighting apparatuses as a kind of lamp such as domestic lights, lighting in cars and exposure light sources and a displaying apparatus such as a backlight of the liquid crystal display additionally to the above displaying device and the displaying apparatus.

Moreover, the device is widely used for various uses such as a light source of backlight of a watch, an advertising panel, a signal, a photo-memory, an electrophotographic copier and a photo-communication processor, and an electric tool for domestic use having a displaying device.

EXAMPLES

The Invention is described blow referring examples but the invention is not limited thereto. The structures of the materials used in the examples are listed below.

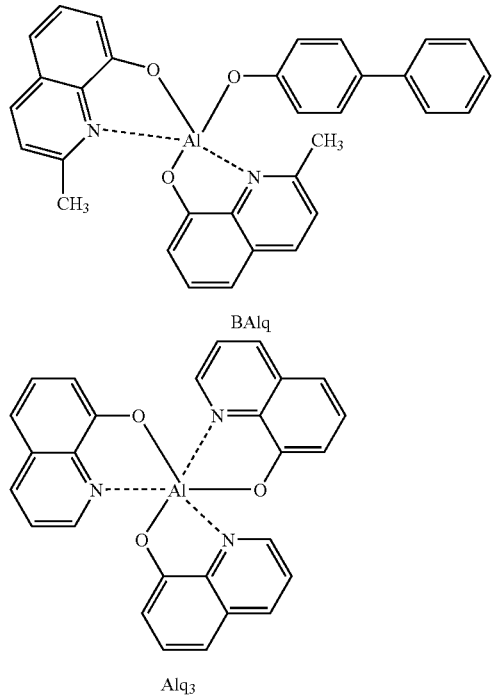

BAlq

Alq3

Example 1

Preparation of Organic EL Device 1-1

(Constitution and Forming Method of Each of Constituting Layers)
1) Cathode: Al (Vapor deposition)
2) Cathode buffer layer: LiF (Vapor deposition)
3) Electron transfer layer: Alq$_3$ (Tg: 175° C.), Dispersion liquid coating, Dissolvable range of solubility parameter: 8.8 to 10.0
4) Positive hole blocking layer: BAlq (Tg: 100° C.), Dispersion liquid coating, Dissolvable range of solubility parameter: 8.8 to 10.6
5) Light emission layer: PVK+PD-1 (Tg: >200° C.), Solution coating, Dissolvable range of solubility parameter: 8.6 to 10.0
6) Positive hole transfer layer: PEDOT/PSS (Tg: >200° C., Dispersion liquid coating, Dissolvable range of solubility parameter: >14.8
7) Anode: ITO (Vapor deposition)
8) Glass substrate
(Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

A solution prepared by diluting poly(3,4-ethylene dioxide thiophene)-polystyrene sulfonate, PEDOT/PSS Baytron P A14083 manufactured by Bayer Co., Ltd., by 70% by purified water was coated on the transparent substrate by spin coating at 3,000 rpm for 30 seconds and dried at 200° C. for 1 hour to form a positive hole transfer layer having a thickness of 30 nm.

On the positive hole transfer layer, a solution prepared by dissolving 30 mg polyvinylcarbazole (PVK; VP-6) and 1.5 mg of PD-1 in 3 ml of dichlorobenzene was coated by spin coating at 3,000 rpm for 30 seconds and dried at 60° C. for 1 hour under vacuum to provide a light emission layer having a thickness of 50 nm.

After that, a dispersion of bis(2-methyl-8-quinolinolate)-(p-phenyl phenolate) aluminum (BAlq) (dispersing medium: ethyl alcohol, average particle size: 33 nm, and solid content: 0.6% by weight) prepared in the same manner as in the foregoing preparation of nano fine particle dispersion using the Apex mil was coated by spin coating at 3,000 rpm for 30 minutes and dried and treated for smoothing the layer at 95° C. for 1 hour under vacuum to prepare a positive hole blocking layer having a thickness of 20 nm.

Furthermore, A dispersion of tris(8-hydroxynolilate) aluminum (Alq$_3$) (dispersing medium: ethyl alcohol, average particle size: 30 nm, solid content: 1.0% by weight) prepared in the same manner as in the foregoing preparation of nano fine particle dispersion using the Apex Mill was coated by the spin coating at 2,000 rpm for 30 seconds and dried and treated for smoothing the layer at 95° C. for 1 hour under vacuum to prepare an electron transfer layer having a thickness of 40 nm.

The substrate having these layers was attached in a vacuum depositing apparatus and the internal pressure was reduced by $4×10^{-4}$ Pa, and then a lithium fluoride layer of 0.5 nm as a cathode buffer layer and an aluminum layer of 110 nm as a cathode were deposited on the coated layer on the substrate to prepare Organic EL Device 1-1.

<Preparation of Organic EL Device 1-2>>
(Constitution and Forming Method of Each of Constituting Layers)
1) Cathode: Al (Vapor deposition)
2) Cathode buffer layer: LiF (Vapor deposition)
3) Electron transfer layer: Alq$_3$ (Tg: 175° C.), Dispersion liquid coating, Dissolvable range of solubility parameter: 8.8 to 10.0

4) Positive hole blocking layer: BAlq (Tg: 100° C.), Dispersion liquid coating, Dissolvable range of solubility parameter: 8.8 to 10.6

5) Light emission layer: PVK+PD-1 (Tg: >200° C.), Dispersion liquid coating, Dissolvable range of solubility parameter: 8.6 to 10.0

6) Second positive hole transfer layer: OC-2 (Tg: 110° C.), Solution coating, Dissolvable range of solubility parameter: 8.3 to 10.6

7) First positive hole transfer layer: PEDOT/PSS (Tg: >200° C., Dispersion liquid coating, Dissolvable range of solubility parameter: >14.8

8) Anode: ITO (Vapor deposition)

9) Glass substrate (Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

A solution prepared by diluting poly(3,4-ethylene dioxide thiophene)-polystyrene sulfonate, PEDOT/PSS Baytron P A14083 manufactured by Bayer Co., Ltd., by 70% by purified water was coated on the transparent substrate by spin coating at 3,000 rpm for 30 seconds and dried at 200° C. for 1 hour to form a first positive hole transfer layer having a thickness of 30 nm.

On the first positive hole transfer layer, a solution prepared by dissolving 10 mg of OC-2 (α-NPD) in 3 ml of toluene was coated by spin coating at 500 rpm for 30 seconds and treated for smoothing the layer at 100° C. for 1 hour under vacuum to form a second positive hole transfer layer having a thickness of 40 nm.

On the second positive hole transfer layer, a dispersion of PVK and PD-1 (dispersing medium: n-butyl alcohol, average particle size: 48 nm, solid content: 1.0% by weight, PVK/PD-1=100/6 in weight ratio) prepared by the foregoing nano fine particle dispersion preparation method by emulsifying dispersion was coated by spin coating at 3,000 rpm for 30 seconds and dried and treated for smoothing the layer at 95° C. for 1 hour under vacuum to form a light emission layer having a thickness of 50 nm.

After that, a dispersion of BAlq (dispersing medium: ethyl alcohol, average particle size: 33 nm, solid content: 10% by weight) prepared by the method the same as the foregoing method for preparing the nano fine particle dispersion using the Apex Mill was coated by spin coating at 3,000 rpm for 30 seconds and dried and treated for smoothing the layer at 95° C. for 1 hour under vacuum to form a positive hole blocking layer having a thickness of 20 nm.

Moreover, a dispersion of Alq$_3$ (dispersing medium: ethyl alcohol, average particle size: 30 nm, solid content: 10% by weight) prepared in the same manner as in the foregoing preparation method of the nano fine particle dispersion using the Apex Mill was coated by spin coating at 2,000 rpm for 30 seconds and dried and treated for smoothing the layer at 95° C. for 1 hour under vacuum to form an electron transfer layer having a thickness of 40 nm.

The substrate having these layers was attached in a vacuum depositing apparatus and the internal pressure was reduced by 4×10$^{-4}$ Pa, and then a lithium fluoride layer of 0.5 nm as a cathode buffer layer and an aluminum layer of 110 nm as a cathode were deposited on the coated layer on the substrate to prepare Organic EL Device 1-2.

<<Preparation of Organic EL Device 1-3>>

(Constitution and Forming Method of Each of Constituting Layers)

1) Cathode: Al (Vapor deposition)

2) Cathode buffer layer: LiF (Vapor deposition)

3) Electron transfer layer: Alq$_3$ (Tg: 175° C.), Dispersion liquid coating, Dissolvable range of solubility parameter: 8.8 to 10.0

4) Positive hole blocking layer: BAlq (Tg: 100° C.), Dispersion liquid coating, Dissolvable range of solubility parameter: 8.8 to 10.6

5) Light emission layer: PVK+PD-1 (Tg: >200° C.), Dispersion liquid coating, Dissolvable range of solubility parameter: 8.6 to 10.0

6) Second positive hole transfer layer: OC-2 (Tg: 110° C.), dispersion liquid coating, Dissolvable range of solubility parameter: 8.3 to 10.6

7) First positive hole transfer layer: VP-1 (Tg: 150° C.), Solution coating, Dissolvable range of solubility parameter: 8.8 to 10.0

8) Anode: ITO (Vapor deposition)

9) Glass substrate (Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

On the transparent substrate, a solution prepared by dissolving 30 mg of VP-1 doped with quaternary ammonium salt in 3 ml of toluene was coated by spin coating at 3,000 rpm for 30 seconds and dried at 140° C. for 1 hour under nitrogen gas stream to form a first positive hole transfer layer having a thickness of 30 nm.

On the first positive hole transfer layer, a dispersion of OC-2 (α-NPD) (dispersing medium: ethyl alcohol, average particle size: 35 nm, solid content: 1.0° by weight) prepared by the method the same as the foregoing method for preparing the nano fine particle dispersion using the Apex Mill was coated by spin coating at 1,500 rpm for 30 seconds and dried and treated for smoothing the layer at 100° C. for 1 hour to form a second positive hole transfer layer.

On the second positive hole transfer layer, a dispersion of PVP and PD-1 (dispersing medium: methanol/THF, average particle size: 60 nm, solid content: 0.5% by weight, PVK/PD-1=100/6 in weight ratio) prepared by the method for preparing the nano fine particle dispersion by re-precipitation was coated by spin coating at 500 rpm for 30 seconds and dried and treated for smoothing the layer at 80° C. for 1 hour under vacuum to form a light emission layer having a thickness of 50 nm.

After that, a dispersion of BAlq (dispersing medium: ethyl alcohol, average particle size: 33 nm, solid content: 0.6% by weight) prepared in the same manner as in the foregoing preparation method for the nano fine particle dispersion using the Apex Mill was coated by spin coating at 3,000 rpm for 30 seconds and dried and treated for smoothing the layer at 95° C. for 1 hour under vacuum to form a positive hole blocking layer having a thickness of 20 nm.

Furthermore, a Alq$_3$ dispersion (dispersing medium: ethyl alcohol, average particle size: 30 nm, solid content: 1.0% by weight) prepared in the same manner as in the foregoing preparation method for the nano fine particle dispersion using the Apex Mill was coated by spin coating at 2,000 rpm for 30 seconds and dried and treated for smoothing the layer to form an electron transfer layer having a thickness of 40 nm.

The substrate having these layers was attached in a vacuum depositing apparatus and the internal pressure was reduced by $4\times10^{-4}$ Pa, and then a lithium fluoride layer of 0.5 nm as a cathode buffer layer and an aluminum layer of 110 nm as a cathode were deposited on the coated layer on the substrate to prepare Organic EL Device 1-3.

<<Preparation of Organic EL Device 1-4>>

(Constitution and Forming Method of Each of Constituting Layers)

1) Cathode: Al (Vapor deposition)
2) Cathode buffer layer: LiF (Vapor deposition)
3) Electron transfer layer: $Alq_3$ (Tg: 175° C.), Dispersion liquid coating, Dissolvable range of solubility parameter: 8.8 to 10.0
4) Positive hole blocking layer: BAlq (Tg: 100° C.), Dispersion liquid coating, Dissolvable range of solubility parameter: 8.8 to 10.6
5) Light emission layer: PVK+PD-1 (Tg: >200° C.), Dispersion liquid coating, Dissolvable range of solubility parameter: 8.6 to 10.0
6) Positive hole transfer layer: VM-3, VM-4 (Tg: >200° C.), Solution coating, Dissolvable range of solubility parameter: immeasurable
7) Anode: ITO (Vapor deposition)
8) Glass substrate (Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

On the transparent substrate, a solution prepared by dissolving 9.9 mg of VM-3 and 0.1 mg of VM-4 in 3 ml of toluene was coated by spin coating at 500 rpm for 30 seconds.

The substrate was heated at 150° C. for 2 hours for polymerizing the above coated material on the substrate to form a positive hole transfer layer having a thickness of 30 nm. The polymerization degree of layer is measured by GPC as to a layer coated and polymerized in the same manner as on another quartz substrate. The average molecular weight was 4,800 in terms of standard polyethylene. On the positive hole transfer layer, a solution prepared by dissolving 30 mg of PVK and 1.5 mg of PD-1 in 3 ml of dichlorobenzene was coated by spin coating at 2,000 rpm for 30 seconds and dried at 60° for 1 hour under vacuum to form a light emission layer having a thickness of 50 nm.

After that, a dispersion of BAlq (dispersing medium: ethyl alcohol, average particle size: 33 nm, solid content 0.6% by weight) prepared in the same manner as in the foregoing preparation method of nano fine particle dispersion using the Apex Mill was coated by spin coating and dried and treated for smoothing the layer at 95° C. for 1 hour to form a positive hole blocking layer having a thickness of 20 nm.

The resultant substrate was attached in a vacuum deposition apparatus and the pressure in the vacuum chamber was reduced by $4\times10^{-4}$ Pa.

Then the molybdenum boat containing $Alq_3$ was heated by applying electric current and $Alq_3$ was vapor deposited at a deposition rate of 0.1 nm/second on the positive hole blocking layer to form an electron transfer layer having a thickness of 40 nm.

Moreover, a lithium fluoride layer of 0.5 nm as a cathode buffer layer and an aluminum layer of 110 nm as a cathode were deposited to prepare Organic EL Device 1-4.

<<Preparation of Organic EL Device 1-5: Comparative Example>>

(Constitution and Forming Method of Each of Constituting Layers)

1) Cathode: Al (Vapor deposition)
2) Cathode buffer layer: LiF (Vapor deposition)
3) Light emission layer: PVK+PD-1 (Tg: >200° C.), Solution coating, Dissolvable range of solubility parameter: 8.6 to 10.0
4) Positive hole transfer layer: PEDOT/PSS (Tg: >200° C.), Dispersion liquid coating, Dissolvable range of solubility parameter: >14.8
5) Anode: ITO (Vapor deposition)
6) Glass substrate (Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

A solution prepared by diluting poly(3,4-ethylene dioxide thiophene)-polystyrene sulfonate, PEDOT/PSS Baytron P A14083 manufactured by Bayer Co., Ltd., by 70% by purified water was coated on the transparent substrate by spin coating at 3,000 rpm for 30 seconds and dried at 200° C. for 1 hour to form a positive hole transfer layer having a thickness of 30 nm.

On the positive hole transfer layer, a solution prepared by dissolving 30 mg of PVK and 1.5 mg of PD-1 in 3 ml of dichlorobenzene was coated by spin coating at 2,000 rpm for 30 seconds and dried at 60° C. for 1 hour to form a light emission layer having a thickness of 50 nm.

The resultant substrate was set in a vacuum deposition apparatus and the pressure in the vacuum chamber was reduced by $4\times10^{-4}$ Pa and a lithium fluoride layer of 0.5 nm as a cathode buffer layer and an aluminum layer of 110 nm as a cathode were deposited to prepare Organic EL Device 1-5 (comparative example).

<<Preparation of Organic EL Device 1-6>>

(Constitution and Forming Method of Each of Constituting Layers)

1) Cathode: Al (Vapor deposition)
2) Cathode buffer layer: LiF (Vapor deposition)
3) Electron transfer layer: $Alq_3$ (Tg: 175° C.), Solution coating, Dissolvable range of solubility parameter: 8.8 to 10.0
4) Positive hole blocking layer: BAlq (Tg: 100° C.), Solution coating, Dissolvable range of solubility parameter: 8.8 to 10.6
5) Light emission layer: PVK+PD-1 (Tg: >200° C.), Solution coating, Dissolvable range of solubility parameter: 8.6 to 10.0
6) Positive hole transfer layer: PEDOT/PSS (Tg: >200° C.), Dispersion liquid coating, Dissolvable range of solubility parameter: >14.8
7) Anode: ITO (Vapor deposition)
8) Glass substrate (Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes. On the transparent substrate, a solution prepared by diluting poly(3,4-ethylene dioxide thiophene)-polystyrene sulfonate, PEDOT/PSS Baytron P A14083 manufactured by Bayer Co., Ltd., by 70% by purified water was coated by spin coating at 3,000 rpm for 30 seconds and dried at 200° C. for 1 hour to form a positive hole transfer layer having a thickness of 30 nm.

On the positive hole transfer layer, a solution prepared by dissolving 30 mg of polyvinylcarbazole (KPV: VP-6) and 1.5 mg of PD-1 in 3 ml of dichlorobenzene was coated by spin coating at 1,000 rpm for 30 seconds and dried at 60° C. for 1 hour under vacuum to form a positive hole blocking layer having a thickness of 50 nm.

A solution of 10 mg of Balq in 3 ml of toluene was coated by spin coating at 1,000 rpm for 30 second and dried at 60° C. for 1 hour under vacuum to form a positive hole blocking layer. However, the total thickness after drying was reduced some degree compared with that before the forming of the positive hole blocking layer. Such result suggests that the lower layer partially dissolved.

After that, a solution prepared by dissolving 15 mg of Alq$_3$ in 3 ml of tetrahydrofuran was coated by spin coating at 1,000 rpm for 30 second and dried at 60° C. for 1 hour under vacuum to form an electron transfer layer. The thickness of after the drying was about 80% of the total layer thickness before the formation of the electron transfer layer similarly in the above case. Such result suggests that partial dissolution of the lower layer was caused.

The resultant substrate was set in a vacuum deposition apparatus and the pressure in the vacuum chamber was reduced by $4 \times 10^{-4}$ Pa and a lithium fluoride layer of 0.5 nm as a cathode buffer layer and an aluminum layer of 110 nm as a cathode were deposited to prepare Organic EL Device 1-6.

<<Preparation of Organic EL Device 1-7>>
(Constitution and Forming Method of Each of Constituting Layers)
1) Cathode: Al (Vapor deposition)
2) Cathode buffer layer: LiF (Vapor deposition)
3) Positive hole blocking layer: OC-14 (Tg: 90° C.), Dispersion liquid coating, Dissolvable range of solubility parameter: 8.8 to 10.6
4) Light emission layer: OC-6+PD-1 (Tg: 110° C.), Dispersion liquid coating, Dissolvable range of solubility parameter: 8.6 to 10.0
5) Positive hole transfer layer: PV-3 (Tg: 180° C.), Solution coating, Dissolvable range of solubility parameter: 8.8 to 10.0
6) Anode: ITO (Vapor deposition)
7) Glass substrate (Preparation of Organic EL Device)
An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

On the transparent substrate, a solution prepared by dissolving 15 mg of VP-3 in 3 ml of tetrahydrofuran was coated by spin coating at 1,000 rpm for 30 seconds and to form a layer. The substrate was heated at 150° C. for 2 hours in nitrogen atmosphere for polymerizing the coated material to for a positive hole transfer layer having a thickness of 30 nm.

On the positive hole transfer layer, a dispersion of OC-14 (dispersing medium: acetonitrile/THF, average particle size: 45 nm, solid content: 0.5% by weight, OC-6/PD-1=100/6 in weight ratio) prepared in the same manner as in the method for preparing the nano fine particle dispersion by the re-precipitation method was coated by spin coating at 500 rpm and dried and treated for smoothing the layer at 90° C. for 1 hour to form a light emission layer having a thickness of 40 nm.

After that, a dispersion f OC-14 (dispersion medium: acetonitrile/dischloroethane, average particle size 30 nm, solid content: 1.0% by weight) prepared in the same manner as in the method for preparing the nano fine particle dispersion by the re-precipitation method was coated by spin coating at 3,000 rpm for 30 seconds and dried and treated for smoothing the layer at 80° C. for 1 hour under vacuum to form a positive hole blocking layer having a thickness of 40 nm.

The resultant substrate was set in a vacuum deposition apparatus and the pressure in the vacuum chamber was reduced by $4 \times 10^{-4}$ Pa and a lithium fluoride layer of 0.5 nm as a cathode buffer layer and an aluminum layer of 110 nm as a cathode were deposited to prepare Organic EL Device 1-7.

<<Evaluation of Organic EL Devices 1-1 to 1-7>>
The above obtained Organic EL devices 1-1 to 1-7 were evaluated by measuring the external quantum efficiency, light emission lifetime and driving voltage, also simply referred to as voltage, by the following procedure.

Figure 5:
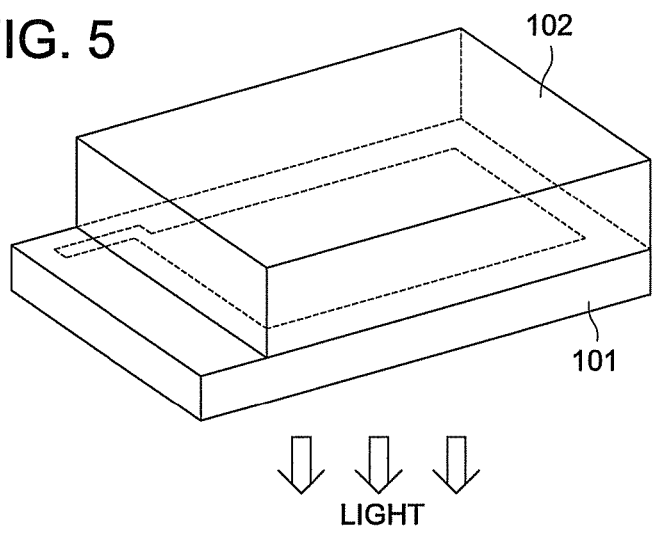
FIG. 5 shows a schematic drawing of a lighting apparatus.
Figure 6:
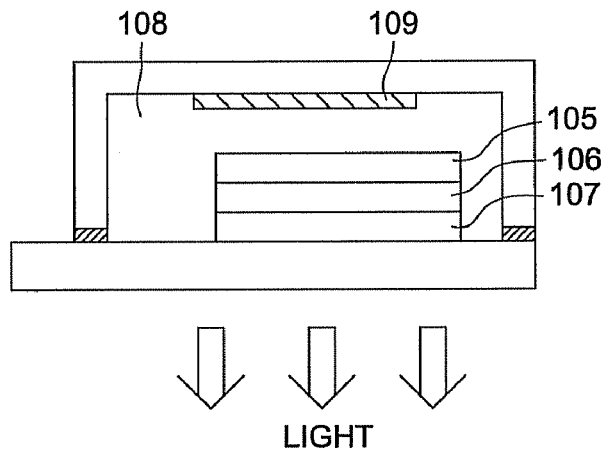
FIG. 6 shows a cross section of a lighting apparatus.
Figure 7:
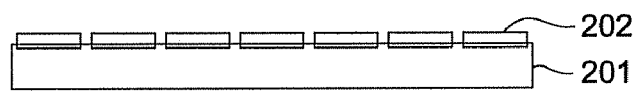
FIGS. 7A to 7E are schematic drawings of an example of manufacturing process of a full color displaying apparatus by an ink-jet method.
Figure 7:
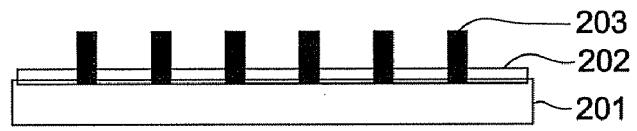
Figure 7:
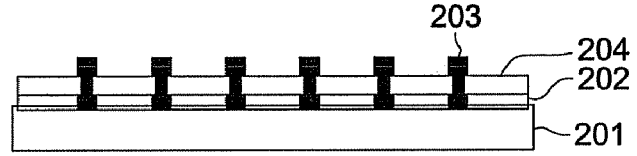
Figure 7:
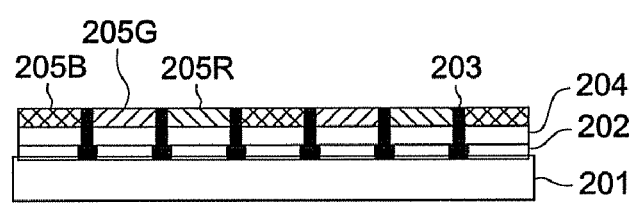
Figure 7:
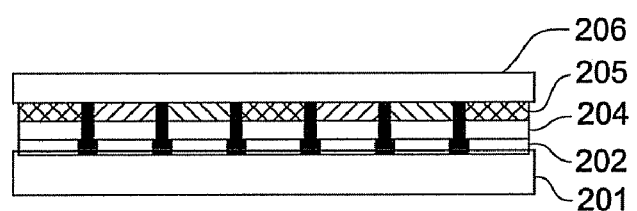

For evaluating Organic EL Devices 1-1 to 1-7, the non-light-emitting face of each of the devices was covered with a glass case and a sealing glass plate having a thickness of 300 μm was piled on the cathode so as to be contacted with the transparent substrate using an epoxy type photo curable adhesive, Laxtruck LC0629B manufactured by To a Gousei Co., Ltd., as a sealing material and sealed by curing the adhesive by irradiating UV rays from the glass plate side so as to form a lighting apparatus as shown in FIGS. 5 and 6.

FIG. 5 shows a schematic drawing of a lighting apparatus in which an organic EL device 101 was covered with a glass cover. The sealing operation by the glass cover was performed in a globe box under atmosphere of highly purified nitrogen of not less than 99.999% so that the organic EL device 101 was not exposed to air. FIG. 6 shows a cross section of the lighting apparatus. In FIG. 6, 105 is a cathode, 106 is an organic EL layer, and 107 is a glass substrate having a transparent electrode. In the glass cover, nitrogen gas 108 was charged and a moisture capturing agent 109 was provided.

[Measurement of External Quantum Efficiency]
The external quantum efficiency (%) of the prepared organic EL device was measured under the condition of that a constant electric current of 2.5 mA/cm$^2$ was applied to the organic EL element at 23° C. under dried nitrogen atmosphere. A spectrum radiation luminance meter CS-1000, manufactured by Konica Minolta Sensing Co., Ltd., was used for the measurement.

[Measurement of Light Emission Lifetime]
The organic EL device is driven by applying a constant electric current of 2.5 MA/cm$^2$ under dried nitrogen atmosphere and the time (τ0.5) necessary for decreasing the luminance of emitted light by ½ of that at the initial time of emission of light was measured and defined as indicator of the lifetime. The spectrum radiation luminance meter CS-1000, manufactured by Konica Minolta Sensing Co., Ltd., was also used for the measurement.

Voltage necessary for starting light emission was measured under dried nitrogen atmosphere. The voltage for starting the light emission is measured at the time when the luminance of the emitted light was come up to 50 cd/m$^2$. The spectrum radiation luminance meter CS-1000, manufactured by Konica Minolta Sensing Co., Ltd., was used for measuring the luminance.

Measurement results of the external quantum efficiency, the light emission lifetime and the driving voltage of Organic EL Devices of 1-1 to 1-7 are listed in Table 2. The measured results are each expressed by relative values when the results of Organic EL Device 1-5 are set at 100, respectively.

TABLE 2

| Organic EL device No. | Externally output quantum efficiency | Light emission lifetime | Driving voltage | Remarks |
|---|---|---|---|---|
| 1-1 | 170 | 120 | 87 | Inventive |
| 1-2 | 170 | 170 | 70 | Inventive |
| 1-3 | 165 | 300 | 68 | Inventive |
| 1-4 | 200 | 160 | 67 | Inventive |
| 1-5 | 100 | 100 | 100 | Comparative |
| 1-6 | Light is not emitted (Device cannot be suitably prepared) | | | Comparative |
| 1-7 | 200 | 450 | 72 | Inventive |

As is cleared in Table 2, the organic EL devices of the invention are each higher in the external quantum efficiency (higher in the light emission efficiency), longer in the light emission lifetime and lower in the driving voltage compared with those of the comparative Organic EL Device 1-5 prepared by the usual coating method.

Example 2

Preparation of Organic EL Device 2-1

(Constitution and Forming Method of Each of Constituting Layers)
 1) Cathode: Al (Vapor deposition)
 2) Cathode buffer layer: LiF (Vapor deposition)
 3) Positive hole blocking layer: BAlq (Tg: 100° C.), Dispersion liquid coating, Dissolvable range of solubility parameter: 8.8 to 10.6
 4) Light emission layer: OC-12 (Tg: 120° C.)+DP-1, Dispersion liquid coating, Dissolvable range of solubility parameter: 8.6 to 10.0
 5) Second positive hole transfer layer: OC-4 (Tg: 140° C.), Dispersion liquid coating, Dissolvable range of solubility parameter: 8.6 to 10.6
 6) First positive hole transfer layer: PEDOT/PSS, Dispersion liquid coating, Dissolvable range of solubility parameter: >14.8
 7) Anode: ITO (Vapor deposition)
 8) Glass substrate
(Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

A solution prepared by diluting poly(3,4-ethylene dioxide thiophene)-polystyrene sulfonate, PEDOT/PSS Baytron P A14083 manufactured by Bayer Co., Ltd., by 70% by purified water was coated on the transparent substrate by spin coating at 3,000 rpm for 30 seconds and dried at 200° C. for 1 hour to form a first positive hole transfer layer having a thickness of 30 nm.

On the first positive hole transfer layer, a dispersion of OC-4 (dispersing medium: ethyl alcohol, average particle size: 29 nm, solid content: 1.0% by weight) prepared in the same manner as in the method for preparing the nano fine particle dispersion using the Apex Mill was coated by spin coating at 1,500 rpm for 30 seconds and dried and treated for smoothing the layer at 140° C. for 2 hours under vacuum to form a second positive hole transfer layer having a thickness of 40 nm.

On the second positive hole transfer layer, a dispersion of OC-12 and DP-1 (dispersing medium: n-butyl alcohol, average particle size: 38 nm, solid content: 1.0% by weight, OC-12/DP-1=100/6 in weight ratio) prepared in the same manner as in the method for preparing the nano fine particle dispersion by emulsifying dispersion was coated by spin coating and dried and treated for smoothing the layer at 120° C. for 24 hours under vacuum to form a light emission layer having a thickness of 50 nm.

After that, a dispersion of BAlq (dispersing medium: n-butyl alcohol, average particle size: 33 nm, solid content: 1.0% by weight) prepared in the same manner as in the method for preparing the nano fine particle dispersion using the Apex Mill was coated by spin coating at 500 rpm for 30 seconds and dried and treated for smoothing the layer at 95° C. for 3 hours under vacuum to form a positive hole blocking layer having a thickness of 45 nm.

The resultant substrate was set in a vacuum deposition apparatus and the pressure in the vacuum chamber was reduced by $4\times10^{-4}$ Pa and a lithium fluoride layer of 0.5 nm as a cathode buffer layer and an aluminum layer of 110 nm as a cathode were deposited to prepare Organic EL Device 2-1.

<<Preparation of Organic EL Device 2-2: Comparative Example>>

(Constitution and Forming Method of Each of Constituting Layers)
 1) Cathode: Al (Vapor deposition)
 2) Cathode buffer layer: LiF (Vapor deposition)
 3) Light emission layer: OC-12+DP-1, Solution coating, Dissolvable range of solubility parameter: 8.3 to 10.6
 4) First positive hole transfer layer: PEDOT/PSS, Dispersion liquid coating, Dissolvable range of solubility parameter: >14.8
 5) Anode: ITO (Vapor deposition)
 6) Glass substrate
(Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

A solution prepared by diluting poly(3,4-ethylene dioxide thiophene)-polystyrene sulfonate, PEDOT/PSS Baytron P A14083 manufactured by Bayer Co., Ltd., by 70% by purified water was coated on the transparent substrate by spin coating at 3,000 rpm for 30 seconds and dried at 200° C. for 1 hour to form a positive hole transfer layer having a thickness of 30 nm.

On the positive hole transfer layer, a solution prepared by dissolving 30 mg of OC-12 and 1.5 mg of PD-1 in 3 ml of dichlorobenzene was coated by spin coating at 2,000 rpm for 30 seconds and dried at 120° C. for 1 hour under vacuum to form a light emission layer having a thickness of 50 nm.

The resultant substrate was set in a vacuum deposition apparatus and the pressure in the vacuum chamber was reduced by $4\times10^{-4}$ Pa and a lithium fluoride layer of 0.5 nm as a cathode buffer layer and an aluminum layer of 110 nm as a cathode were deposited to prepare Organic EL Device 2-2.

<<Preparation of Organic EL Device 2-3: Comparative Example>>

(Constitution and Forming Method of Each of Constituting Layers)

1) Cathode: LiF+Al (Vapor deposition)
2) Positive hole blocking layer: BAlq (Vapor deposition)
3) Light emission layer: OC-12+DP-1 (Vapor deposition)
4) Second positive hole transfer layer: OC-4 (Vapor Deposition)
5) First positive hole transfer layer: PEDOT/PSS (Dispersion Liquid Coating)
6) Anode: ITO (Vapor deposition)
7) Glass substrate (Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

A solution prepared by diluting poly(3,4-ethylene dioxide thiophene)-polystyrene sulfonate, PEDOT/PSS Baytron P A14083 manufactured by Bayer Co., Ltd., by 70% by purified water was coated on the transparent substrate by spin coating at 3,000 rpm for 30 seconds and dried at 200° C. for 1 hour to form a first positive hole transfer layer having a thickness of 30 nm. The transparent substrate having the first positive hole transfer layer was fixed on the substrate holder of a vacuum deposition apparatus available on the market and a molybdenum resistive heating boat containing 200 mg of OC-4 as a second positive hole transfer layer forming material, a molybdenum resistive heating boat containing 200 mg of OC-12 as a host compound, a molybdenum resistive heating boat containing 100 mg of PD-1 and another molybdenum resistive heating boat containing 200 mg of BAlq were each attached in the vacuum deposition apparatus.

After that, the pressure in the vacuum chamber was reduced by $4\times10^{-4}$ Pa and then a second positive hole transfer layer having a thickness of 40 nm was formed on the first positive hole transfer layer at a deposition rate of 0.1 nm/second by applying electric current to the heating boat containing OC-4.

After that, the heating boats each containing OC-12 and PD-1 were heated by applying electric current and OC 12 and PD-1 were co-deposited at a deposition rate of 0.2 nm/second and 0.012 nm/second, respectively, to form a light emission layer having a thickness of 50 nm. The temperature of the substrate at the time of the deposition was room temperature.

Furthermore, the heating boat containing BAlq was heated by applying electric current to deposit a positive hole blocking layer having a thickness of 45 nm at a deposition rate of 0.1 nm/second on the light emission layer. The temperature of the substrate at the time of the deposition was room temperature. And then a cathode was formed by vapor deposition of 0.5 nm lithium fluoride layer and 110 nm aluminum layer to prepared Organic EL Device 2-3.

<<Preparation of Organic EL Device 2-4>>

(Constitution and Forming Method of Each of Constituting Layers)

1) Cathode: Al (Vapor deposition)
2) Cathode buffer layer: LiF (Vapor deposition)
3) Positive hole blocking layer: BAlq (Tg: 100° C.), Dispersion liquid coating, Dissolvable range of solubility parameter: 8.8 to 10.6
4) Light emission layer: OC-12 (Tg: 120° C.+DP-1, Dispersion liquid coating, Dissolvable range of solubility parameter: 8.3 to 10.6
5) Second positive hole transfer layer: OC-4 (Tg: 140° C.), Dispersion liquid coating, Dissolvable range of solubility parameter: 8.6 to 10.0
6) Anode: ITO (Vapor deposition)
7) Glass substrate (Preparation of Organic EL Device)

An anode was formed by patterning on a substrate, NA-45 manufactured by NH Technoglass Co., Ltd., having a size of 100 mm×100 mm×1.1 mm, on which an ITO (indium tin oxide) layer of 100 nm was previously formed. Then the transparent substrate having the ITO transparent electrode was washed by ultrasonic wave using isopropyl alcohol, dried by dried nitrogen gas and subjected to ozone cleaning for 5 minutes.

On the transparent substrate, a solution prepared by dissolving 10 mg of PV-3 in 3 ml of tetrahydrofuran was coated by spin coating at 1,000 rpm for 30 seconds and dried at 150° C. for 1 hour to form a first positive hole transfer layer having a thickness of 20 nm.

On the first positive hole transfer layer, a dispersion of OC-4 (dispersing medium: ethyl alcohol, average particle size: 29 nm, solid content: 1.0% by weight) prepared by the method for preparing the nano fine particle dispersion using the Apex Mill was coated by spin coating at 1,500 rpm for 30 seconds and dried and treated for smoothing the layer at 140° C. for 2 hours under vacuum to form a second positive hole transfer layer having a thickness of 40 nm.

On the second positive hole transfer layer, a dispersion of OC-12 and PD-1 (dispersing medium: n-butyl alcohol, average particle size: 38 nm, solid content: 1.0% by weight, OC-12/PD-1=100/6 in weight ratio) prepared in the same manner as in the method for preparing the nano fine particle dispersion by the emulsifying dispersion was coated by spin coating at 2,500 rpm for 30 seconds and dried and treated for smoothing the layer at 120° C. for 2 hours under vacuum to form a light emission layer having a thickness of 50 nm.

After that, a dispersion of BAlq (dispersing medium: n-butyl alcohol, average particle size: 33 nm, solid content: 1.0% by weight) prepared in the same manner as in the method for preparing the nano fine particle dispersion by the Apex Mill was coated by spin coating at 500 rpm for 30 seconds and dried and treated for smoothing the layer at 59° C. for 3 hours under vacuum to form a positive hole blocking layer having a thickness of 45 nm.

The resultant substrate was set in a vacuum deposition apparatus and the pressure in the vacuum chamber was reduced by $4\times10^{-4}$ Pa and a lithium fluoride layer of 0.5 nm as a cathode buffer layer and an aluminum layer of 110 nm as a cathode were deposited to prepare Organic EL Device 2-4.

<<Evaluation of Organic EL Devices 2-1 to 2-4>>

Organic EL Devices 2-1 to 2-4 were subjected to evaluations in the same manner as those described in Example 1.

Thus obtained results are listed in the following Table 3. In the table, each of the measured values is expressed by a relative value when the results of Organic EL Device 2-2 are each set at 100.

TABLE 3

| Organic EL device No. | Externally output quantum efficiency | Light emission lifetime | Driving voltage | Remarks |
|---|---|---|---|---|
| 2-1 | 170 | 450 | 69 | Inventive |
| 2-2 | 100 | 100 | 100 | Comparative |
| 2-3 | 185 | 600 | 70 | Comparative |
| 2-4 | 175 | 900 | 70 | Inventive |

As is cleared in Table 3, the organic EL devices of the invention are each higher in the external quantum efficiency (higher in the light emission efficiency), longer in the light emission lifetime and lower in the driving voltage compared with those of the comparative Organic EL Devices 2-2 and 2-3 prepared by the usual coating method.

Moreover, the organic EL devices of the invention is not inferior in the properties such as the luminance of emitted light and the light emission lifetime compared with Organic EL Device 2-3 prepared by the vapor deposition method. The organic EL device of the invention is largely improved in the external quantum efficiency (high light emission efficiency) and the light emission lifetime though it is generally said that the properties of the organic EL device prepared by the coating method is inferior to those of the organic EL device prepared by the vapor deposition method. Particularly, it is confirmed that the lifetime is further prolonged in Organic EL Device 2-4 using non-aqueous solvents for forming all organic layers.

Example 3

Preparation of Full Color Displaying Apparatus (Blue Light Emission Organic EL Device)
Blue Light Emission Organic Device 2-1B was prepared in the same manner as in Organic EL Device 2-1 in Example 2 except that PD-1 was replaced by PD-9.
(Green Light Emission Organic EL Device)
Organic EL Device 2-1 prepared in Example 2 was used as a green light emission organic EL device.
(Red Light Emission Organic EL Device)
Red Light Emission Organic Device 2-1R was prepared in the same manner as in Organic EL Device 2-1 in Example 2 except that PD-1 was replaced by PD-6.

An active matrix type full color displaying apparatus having the shape displayed in FIG. 1 was prepared by arranging the organic EL devices of blue, green and red on the same substrate. A schematic drawing of the displaying portion A of thus prepared displaying apparatus is only displayed in FIG. 2. The displaying portion had a wiring including plural scanning lines 5 and data lines 6 and plural pixels 3 including those emitting light in red region, green region and blue region arrange on the same substrate. The scanning lines 5 and the data lines 6 were each composed of an electroconductive material and were respectively crossed at a right angle in a form of grid and connected to the pixel 3 at the crossing point; the detail is not shown in the drawing. The plural pixels were each composed of the organic EL device, a switching transistor as the active element and a driving transistor each corresponding to the color of emitting light and driven by the active matrix system. When the scanning signal was applied from the scanning line 5, the image data was received from the data line 6 and the organic EL device emits light corresponding to the image data. The blue, green and red light emitting pixels were suitably arranged to constitute the full color displaying apparatus.

It could be confirmed that full color moving picture can be displayed with high light emission efficiency and long lifetime by driving the full color displaying apparatus.
<<Preparation of White Light Lighting Apparatus>>
A white light emission Organic EL Device 2-1W was prepared in the same manner as in Organic EL Device 2-1 except that PD-1 was replace by a mixture of PD-1, PD-6 and PD-9. The none light emitting side of the resultant Organic EL Device 2-1W was covered by a glass case in the same manner as in Examples 1 and 2 to prepare a lighting apparatus. Thus prepared lighting apparatus can be used as a thin-shaped lighting apparatus emitting white light with high light emission efficiency and long lifetime.

Example 5

Preparation of Full Color Display Using Ink-Jet Method

The organic EL device of the invention is prepared by the coating such as solution coating and dispersion coating, and an ink-jet method can be cited as one of preferable methods.
The manufacturing method of the organic EL device using the ink-jet method is described referring FIGS. 7A to 7E below.
FIGS. 7A to 7E are schematic drawings showing an example of manufacturing process of the full color displaying apparatus using the ink-jet method.
ITO (indium tin oxide) electrodes 202 were formed by patterning on a substrate 201, NA-45 manufactured by NH Technoglass Co., Ltd., having a size of 100 mm×100 mm×1.1 mm, on which an ITO layer of 100 nm was previously formed. After that, barriers 203 of non-photosensitive polyimide having a width of 20 µm and a thickness of 2.0 µm were formed between each of the ITO transparent electrodes 202 on the glass substrate 201 was formed by photolithography. On the ITO electrode 203 placed between the barriers of non-photosensitive polyimide, the following positive hole injection composition was injected by an ink-jet head, MJ-800C manufactured by Epson Co., Ltd., and dried at 200° C. for 10 minutes to for a positive hole transfer layer 204.
On the positive hole transfer layer 204, the following blue light emission composition, green light emission composition and red light emission composition were each injected by the same ink-jet head to form a blue light emission layer 205B, a green light emission layer 205G and a red light emission layer 205R on the glass substrate 201.
The glass substrate 201 was set in a vacuum deposition apparatus and the pressure in the vacuum chamber was reduced by $4\times10^{-4}$ Pa and a lithium fluoride layer of 0.5 nm as a cathode buffer layer and an aluminum layer of 110 nm as a cathode 206 were deposited to prepare an organic EL device.
(Positive Hole Transfer Layer Composition)
A liquid prepared by diluting 20 g of poly(3,4-ethylenedixythiophene)-polystyrenesulfonate, PEDOT/PSS, Baytron P A14083 manufactured by Bayer Co., Ltd., by 65 g of purified water, 10 g of ethoxyethanol and 5 g of glycerol was used.
(Green Light Emission Layer Composition)
A solution prepared by dissolving 300 mg of PVK and 15 mg of PD-1 in 25 ml of cyclohexylbenzene and 25 ml of isopropylbiphenyl was used.
(Blue Light Emission Layer Composition)
A solution prepared by dissolving 300 mg of PVK and 15 mg of PD-9 in 25 ml of cyclohexylbenzene and 25 ml of isopropylbiphenyl was used.

(Red Light Emission Layer Composition)

A solution prepared by dissolving 300 mg of PVK and 15 mg of PD-6 in 25 ml of cyclohexylbenzene and 25 ml of isopropylbiphenyl was used.

The organic EL device prepared by forming each of the layers by ink-jet method emits blue, green and red light by applying voltage to each of the electrodes and it was understood that the device can be utilized as a full color displaying apparatus.

The invention claimed is:

1. A method of manufacturing an organic electroluminescent device comprising a cathode, an anode and a plurality of organic compound layers placed between the cathode and the anode, the method comprising:
    forming at least two of the organic compound layers on the cathode or on the anode by a coating method,
    wherein at least one of the organic compound layers other than the organic compound layer adjacent to the anode is formed by coating a dispersion and then subjecting the coated dispersion to a smoothing treatment, and
wherein the coated dispersion contains a component of the organic electroluminescent device dispersed in a solid state; and
    organic compounds contained in the plurality of organic compound layers each has a dissolvable range of solubility parameter of from 8.3 to 10.6 $(cal/cm^3)^{1/2}$ and a solvent in the dispersion has a solubility parameter of from 7.0 to 8.2 or 10.7 $(cal/cm^3)^{1/2}$ to 23.0 $(cal/cm^3)^{1/2}$.

2. The method of manufacturing an organic electroluminescent device of claim 1, wherein the plurality of organic compound layers comprises at least three layers.

3. The method of manufacturing an organic electroluminescent device of claim 2, wherein the at least three organic compound layers on top of each other are formed by the coating method.

4. The method for manufacturing an organic electroluminescent device of claim 3, wherein glass transition temperatures of organic compounds in the three organic compound layers on top of each other are in a decreasing order of the glass transition temperatures from the layer nearest the anode.

5. The method for manufacturing an organic electroluminescent device described of claim 2, wherein the at least three organic compound layers on top of each other are formed by the coating method using the dispersion and subjected to the smoothing treatment.

6. The method for manufacturing an organic electroluminescent device described of claim 1, wherein all of the plurality of organic compound layers are formed by the coating method.

7. The method for manufacturing an organic electroluminescent device of claim 1, wherein the coating liquid comprises a non-aqueous solvent.

8. The method for manufacturing an organic electroluminescent device described of claim 1, wherein at least one of the plurality of organic compound layers comprises a phosphorescence emitting material.

* * * * *